United States Patent
Dutta et al.

(10) Patent No.: US 9,443,606 B2
(45) Date of Patent: Sep. 13, 2016

(54) WORD LINE DEPENDENT TWO STROBE SENSING MODE FOR NONVOLATILE STORAGE ELEMENTS

(71) Applicant: SANDISK TECHNOLOGIES INC., Plano, TX (US)

(72) Inventors: Deepanshu Dutta, Fremont, CA (US); Xiaochang Miao, Fremont, CA (US); Gerrit Jan Hemink, San Ramon, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 41 days.

(21) Appl. No.: 14/525,678

(22) Filed: Oct. 28, 2014

(65) Prior Publication Data

US 2016/0118134 A1    Apr. 28, 2016

(51) Int. Cl.
| | |
|---|---|
| *G11C 16/26* | (2006.01) |
| *G11C 16/34* | (2006.01) |
| *G11C 16/28* | (2006.01) |
| *G11C 16/24* | (2006.01) |
| *G11C 16/10* | (2006.01) |
| *G11C 11/56* | (2006.01) |

(52) U.S. Cl.
CPC ....... *G11C 16/3459* (2013.01); *G11C 11/5642* (2013.01); *G11C 16/10* (2013.01); *G11C 16/24* (2013.01); *G11C 16/26* (2013.01); *G11C 16/28* (2013.01); *G11C 16/3427* (2013.01)

(58) Field of Classification Search
CPC ... G11C 16/3459; G11C 16/10; G11C 16/28; G11C 16/24; G11C 16/3427; G11C 16/26

USPC .................................................. 365/185.21
See application file for complete search history.

(56) References Cited

U.S. PATENT DOCUMENTS

| | | | |
|---|---|---|---|
| 5,768,191 | A | 6/1998 | Choi |
| 5,920,507 | A | 7/1999 | Takeuchi |
| 6,243,290 | B1 | 6/2001 | Kurata |
| 6,324,121 | B2 | 11/2001 | Banks |
| 6,404,675 | B2 | 6/2002 | Banks |
| 6,522,580 | B2 | 2/2003 | Chen |
| 6,538,922 | B1 | 3/2003 | Khalid |
| 6,654,287 | B2 | 11/2003 | Visconti |
| 6,657,891 | B1 | 12/2003 | Shibata |

(Continued)

OTHER PUBLICATIONS

PCT International Search Report dated Dec. 18, 2015, PCT Patent Application PCT/US2015/052076.

(Continued)

*Primary Examiner* — Han Yang
*Assistant Examiner* — Xiaochun L Chen
(74) *Attorney, Agent, or Firm* — Vierra Magen Marcus LLP

(57) ABSTRACT

A non-volatile storage system includes a plurality of non-volatile storage elements, a plurality of bit lines connected to the non-volatile storage elements, a plurality of word lines connected to the non-volatile storage elements, and one or more control circuits connected to the bit lines and word lines. The one or more control circuits perform programming, verifying, reading and erasing for the non-volatile storage elements. When verifying, a first subset of bit lines connected to non-volatile storage elements are charged to allow for sensing, while a second subset of bit lines are not charged. When reading, a two strobe sensing process is selectively used to more accurately read data from the non-volatile storage elements.

26 Claims, 37 Drawing Sheets

(56) References Cited

U.S. PATENT DOCUMENTS

| | | |
|---|---|---|
| 6,714,448 B2 | 3/2004 | Manea |
| 6,745,286 B2 | 6/2004 | Staub |
| 6,785,164 B2 | 8/2004 | Gonzalez |
| 7,054,199 B2 | 5/2006 | Lee |
| 7,073,103 B2 | 7/2006 | Gongwer |
| 7,139,198 B2 | 11/2006 | Guterman |
| 7,301,813 B2 | 11/2007 | Chen |
| 7,301,817 B2 | 11/2007 | Li |
| 7,366,022 B2 | 4/2008 | Li |
| 7,492,634 B2 | 2/2009 | Li |
| 7,619,930 B2 | 11/2009 | Mokhlesi |
| 7,688,638 B2 | 3/2010 | Hemink |
| 8,174,895 B2 | 5/2012 | Chen |
| 2001/0040824 A1 | 11/2001 | Banks |
| 2004/0057318 A1* | 3/2004 | Cernea .................. G11C 7/06 365/226 |
| 2008/0126676 A1 | 5/2008 | Li |
| 2008/0304325 A1 | 12/2008 | Mokhlesi |
| 2009/0080265 A1 | 3/2009 | Mokhlesi |
| 2011/0273935 A1 | 11/2011 | Dong |
| 2014/0226406 A1 | 8/2014 | Dong |
| 2014/0241090 A1 | 8/2014 | Chen |
| 2014/0247671 A1 | 9/2014 | Ito |

OTHER PUBLICATIONS

PCT Written Opinion of the International Searching Authority dated Dec. 18, 2015, PCT Patent Application PCT/US2015/052076.

PCT International Search Report dated Dec. 4, 2015, PCT Patent Application PCT/US2015/052077.

PCT Written Opinion of the International Searching Authority dated Dec. 4, 2015, PCT Patent Application PCT/US2015/052077.

Dutta, "Two-Strobe Sensing for Nonvolatile Storage," U.S. Appl. No. 14/525,691.

Response to Office Action dated Apr. 28, 2016, U.S. Appl. No. 14/525,691.

Office Action dated Mar. 9, 2016, U.S. Appl. No. 14/525,691.

Office Action dated Jun. 1, 2016, U.S. Appl. No. 14/525,691.

* cited by examiner

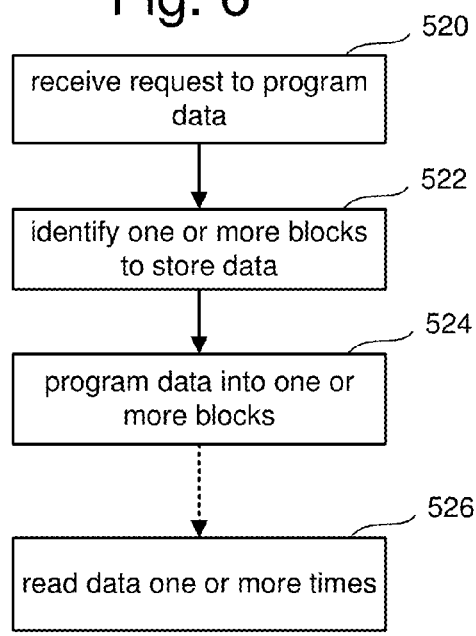
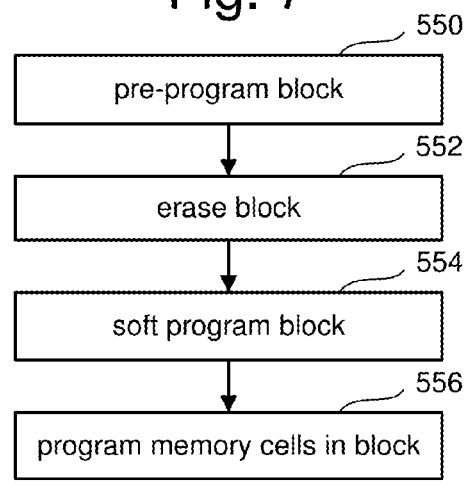

|  | S0 | S1 | S2 | S3 | S4 | S5 | S6 | S7 |
|---|---|---|---|---|---|---|---|---|
| Upper Page | 1 | 1 | 1 | 0 | 0 | 0 | 0 | 1 |
| Middle Page | 1 | 1 | 0 | 0 | 1 | 1 | 0 | 0 |
| Lower Page | 1 | 0 | 0 | 0 | 0 | 1 | 1 | 1 |

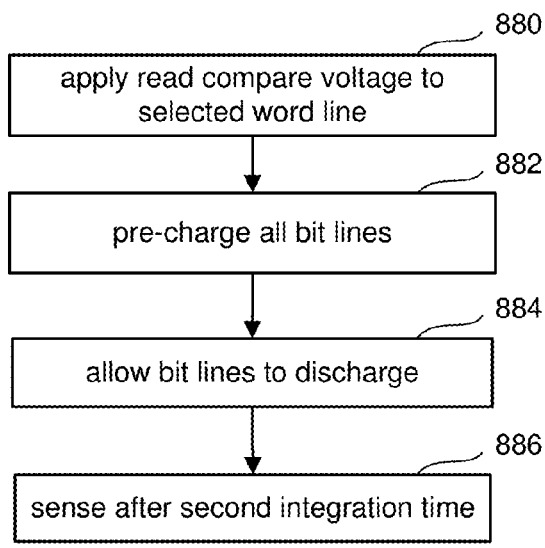
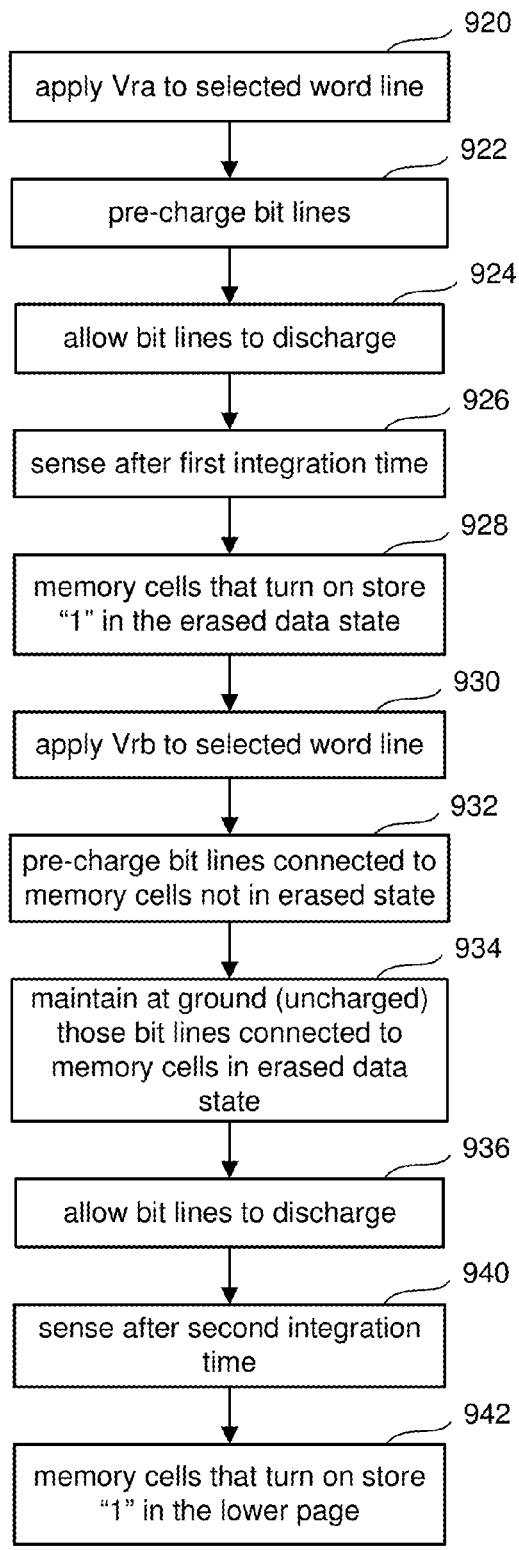
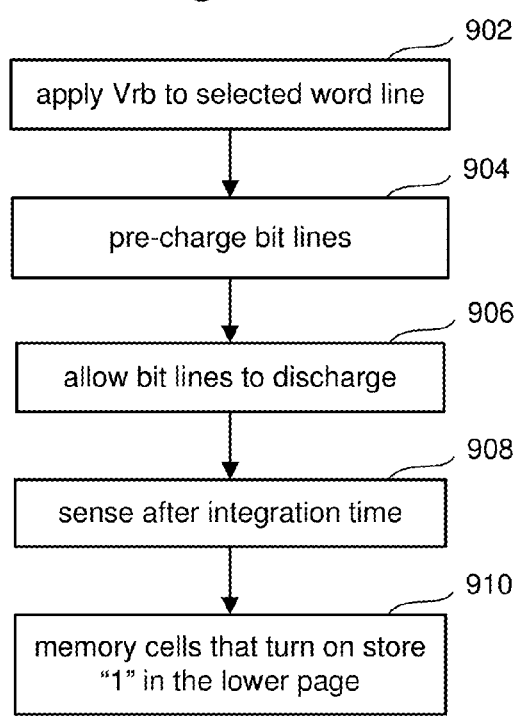

Fig. 24A

|     | E | A | B | C |
|-----|---|---|---|---|
| Vva |   |   |   |   |
| Vvb |   |   |   |   |
| Vvc |   |   |   |   |

Fig. 24B

|     | E | A | B | C |
|-----|---|---|---|---|
| Vvb |   |   |   |   |

Fig. 24C

|     | E | A | B | C |
|-----|---|---|---|---|
| Vva |   |   |   |   |
| Vvc |   |   |   |   |

Fig. 28

|     | S0 | S1 | S2 | S3 | S4 | S5 | S6 | S7 |
|-----|----|----|----|----|----|----|----|----|
| Vv1 |    | ▨  | ▨  | ▨  | ▨  | ▨  | ▨  | ▨  |
| Vv2 |    |    | ▨  | ▨  | ▨  | ▨  | ▨  | ▨  |
| Vv3 |    |    |    | ▨  | ▨  | ▨  | ▨  | ▨  |
| Vv4 |    |    |    |    | ▨  | ▨  | ▨  | ▨  |
| Vv5 |    |    |    |    |    | ▨  | ▨  | ▨  |
| Vv6 |    |    |    |    |    |    | ▨  | ▨  |
| Vv7 |    |    |    |    |    |    |    | ▨  |

Fig. 29

|     | S0 | S1 | S2 | S3 | S4 | S5 | S6 | S7 |
|-----|----|----|----|----|----|----|----|----|
| Vr1 |    | ▨  | ▨  |    |    | ▨  | ▨  | ▨  |
| Vr5 |    |    |    |    |    | ▨  | ▨  | ▨  |

Fig. 30

|     | S0 | S1 | S2 | S3 | S4 | S5 | S6 | S7 |
|-----|----|----|----|----|----|----|----|----|
| Vr2 |    |    | ▨  | ▨  | ▨  | ▨  | ▨  | ▨  |
| Vr4 |    |    |    |    | ▨  | ▨  | ▨  | ▨  |
| Vr6 |    |    |    |    |    |    | ▨  | ▨  |

Fig. 31

|     | S0 | S1 | S2 | S3 | S4 | S5 | S6 | S7 |
|-----|----|----|----|----|----|----|----|----|
| Vr3 |    |    |    | ▨  | ▨  | ▨  | ▨  | ▨  |
| Vr7 |    |    |    |    |    |    |    | ▨  |

Fig. 35

|     | S0 | S1 | S2 | S3 | S4 | S5 | S6 | S7 |
|-----|----|----|----|----|----|----|----|----|
| Vv1 |    | ▨  | ▨  | ▨  | ▨  | ▨  | ▨  | ▨  |
| Vv2 |    |    | ▨  | ▨  | ▨  | ▨  | ▨  | ▨  |
| Vv3 |    |    |    | ▨  | ▨  | ▨  | ▨  | ▨  |
| Vv4 |    |    |    |    | ▨  | ▨  | ▨  | ▨  |
| Vv5 |    |    |    |    | ▨  | ▨  | ▨  | ▨  |
| Vv6 |    |    |    |    | ▨  | ▨  | ▨  | ▨  |
| Vv7 |    |    |    |    | ▨  | ▨  | ▨  | ▨  |

Fig. 36

|     | S0 | S1 | S2 | S3 | S4 | S5 | S6 | S7 |
|-----|----|----|----|----|----|----|----|----|
| Vr1 |    | ▨  | ▨  | ▨  | ▨  | ▨  | ▨  | ▨  |
| Vr5 |    |    |    |    | ▨  | ▨  | ▨  | ▨  |

Fig. 37

|     | S0 | S1 | S2 | S3 | S4 | S5 | S6 | S7 |
|-----|----|----|----|----|----|----|----|----|
| Vr2 |    |    | ▨  | ▨  | ▨  | ▨  | ▨  | ▨  |
| Vr4 |    |    |    |    | ▨  | ▨  | ▨  | ▨  |
| Vr6 |    |    |    |    | ▨  | ▨  | ▨  | ▨  |

Fig. 38

|     | S0 | S1 | S2 | S3 | S4 | S5 | S6 | S7 |
|-----|----|----|----|----|----|----|----|----|
| Vr3 |    |    |    | ▨  | ▨  | ▨  | ▨  | ▨  |
| Vr7 |    |    |    |    | ▨  | ▨  | ▨  | ▨  |

Fig. 42

|     | S0 | S1 | S2 | S3 | S4 | S5 | S6 | S7 |
|-----|----|----|----|----|----|----|----|----|
| Vv1 |    | ▨  | ▨  | ▨  | ▨  | ▨  | ▨  | ▨  |
| Vv2 |    |    | ▨  | ▨  | ▨  | ▨  | ▨  | ▨  |
| Vv3 |    |    | ▨  | ▨  | ▨  | ▨  | ▨  | ▨  |
| Vv4 |    |    |    |    | ▨  | ▨  | ▨  | ▨  |
| Vv5 |    |    |    |    | ▨  | ▨  | ▨  | ▨  |
| Vv6 |    |    |    |    | ▨  | ▨  | ▨  | ▨  |
| Vv7 |    |    |    |    | ▨  | ▨  | ▨  | ▨  |

Fig. 43

|     | S0 | S1 | S2 | S3 | S4 | S5 | S6 | S7 |
|-----|----|----|----|----|----|----|----|----|
| Vr1 |    | ▨  | ▨  | ▨  | ▨  | ▨  | ▨  | ▨  |
| Vr5 |    |    |    |    | ▨  | ▨  | ▨  | ▨  |

Fig. 44

|     | S0 | S1 | S2 | S3 | S4 | S5 | S6 | S7 |
|-----|----|----|----|----|----|----|----|----|
| Vr2 |    |    | ▨  | ▨  | ▨  | ▨  | ▨  | ▨  |
| Vr4 |    |    |    |    | ▨  | ▨  | ▨  | ▨  |
| Vr6 |    |    |    |    | ▨  | ▨  | ▨  | ▨  |

Fig. 45

|     | S0 | S1 | S2 | S3 | S4 | S5 | S6 | S7 |
|-----|----|----|----|----|----|----|----|----|
| Vr3 |    |    | ▨  | ▨  | ▨  | ▨  | ▨  | ▨  |
| Vr7 |    |    |    |    | ▨  | ▨  | ▨  | ▨  |

Fig. 49

|     | S0 | S1 | S2 | S3 | S4 | S5 | S6 | S7 |
|-----|----|----|----|----|----|----|----|----|
| Vv1 | ▨  | ▨  | ▨  | ▨  |    |    |    |    |
| Vv2 | ▨  | ▨  | ▨  | ▨  |    |    |    |    |
| Vv3 | ▨  | ▨  | ▨  | ▨  |    |    |    |    |
| Vv4 |    |    |    |    | ▨  | ▨  | ▨  | ▨  |
| Vv5 |    |    |    |    | ▨  | ▨  | ▨  | ▨  |
| Vv6 |    |    |    |    | ▨  | ▨  | ▨  | ▨  |
| Vv7 |    |    |    |    | ▨  | ▨  | ▨  | ▨  |

Fig. 50

|     | S0 | S1 | S2 | S3 | S4 | S5 | S6 | S7 |
|-----|----|----|----|----|----|----|----|----|
| Vr1 | ▨  | ▨  | ▨  | ▨  |    |    |    |    |
| Vr5 |    |    |    |    | ▨  | ▨  | ▨  | ▨  |

Fig. 51

|     | S0 | S1 | S2 | S3 | S4 | S5 | S6 | S7 |
|-----|----|----|----|----|----|----|----|----|
| Vr2 | ▨  | ▨  | ▨  | ▨  |    |    |    |    |
| Vr4 |    |    |    |    | ▨  | ▨  | ▨  | ▨  |
| Vr6 |    |    |    |    | ▨  | ▨  | ▨  | ▨  |

Fig. 52

|     | S0 | S1 | S2 | S3 | S4 | S5 | S6 | S7 |
|-----|----|----|----|----|----|----|----|----|
| Vr3 | ▨  | ▨  | ▨  | ▨  |    |    |    |    |
| Vr7 |    |    |    |    | ▨  | ▨  | ▨  | ▨  |

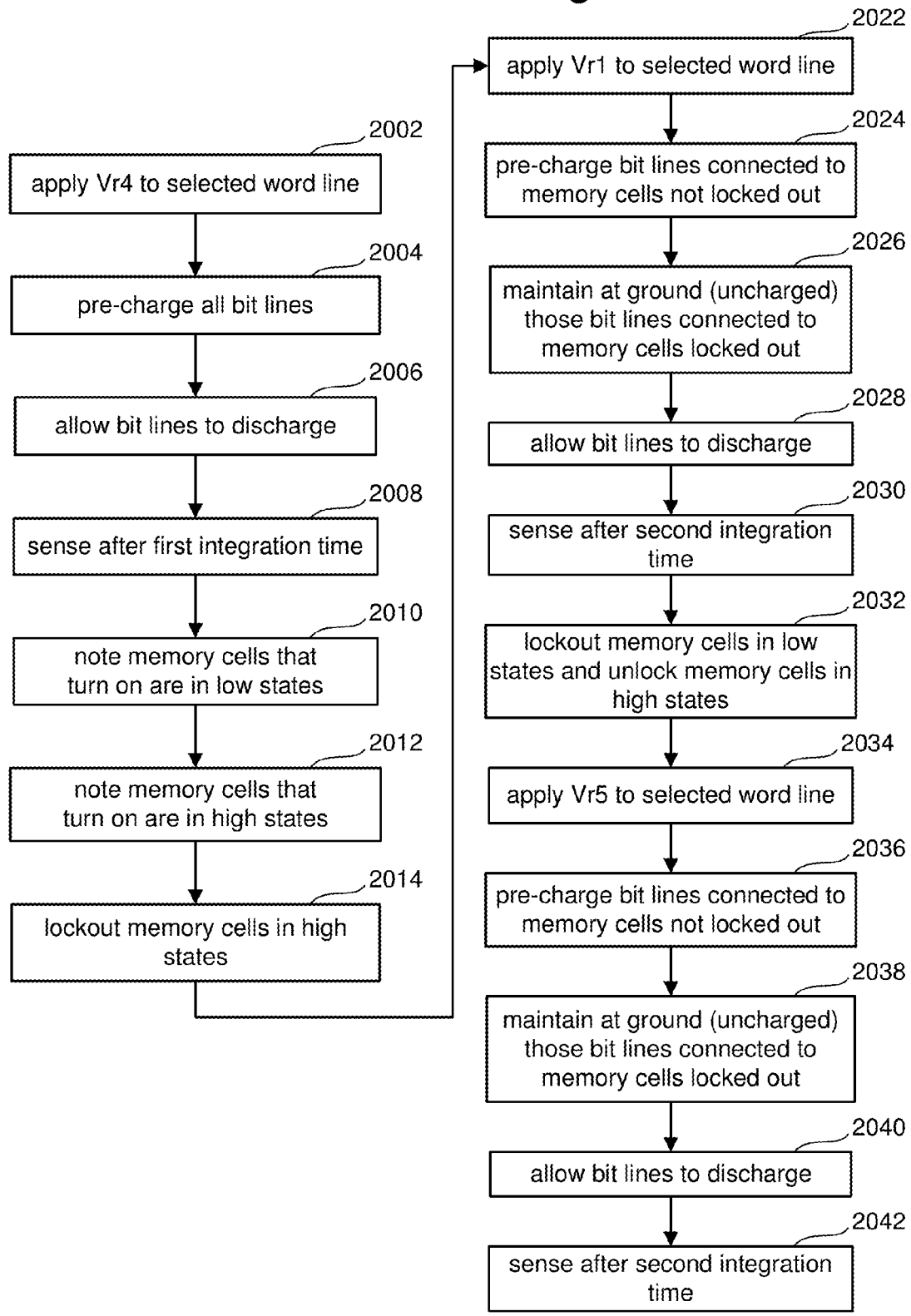

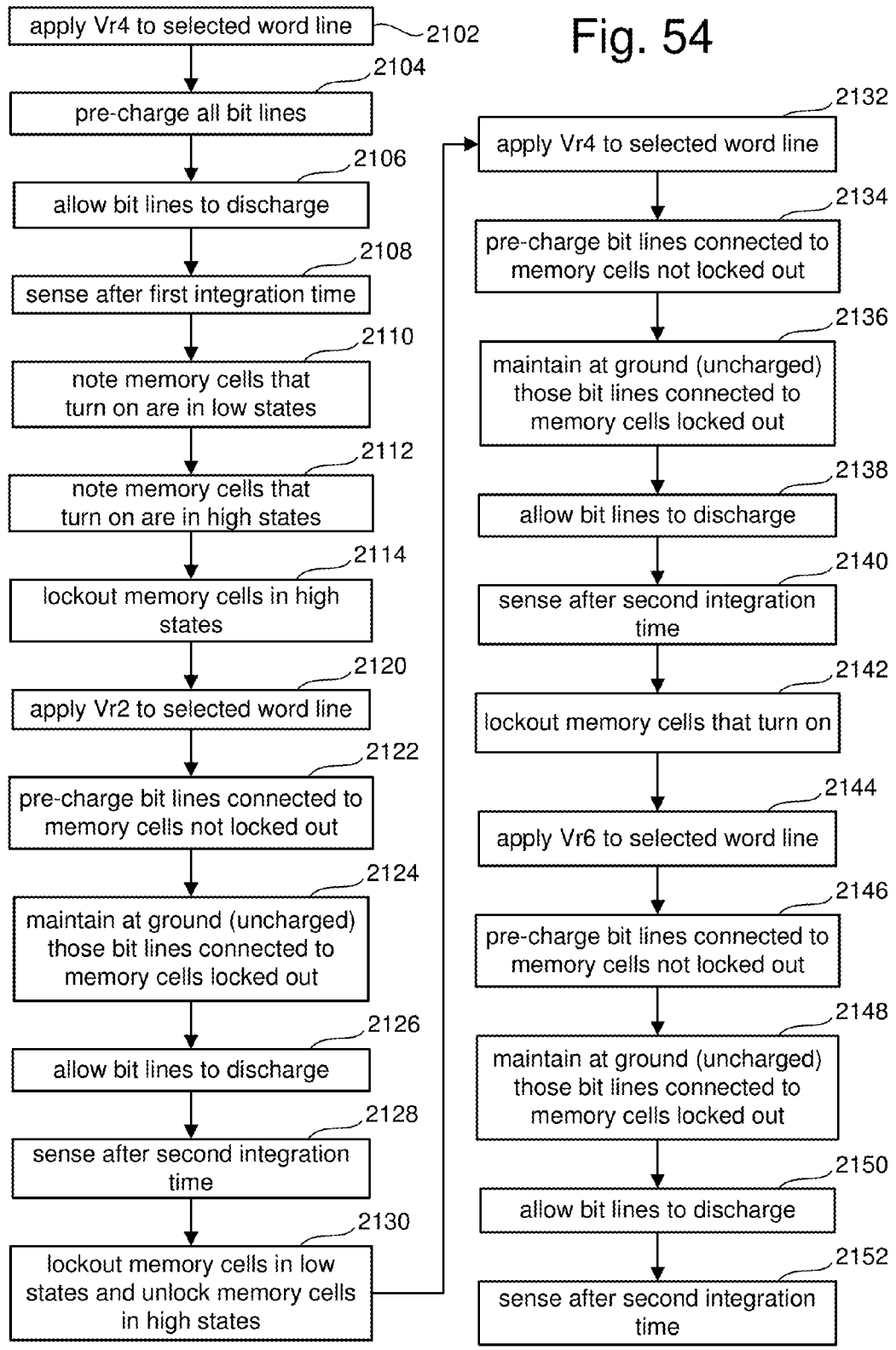

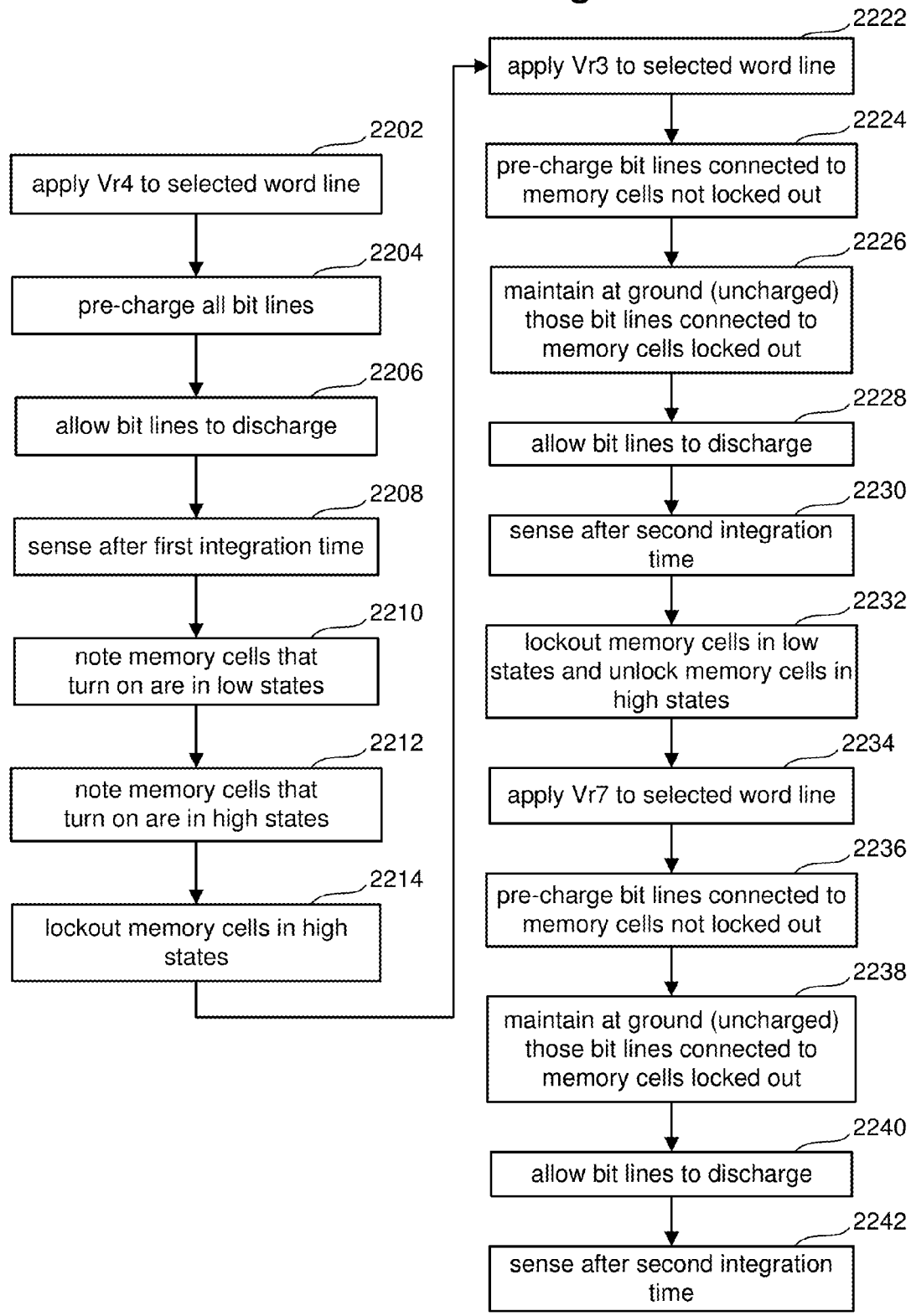

WORD LINE DEPENDENT TWO STROBE SENSING MODE FOR NONVOLATILE STORAGE ELEMENTS

BACKGROUND OF THE INVENTION

Semiconductor memory devices have become more popular for use in various electronic devices. For example, non-volatile semiconductor memory is used in cellular telephones, digital cameras, personal digital assistants, mobile computing devices, non-mobile computing devices and other devices. Electrical Erasable Programmable Read Only Memory (EEPROM) and flash memory are among the most popular non-volatile semiconductor memories.

Both EEPROM and flash memory utilize a floating gate that is positioned above and insulated from a channel region in a semiconductor substrate. The floating gate is positioned between source and drain regions. A control gate is provided over and insulated from the floating gate. The threshold voltage of the transistor is controlled by the amount of charge that is retained on the floating gate. That is, the minimum amount of voltage that must be applied to the control gate before the transistor is turned on to permit conduction between its source and drain is controlled by the level of charge on the floating gate.

When programming an EEPROM or flash memory device, typically a program voltage is applied to the control gate and the bit line is grounded. Electrons from the channel are injected into the floating gate. When electrons accumulate in the floating gate, the floating gate becomes negatively charged and the threshold voltage of the memory cell is raised so that the memory cell is in the programmed state.

Some EEPROM and flash memory devices have a floating gate that is used to store two ranges of charges and, therefore, the memory cell can be programmed/erased between two states, an erased state and a programmed state that correspond to data "1" and data "0." Such a device is referred to as a binary or two-state device.

A multi-state (or multi-level) flash memory cell is implemented by identifying multiple, distinct allowed threshold voltage ranges. Each distinct threshold voltage range corresponds to a predetermined value for the set of data bits. The specific relationship between the data programmed into the memory cell and the threshold voltage ranges of the memory cell depends upon the data encoding scheme adopted for the memory cells. For example, U.S. Pat. No. 6,222,762 and U.S. Patent Application Publication No. 2004/0255090 both describe various data encoding schemes for multi-state flash memory cells.

Typically, the program voltage (Vpgm) is applied to the control gates of the memory cells as a series of pulses. The magnitude of the pulses is increased with each successive pulse by a predetermined step size (e.g. 0.2 v, 0.3 v, 0.4 v, or others). In the periods between the pulses, verify operations are carried out. That is, the programming level of each memory cell of a group of memory cells being programmed in parallel is sensed between each programming pulse to determine whether it is equal to or greater than a verify level to which it is being programmed. One means of verifying the programming is to test conduction at a specific compare point. The memory cells that are verified to be sufficiently programmed are locked out, for example, by raising their respective bit line voltage to stop the programming process for those memory cells.

As mentioned above, verifying programming can be done by testing that the memory cell conducts when a certain compare voltage is applied to the control gate of the memory cell. The same holds true for read operations.

BRIEF DESCRIPTION OF THE DRAWINGS

FIG. 6 is a flow chart describing one embodiment of a process for programming.

FIG. 7 is a flow chart describing one embodiment of a process for programming data into a block of memory cells.

FIG. 23A is a flow chart describing one embodiment of a process for performing a single strobe sensing operation for reading data.

FIG. 24 is a flow chart describing one embodiment of a process for performing a lower page read with only one strobe sensing.

FIG. 24A is a table that indicates which bit lines to pre-charge when performing verification for one embodiment.

FIG. 24B is a table that indicates which bit lines to pre-charge when performing reading for a page of data for one embodiment.

FIG. 24C is a table that indicates which bit lines to pre-charge when performing reading for a page of data for one embodiment.

FIG. 25 is a flow chart describing one embodiment of a process for performing a lower page read with two strobe sensing.

FIG. 28 is a table that indicates which bit lines to pre-charge when performing verification for one embodiment.

FIG. 29 is a table that indicates which bit lines to pre-charge when performing reading for a page of data for one embodiment.

FIG. 30 is a table that indicates which bit lines to pre-charge when performing reading for a page of data for one embodiment.

FIG. 31 is a table that indicates which bit lines to pre-charge when performing reading for a page of data for one embodiment.

FIG. 35 is a table that indicates which bit lines to pre-charge when performing verification for one embodiment.

FIG. 36 is a table that indicates which bit lines to pre-charge when performing reading for a page of data for one embodiment.

FIG. 37 is a table that indicates which bit lines to pre-charge when performing reading for a page of data for one embodiment.

FIG. 38 is a table that indicates which bit lines to pre-charge when performing reading for a page of data for one embodiment.

FIG. 42 is a table that indicates which bit lines to pre-charge when performing verification for one embodiment.

FIG. 43 is a table that indicates which bit lines to pre-charge when performing reading for a page of data for one embodiment.

FIG. 44 is a table that indicates which bit lines to pre-charge when performing reading for a page of data for one embodiment.

FIG. 45 is a table that indicates which bit lines to pre-charge when performing reading for a page of data for one embodiment.

FIG. 49 is a table that indicates which bit lines to pre-charge when performing verification for one embodiment.

FIG. 50 is a table that indicates which bit lines to pre-charge when performing reading for a page of data for one embodiment.

FIG. 51 is a table that indicates which bit lines to pre-charge when performing reading for a page of data for one embodiment.

FIG. 52 is a table that indicates which bit lines to pre-charge when performing reading for a page of data for one embodiment.

FIG. 53 is a flow chart describing one embodiment of a process for reading a page of data.

FIG. 54 is a flow chart describing one embodiment of a process for reading a page of data.

FIG. 55 is a flow chart describing one embodiment of a process for reading a page of data.

DETAILED DESCRIPTION

A non-volatile storage system includes a plurality of non-volatile storage elements, a plurality of bit lines connected to the non-volatile storage elements, a plurality of word lines connected to the non-volatile storage elements, and one or more control circuits connected to the bit lines and word lines. The one or more control circuits perform programming, verifying, reading and erasing for the non-volatile storage elements. When verifying, a first subset of bit lines connected to non-volatile storage elements are charged to allow for sensing, while a second subset of bit lines are not charged. When reading, a two strobe sensing process is selectively used to more accurately read data from the non-volatile storage elements.

Figure 1:
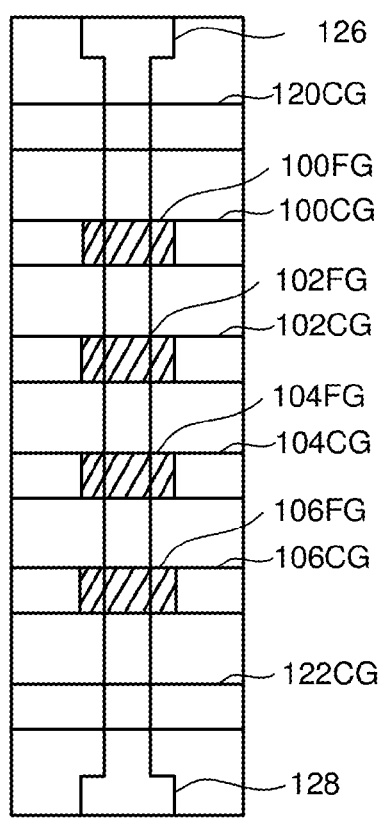
FIG. 1 is a top view of a NAND string.
Figure 2:
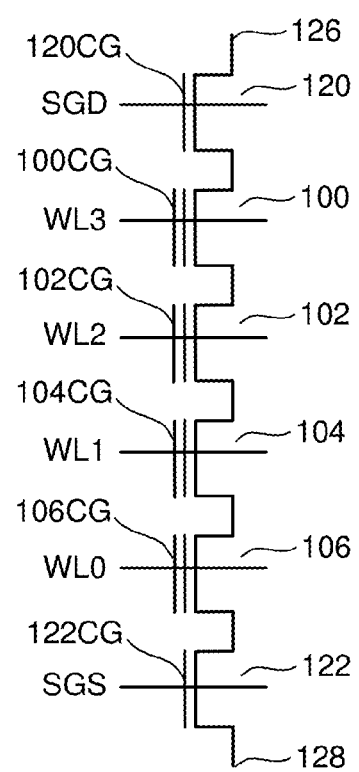
FIG. 2 is an equivalent circuit diagram of the NAND string.

One example of a non-volatile storage system that can implement the technology described herein is a flash memory system that uses the NAND structure, which includes arranging multiple transistors in series, sandwiched between two select gates. The transistors in series and the select gates are referred to as a NAND string. FIG. 1 is a top view showing one NAND string. FIG. 2 is an equivalent circuit thereof. The NAND string depicted in FIGS. 1 and 2 includes four transistors 100, 102, 104 and 106 in series and sandwiched between (drain side) select gate 120 and (source side) select gate 122. Select gate 120 connects the NAND string to a bit line via bit line contact 126. Select gate 122 connects the NAND string to source line 128. Select gate 120 is controlled by applying the appropriate voltages to select line SGD. Select gate 122 is controlled by applying the appropriate voltages to select line SGS. Each of the transistors 100, 102, 104 and 106 has a control gate and a floating gate. For example, transistor 100 has control gate 100CG and floating gate 100FG. Transistor 102 includes control gate 102CG and a floating gate 102FG. Transistor 104 includes control gate 104CG and floating gate 104FG. Transistor 106 includes a control gate 106CG and a floating gate 106FG. Control gate 100CG is connected to word line WL3, control gate 102CG is connected to word line WL2, control gate 104CG is connected to word line WL1, and control gate 106CG is connected to word line WL0.

Note that although FIGS. 1 and 2 show four memory cells in the NAND string, the use of four memory cells is only provided as an example. A NAND string can have less than four memory cells or more than four memory cells. For example, some NAND strings will have 128 memory cells or more. The discussion herein is not limited to any particular number of memory cells in a NAND string. One embodiment uses NAND strings with 66 memory cells, where 64 memory cells are used to store data and two of the memory cells are referred to as dummy memory cells because they do not store data.

A typical architecture for a flash memory system using a NAND structure will include several NAND strings. Each NAND string is connected to the common source line by its source select gate controlled by select line SGS and connected to its associated bit line by its drain select gate controlled by select line SGD. Each bit line and the respective NAND string(s) that are connected to that bit line via a bit line contact comprise the columns of the array of memory cells. Bit lines are shared with multiple NAND strings. Typically, the bit line runs on top of the NAND strings in a direction perpendicular to the word lines and is connected to a sense amplifier.

Other types of non-volatile storage devices, in addition to NAND flash memory, can also be used to implement the new technology described herein. For example, a TANOS structure (consisting of a stacked layer of TaN—$Al_2O_3$—SiN—$SiO_2$ on a silicon substrate), which is basically a memory cell using trapping of charge in a nitride layer (instead of a floating gate), can also be used with the technology described herein. Another type of memory cell useful in flash EEPROM systems utilizes a non-conductive dielectric material in place of a conductive floating gate to store charge in a non-volatile manner. Such a cell is described in an article by Chan et al., "A True Single-Transistor Oxide-Nitride-Oxide EEPROM Device," IEEE Electron Device Letters, Vol. EDL-8, No. 3, March 1987, pp. 93-95. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. See also Nozaki et al., "A 1-Mb EEPROM with MONOS Memory Cell for Semiconductor Disk Application," IEEE Journal of Solid-State Circuits, Vol. 26, No. 4, April 1991, pp. 497-501, which describes a similar cell in a split-gate configuration where a doped polysilicon gate extends over a portion of the memory cell channel to form a separate select transistor.

Another example is described by Eitan et al., "NROM: A Novel Localized Trapping, 2-Bit Nonvolatile Memory Cell," IEEE Electron Device Letters, vol. 21, no. 11, November 2000, pp. 543-545. An ONO dielectric layer extends across the channel between source and drain diffusions. The charge for one data bit is localized in the dielectric layer adjacent to the drain, and the charge for the other data bit is localized in the dielectric layer adjacent to the source. U.S. Pat. Nos. 5,768,192 and 6,011,725 disclose a non-volatile memory cell having a trapping dielectric sandwiched between two silicon dioxide layers. Multi-state data storage is implemented by separately reading the binary states of the spatially separated charge storage regions within the dielectric. Other types of non-volatile memory technologies can also be used.

Figure 3:
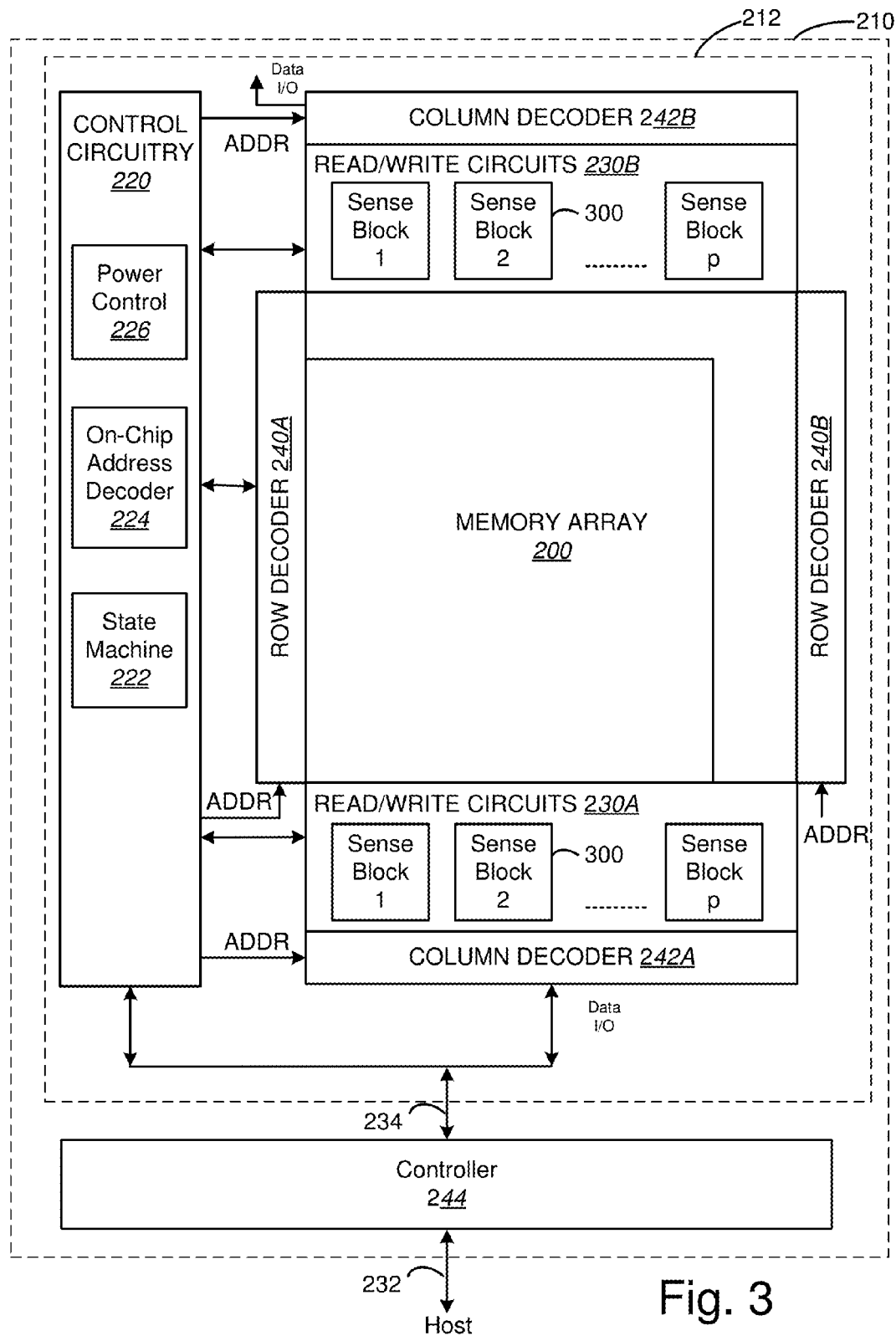
FIG. 3 is a block diagram of a non-volatile memory system.

FIG. 3 illustrates a memory device 210 having read/write circuits for reading and programming a page of memory cells (e.g., NAND multi-state flash memory) in parallel. Memory device 210 may include one or more memory die or chips 212. Memory die 212 includes an array (two-dimensional or three dimensional) of memory cells 200, control circuitry 220, and read/write circuits 230A and 230B. In one embodiment, access to the memory array 200 by the various peripheral circuits is implemented in a symmetric fashion, on opposite sides of the array, so that the densities of access lines and circuitry on each side are reduced by half. The read/write circuits 230A and 230B include multiple sense blocks 300 which allow a page of memory cells to be read or programmed in parallel. The memory array 200 is addressable by word lines via row decoders 240A and 240B and by bit lines via column decoders 242A and 242B. In a typical embodiment, a controller 244 is included in the same memory device 210 (e.g., a removable storage card or package) as the one or more memory die 212. Commands and data are transferred between the host and controller 244 via lines 232 and between the controller and the one or more memory die 212 via lines 234. Some memory systems may include multiple dies 212 in communication with Controller 244.

Control circuitry 220 cooperates with the read/write circuits 230A and 230B to perform memory operations on the memory array 200. The control circuitry 220 includes a state machine 222, an on-chip address decoder 224 and a power control module 226. The state machine 222 provides chip-level control of memory operations. The on-chip address decoder 224 provides an address interface between that used by the host or a memory controller to the hardware address used by the decoders 240A, 240B, 242A, and 242B. The power control module 226 controls the power and voltages supplied to the word lines and bit lines during memory operations. In one embodiment, power control module 226 includes one or more charge pumps that can create voltages larger than the supply voltage. Control circuitry 220, power control 226, decoder 224, state machine 222, decoders 240 A/B & 242A/B, the read/write circuits 230A/B and the controller 244, collectively or separately, can be referred to as one or more managing circuits or one or more control circuits.

Figure 4:
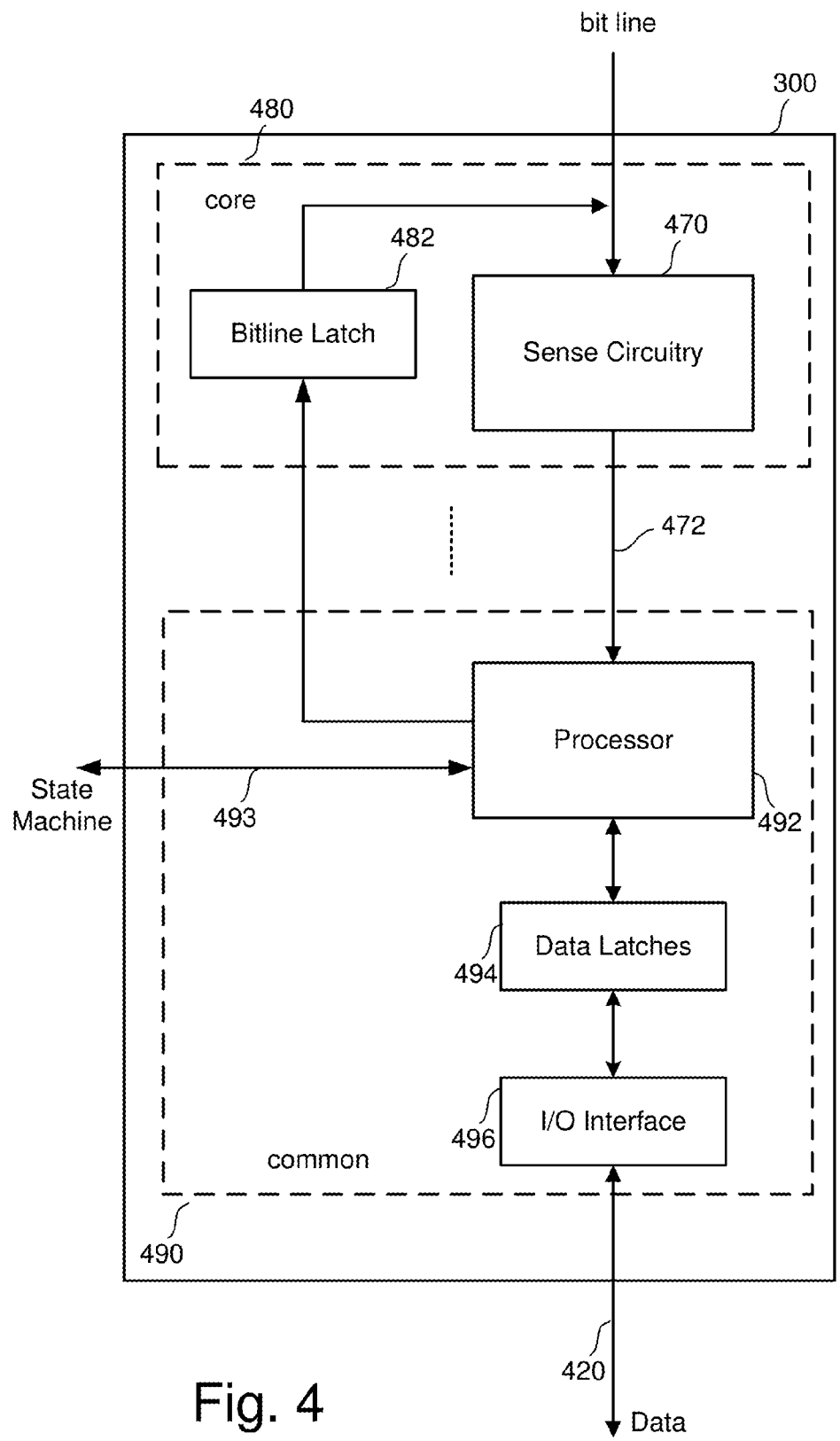
FIG. 4 is a block diagram of a non-volatile memory system.

FIG. 4 is a block diagram of an individual sense block 300 partitioned into a core portion, referred to as a sense module 480, and a common portion 490. In one embodiment, there will be a separate sense module 480 for each bit line and one common portion 490 for a set of multiple sense modules 480. In one example, a sense block will include one common portion 490 and eight sense modules 480. Each of the sense modules in a group will communicate with the associated common portion via a data bus 472.

Sense module 480 comprises sense circuitry 470 that determines whether a conduction current in a connected bit line is above or below a predetermined level. In some embodiments, sense module 480 includes a circuit commonly referred to as a sense amplifier. Sense module 480 also includes a bit line latch 482 that is used to set a voltage condition on the connected bit line. For example, a predetermined state latched in bit line latch 482 will result in the connected bit line being pulled to a state designating program inhibit (e.g., Vdd).

Common portion 490 comprises a processor 492, a set of data latches 494 and an I/O Interface 496 coupled between the set of data latches 494 and data bus 420. Processor 492 performs computations. For example, one of its functions is to determine the data stored in the sensed memory cell and store the determined data in the set of data latches. The set of data latches 494 is used to store data bits determined by processor 492 during a read operation. It is also used to store data bits imported from the data bus 420 during a program operation. The imported data bits represent write data meant to be programmed into the memory. I/O interface 496 provides an interface between data latches 494 and the data bus 420.

During read or sensing, the operation of the system is under the control of state machine 222 that controls the supply of different control gate voltages to the addressed cell. As it steps through the various predefined control gate voltages (the read reference voltages or the verify reference voltages) corresponding to the various memory states supported by the memory, the sense module 480 may trip at one of these voltages and an output will be provided from sense module 480 to processor 492 via bus 472. At that point, processor 492 determines the resultant memory state by consideration of the tripping event(s) of the sense module and the information about the applied control gate voltage from the state machine via input lines 493. It then computes a binary encoding for the memory state and stores the resultant data bits into data latches 494. In another embodiment of the core portion, bit line latch 482 serves double duty, both as a latch for latching the output of the sense module 480 and also as a bit line latch as described above.

It is anticipated that some implementations will include multiple processors 492. In one embodiment, each processor 492 will include an output line (not depicted in FIG. 4) such that each of the output lines is wired-OR'd together. In some embodiments, the output lines are inverted prior to being connected to the wired-OR line. This configuration enables a quick determination during the program verification process of when the programming process has completed because the state machine receiving the wired-OR line can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. In embodiments where each processor communicates with eight sense modules, the state machine may (in some embodiments) need to read the wired-OR line eight times, or logic is added to processor 492 to accumulate the results of the associated bit lines such that the state machine need only read the wired-OR line one time. In some embodiments that have many sense modules, the wired-OR lines of the many sense modules can be grouped in sets of N sense modules, and the groups can then be grouped to form a binary tree.

During program or verify, the data to be programmed is stored in the set of data latches 494 from the data bus 420. The program operation, under the control of the state machine, comprises a series of programming voltage pulses (with increasing magnitudes) concurrently applied to the control gates of the addressed memory cells to that the memory cells are programmed at the same time. Each programming pulse is followed by a verify process to determine if the memory cell has been programmed to the desired state. Processor 492 monitors the verified memory state relative to the desired memory state. When the two are in agreement, processor 492 sets the bit line latch 482 so as to cause the bit line to be pulled to a state designating program inhibit. This inhibits the memory cell coupled to the bit line from further programming even if it is subjected to programming pulses on its control gate. In other embodiments the processor initially loads the bit line latch 482 and the sense circuitry sets it to an inhibit value during the verify process.

Data latch stack 494 contains a stack of data latches corresponding to the sense module. In one embodiment, there are three (or four or another number) data latches per sense module 480. In some implementations (but not required), the data latches are implemented as a shift register so that the parallel data stored therein is converted to serial data for data bus 420, and vice versa. In one preferred embodiment, all the data latches corresponding to the read/write block of memory cells can be linked together to form a block shift register so that a block of data can be input or output by serial transfer. In particular, the bank of read/write modules is adapted so that each of its set of data latches will shift data into or out of the data bus in sequence as if they are part of a shift register for the entire read/write block.

Figure 5:
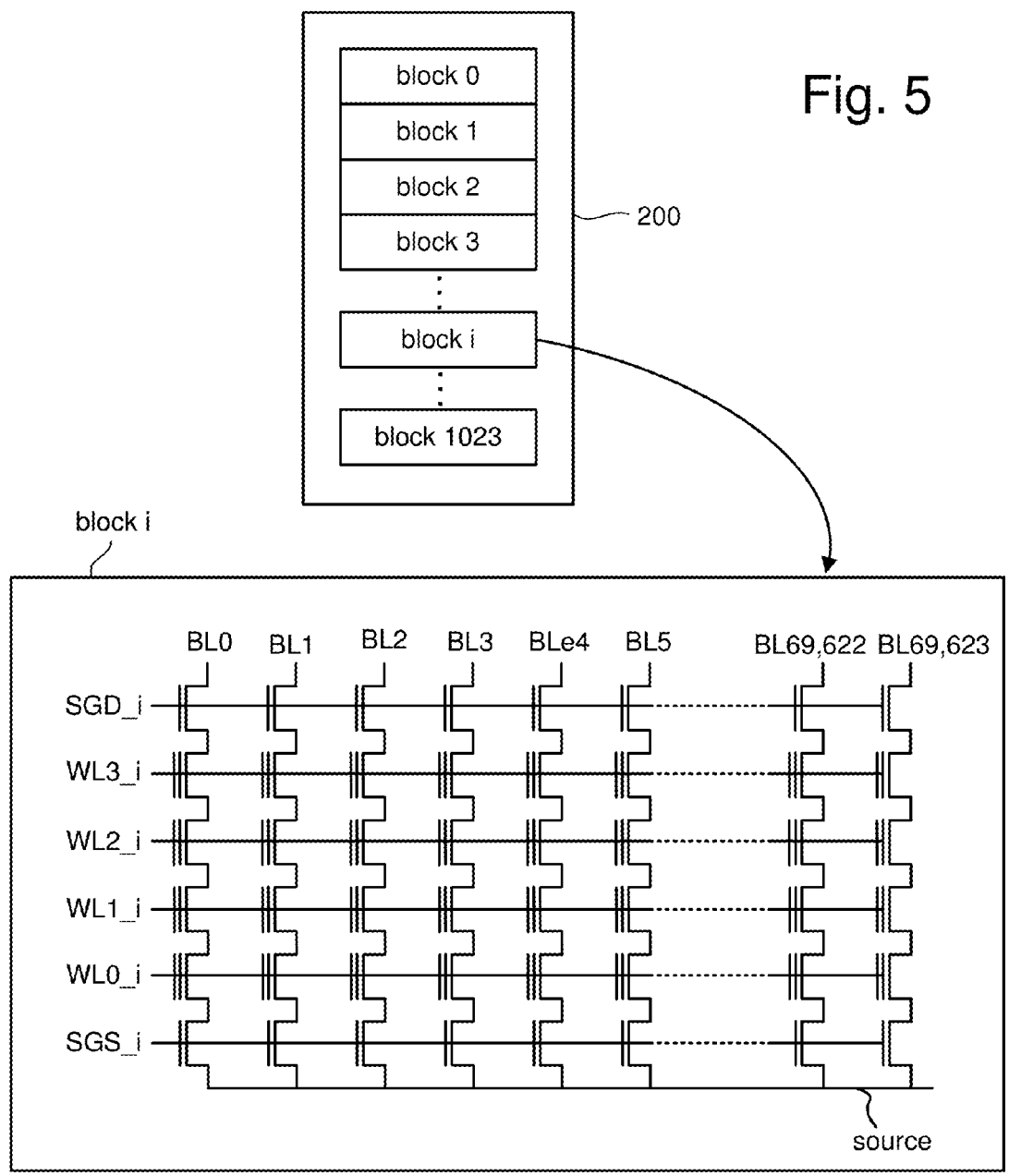
FIG. 5 depicts an exemplary structure of a memory cell array.

FIG. 5 depicts an exemplary structure of memory cell array 200. In one embodiment, the array of memory cells is divided into a large number of blocks of memory cells. As is common for flash EEPROM systems, the block is the unit of erase. That is, each block contains the minimum number of memory cells that are erased together. Other embodiments can use different units of erase.

As one example, the NAND flash EEPROM depicted in FIG. 5 is partitioned into 1,024 blocks. However, more or less than 1024 blocks can be used. In each block, in this example, there are 69,624 columns corresponding to bit lines BL0, BL1, . . . BL69,623. In one embodiment, all of the bit lines of a block can be simultaneously selected during read and program operations. Memory cells along a common word line and connected to any bit line can be programmed (or read) at the same time (e.g., concurrently). In another embodiment, the bit lines are divided into even bit lines and odd bit lines. In an odd/even bit line architecture, memory cells along a common word line and connected to the odd bit lines are programmed at one time, while memory cells along a common word line and connected to even bit lines are programmed at another time.

FIG. 5 shows four memory cells connected in series to form a NAND string. Although four cells are shown to be included in each NAND string, more or less than four can be used (e.g., 16, 32, 64, 128 or another number or memory cells can be on a NAND string). One terminal of the NAND string is connected to a corresponding bit line via a drain select gate (connected to select gate drain line SGD), and another terminal is connected to the source line via a source select gate (connected to select gate source line SGS).

Each block is typically divided into a number of pages. In one embodiment, a page is a unit of programming. One or more pages of data are typically stored in one row of memory cells. A page can store one or more sectors. A sector includes user data and overhead data. Overhead data typically includes an Error Correction Code (ECC) that has been calculated from the user data of the sector. The controller calculates the ECC when data is being programmed into the array, and also checks it when data is being read from the array. In some embodiments, the state machine, controller, or other component can calculate and check the ECC. In some alternatives, the ECCs and/or other overhead data are stored in different pages, or even different blocks, than the user data to which they pertain. A sector of user data is typically 512 bytes, corresponding to the size of a sector in magnetic disk drives. A large number of pages form a block, anywhere from 8 pages, for example, up to 32, 64, 128 or more pages. In one embodiment, each word line of a block is associated with one page. In another embodiment, each word line of a block is associated with 3 pages. In other embodiments, the word lines can be associated with other numbers of pages.

Some memory cells are slower to program or erase than others because of manufacturing variations among those memory cells, because those cells were previously erased to a lower threshold voltage than others, because of uneven wear among the cells within a page, or other reasons. And, of course, some memory cells cannot be programmed or erased whatsoever, because of a defect or other reason. Additionally, some memory cells program fast and can be over programmed, which may also cause an error. As mentioned above, error correction coding provides the capability of tolerating some number of failed cells, while still maintaining the memory as usable. In some applications, a page of data is programmed by repeatedly applying programming pulses until all memory cells on that page verify to the desired programmed state. In some implementation, programming and erasing time is saved by terminating the sequence of programming or erasing pulses when the number of error memory cells that are not yet fully programmed or erased is fewer than the number of bits that are correctable.

FIG. 6 is a flow chart describing one embodiment of a process for operating a non-volatile storage system. In step 520, a request for programming is received from the Host, the Controller or other entity. In step 522, the Controller (or state machine or other entity) will determine which set of one or more blocks to store the data. In step 524, the data received for the request is programmed into one or more blocks of memory cells. In step 526, the data can be read. The dashed line between steps 524 and 526 indicates that there can be an unpredictable amount of time between programming and reading.

FIG. 7 is a flow chart describing a process for programming a block of memory. The process of FIG. 7 is performed one or more times during step 524 of FIG. 6. In one example implementation, memory cells are pre-programmed in order to maintain even wear on the memory cells (step 550). In one embodiment, the memory cells are preprogrammed to the highest data state, a random pattern, or any other pattern. In some implementations, pre-programming need not be performed. Some embodiments do not implement pre-programming.

In step 552, memory cells are erased (in blocks or other units) prior to programming. Memory cells are erased in one embodiment by raising the p-well to an erase voltage (e.g., 20 volts) for a sufficient period of time and grounding the word lines of a selected block while the source and bit lines are floating. In blocks that are not selected to be erased, word lines are floated. Due to capacitive coupling, the unselected word lines, bit lines, select lines, and the common source line are also raised to a significant fraction of the erase voltage thereby impeding erase on blocks that are not selected to be erased. In blocks that are selected to be erased, a strong electric field is applied to the tunnel oxide layers of selected memory cells and the selected memory cells are erased as electrons of the floating gates are emitted to the substrate side, typically by Fowler-Nordheim tunneling mechanism. As electrons are transferred from the floating gate to the p-well region, the threshold voltage of a selected cell is lowered. Erasing can be performed on the entire memory array, on individual blocks, or another unit of memory cells. In one embodiment, after erasing the memory cells, all of the erased memory cells in the block will be in state S0 (discussed below). One implementation of an erase process includes applying several erase pulses to the p-well and verifying between erase pulses whether the NAND strings are properly erased.

In step 554, soft programming is (optionally) performed to narrow the distribution of erased threshold voltages for the erased memory cells. Some memory cells may be in a deeper erased state than necessary as a result of the erase process. Soft programming can apply programming pulses to move the threshold voltage of the deeper erased memory cells to the erase threshold distribution. In step 556, the memory cells of the block are programmed. The programming can be performed in response to a request to program from the host, or in response to an internal process. After programming, the memory cells of the block can be read. Many different read processes known in the art can be used to read data. In some embodiments, the read process includes using ECC to correct errors. The data that is read is output to the hosts that requested the read operation. The ECC process can be performed by the state machine, the controller or another device. The erase-program cycle can happen many times without or independent of reading, the read process can occur many times without or independent of programming and the read process can happen any time after programming. The process of FIG. 7 can be performed at the direction of the state machine using the various circuits described above. In other embodiments, the process of FIG. 7 can be performed at the direction of the Controller using the various circuits described above.

At the end of a successful programming process (with verification), the threshold voltages of the memory cells should be within one or more distributions of threshold voltages for programmed memory cells or within a distribution of threshold voltages for erased memory cells, as appropriate.

Figure 8:
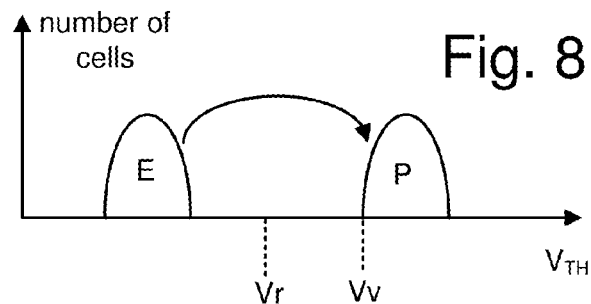
FIG. 8 depicts an example set of threshold voltage distributions and describes a process for programming non-volatile memory.

FIG. 8 illustrates example threshold voltage distributions for the memory cell array when each memory cell stores one bit of data. Other embodiments, however, may use more than one bit of data per memory cell (e.g., such as two, three, or four bits of data per memory cell). FIG. 8 shows two threshold voltage distributions (corresponding to two data states). The first threshold voltage distribution (data state) E represents memory cells that are erased. The second threshold voltage distribution (data state) P represents memory cells that are programmed. The curved arrow indicates the programming process where some memory cells are programmed to go from E to P. In one embodiment, memory cells in data state E store a logical "1" and memory cells in data state P store a logical "0." In one embodiment, the threshold voltages in E are negative and the threshold voltages in P are positive. FIG. 8 also depicts a read reference voltage Vr and verify reference voltage Vv. By testing whether the threshold voltage of a given memory cell is above or below Vr, the system can determine whether the memory cell is erased (E) or programmed (P). When programming memory cells, the system will test whether those memory cells have a threshold voltage greater than or equal to Vv.

Figure 9:
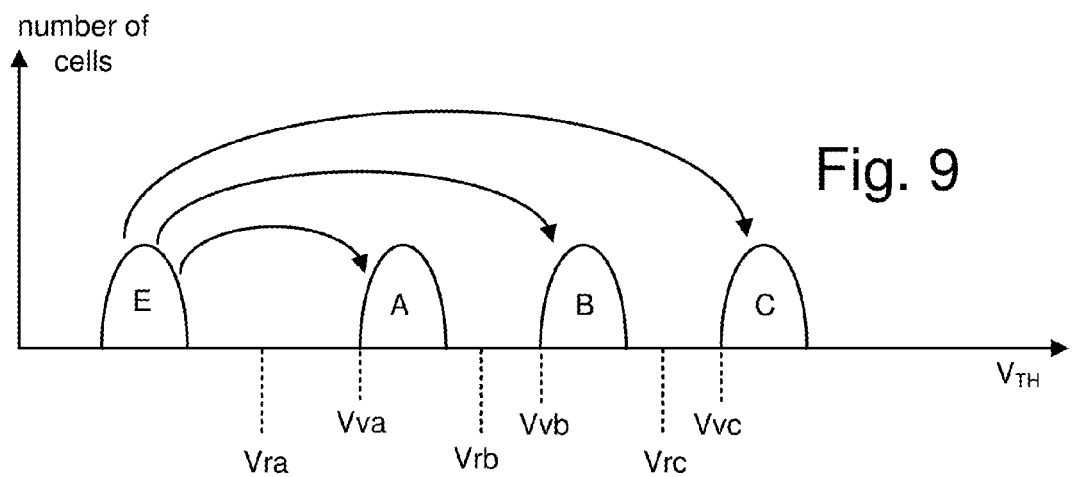
FIG. 9 depicts an example set of threshold voltage distributions and describes a process for programming non-volatile memory.

FIG. 9 illustrates example threshold voltage distributions (corresponding to data states) for the memory cell array when each memory cell stores two bits of data. FIG. 9 shows a first threshold voltage distribution E for erased memory cells. Three threshold voltage distributions, A, B and C for programmed memory cells are also depicted. In one embodiment, the threshold voltages in the E distribution are negative and the threshold voltages in the A, B and C distributions are positive. Each distinct threshold voltage distribution of FIG. 6 corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a floating gate erroneously shifts to its neighboring physical state, only one bit will be affected. One example assigns "11" to threshold voltage range E (state E), "10" to threshold voltage range A (state A), "00" to threshold voltage range B (state B) and "01" to threshold voltage range C (state C). However, in other embodiments, Gray code is not used. Although FIG. 9 shows four states, the present invention can also be used with other multi-state structures including those that include more or less than four states.

FIG. 9 also shows three read reference voltages, Vra, Vrb and Vrc, for reading data from memory cells. By testing whether the threshold voltage of a given memory cell is above or below Vra, Vrb and Vrc, the system can determine what state the memory cell is in. FIG. 9 also shows three verify reference voltages, Vva, Vvb and Vvc. When programming memory cells to state A, the system will test whether those memory cells have a threshold voltage greater than or equal to Vva. When programming memory cells to state B, the system will test whether the memory cells have threshold voltages greater than or equal to Vvb. When programming memory cells to state C, the system will determine whether memory cells have their threshold voltage greater than or equal to Vvc.

In one embodiment, known as full sequence programming, memory cells can be programmed from the erase state E directly to any of the programmed states A, B or C. For example, a population of memory cells to be programmed may first be erased so that all memory cells in the population are in erased state E. Then, a programming process is used to program memory cells directly into states A, B or C. While some memory cells are being programmed from state E to state A, other memory cells are being programmed from state E to state B and/or from state E to state C.

Figure 10:
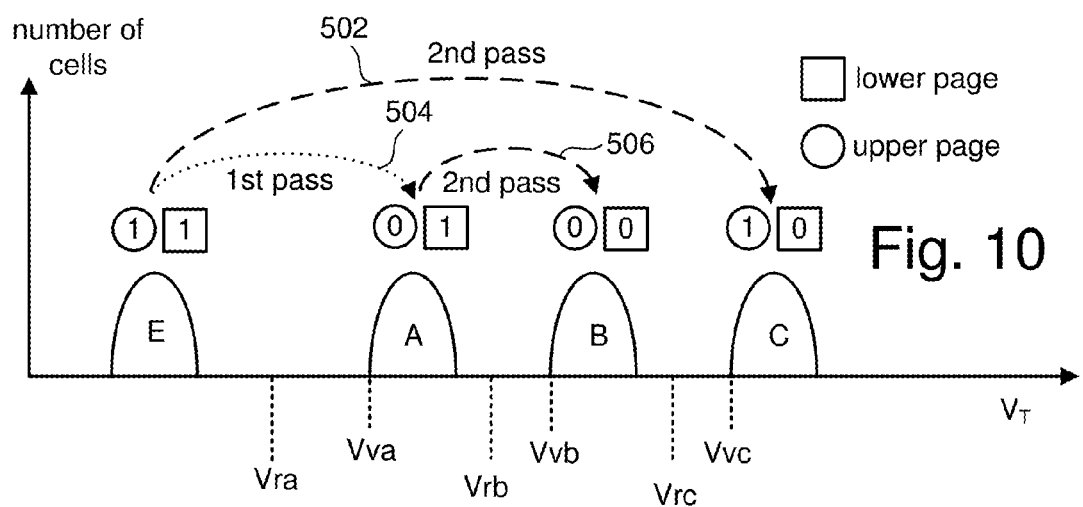
FIG. 10 depicts an example set of threshold voltage distributions and describes a process for programming non-volatile memory.

FIG. 10 illustrates one example of a two-stage technique of programming a multi-state memory cell that stores data for two different pages: a lower page and an upper page. Four states are depicted: state E (11), state A (10), state B (00) and state C (01). For state E, both pages store a "1." For state A, the lower page stores a "0" and the upper page stores a "1." For state B, both pages store "0." For state C, the lower page stores "1" and the upper page stores "0." Note that although specific bit patterns have been assigned to each of the states, different bit patterns may also be assigned. In a first programming stage, the memory cells' threshold voltages levels are set according to the bit to be programmed into the lower logical page. If that bit is a logic "1," the threshold voltage is not changed since the respective memory cell is in the appropriate state as a result of having been earlier erased. However, if the bit to be programmed is a logic "0," the threshold level of the cell is increased to be state A, as shown by arrow 504. That concludes the first programming stage.

In a second programming stage, the memory cell's threshold voltage level is set according to the bit being programmed into the upper logical page. If the upper logical page bit is to store a logic "1," then no programming occurs since the memory cell is in one of states E or A, depending upon the programming of the lower page bit, both of which carry an upper page bit of "1." If the upper page bit is to be a logic "0," then the threshold voltage is shifted. If the first stage resulted in the memory cell remaining in the erased state E, then in the second stage the memory cell is programmed so that the threshold voltage is increased to be within state C, as depicted by arrow 502. If the memory cell had been programmed into state A as a result of the first programming stage, then the memory cell is further programmed in the second stage so that the threshold voltage is increased to be within state B, as depicted by arrow 506. The result of the second stage is to program the memory cell into the state designated to store a logic "0" for the upper page without changing the data for the lower page.

In one embodiment, a system can be set up to perform full sequence writing if enough data is written to fill up an entire page. If not enough data is written for a full page, then the programming process can program the lower page programming with the data received. When subsequent data is received, the system will then program the upper page. In yet another embodiment, the system can start writing in the mode that programs the lower page and convert to full sequence programming mode if enough data is subsequently received to fill up an entire (or most of a) word line's memory cells.

Figure 11A:
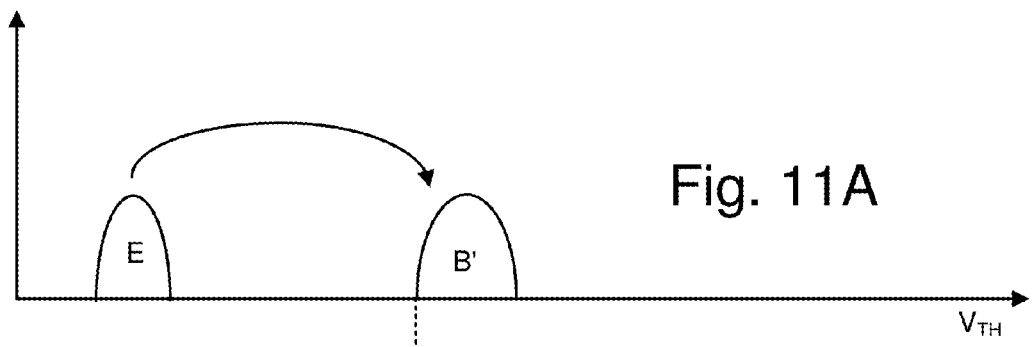
FIGS. 11A, 11B and 11C depict an example set of threshold voltage distributions and describes a process for programming non-volatile memory.
Figure 11B:
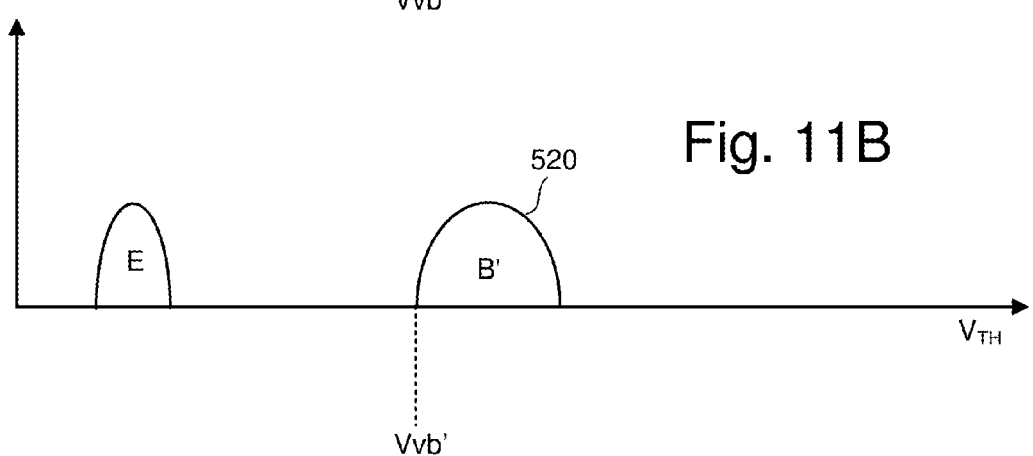
Figure 11C:
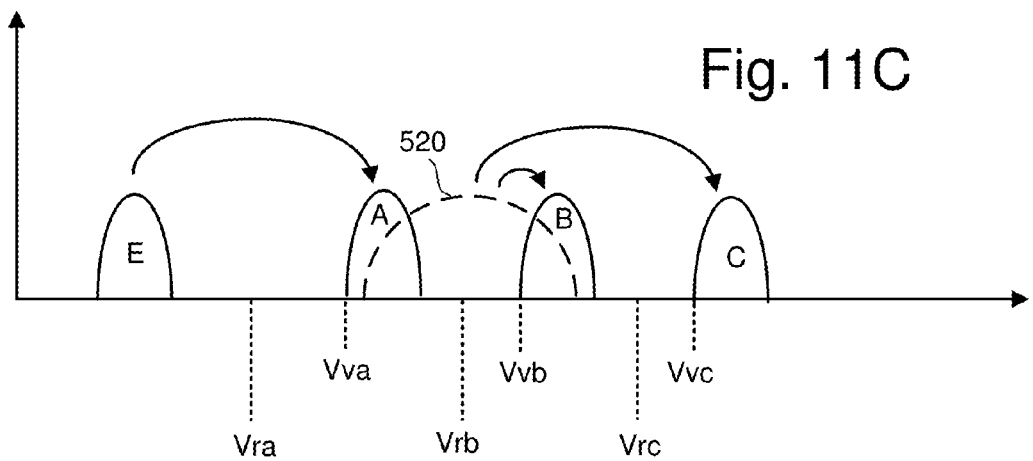

FIGS. 11A-C describe another multi-stage programming process for programming non-volatile memory. The process of FIG. 11A-C reduces floating gate to floating gate coupling by, for any particular memory cell, writing to that particular memory cell with respect to a particular page subsequent to writing to adjacent memory cells for previous pages. In one example of an implementation of the process taught by FIGS. 11A-C, the non-volatile memory cells store two bits of data per memory cell, using four data states. For example, assume that state E is the erased state and states A, B and C are the programmed states. State E stores data 11. State A stores data 01. State B stores data 10. State C stores data 00. This is an example of non-Gray coding because both bits change between adjacent states A & B. Other encodings of data to physical data states can also be used. Each memory cell stores two pages of data. For reference purposes, these pages of data will be called upper page and lower page; however, they can be given other labels. With reference to state A for the process of FIGS. 8A-C, the upper page stores bit 0 and the lower page stores bit 1. With reference to state B, the upper page stores bit 1 and the lower page stores bit 0. With reference to state C, both pages store bit data 0. The programming process of FIGS. 11A-C is a two-stage programming process; however, the process of FIGS. 8A-C can be used to implement a three stage process, a four state process, etc. In the first stage, the lower page is programmed. If the lower page is to remain data 1, then the memory cell state remains at state E. If the data is to be programmed to 0, then the threshold of voltage of the memory cell is raised such that the memory cell is programmed to state B'. FIG. 11A therefore shows the programming of memory cells from state E to state B'. State B' depicted in FIG. 11A is an interim state B; therefore, the verify point is depicted as Vvb', which is lower than Vvb. FIG. 11A shows the first stage of programming, used to program the lower page data.

In one embodiment, after a memory cell is programmed from state E to state B', its neighbor memory cell (on word line WLn+1) in the NAND string will then be programmed with respect to its lower page. After programming the neighbor memory cell, the floating gate to floating gate coupling effect may raise the apparent threshold voltage of earlier programmed memory cell. This will have the effect of widening the threshold voltage distribution for state B' to that depicted as threshold voltage distribution 520 of FIG. 11B. This apparent widening of the threshold voltage distribution will be remedied when programming the upper page.

FIG. 11C depicts the process of programming the upper page (the second stage). If the memory cell is in erased state E and the upper page is to remain at 1, then the memory cell will remain in state E. If the memory cell is in state E and its upper page data is to be programmed to 0, then the threshold voltage of the memory cell will be raised so that the memory cell is in state A. If the memory cell was in intermediate threshold voltage distribution 520 and the upper page data is to remain at 1, then the memory cell will be programmed to final state B. If the memory cell is in intermediate threshold voltage distribution 520 and the upper page data is to become data 0, then the threshold voltage of the memory cell will be raised so that the memory cell is in state C. The process depicted by FIGS. 8A-C reduces the effect of floating gate to floating gate coupling because only the upper page programming of neighbor memory cells will have an effect on the apparent threshold voltage of a given memory cell. An example of an alternate state coding is to move from distribution 520 to state C when the upper page data is a 1, and to move to state B when the upper page data is a 0.

Figure 12:
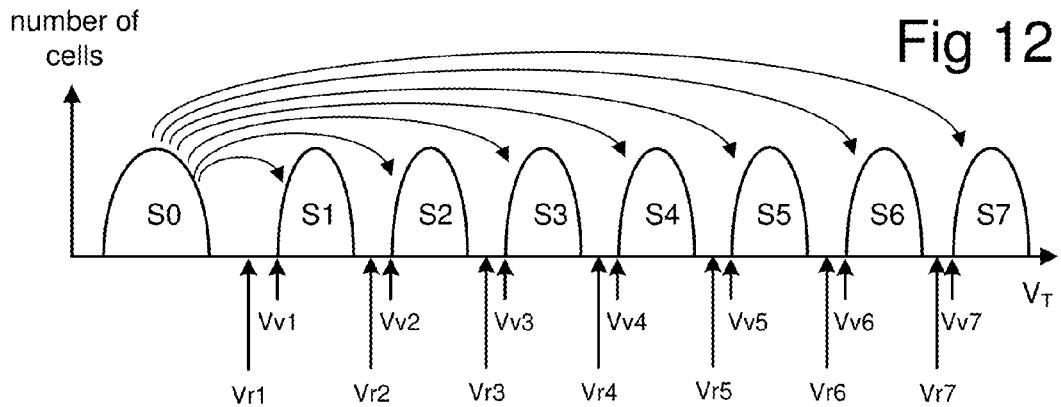
FIG. 12 depicts an example set of threshold voltage distributions and describes a process for programming non-volatile memory.

FIG. 12 illustrates example threshold voltage distributions for the memory cell array when each memory cell stores three bits of data. Other embodiments, however, may use more or less than three bits of data per memory cell (e.g., such as three bits of data per memory cell).

In the example of FIG. 12, each memory cell stores three bits of data; therefore, there are eight valid threshold voltage distributions, also called data states: S0, S1, S2, S3, S4, S5, S6 and S7. In one embodiment, data state S0 is below 0 volts and data states S1-S7 are above 0 volts. In other embodiments, all eight data states are above 0 volts, or other arrangements can be implemented. In one embodiment, the threshold voltage distribution for S0 is wider than for S1-S7. In one embodiment, S0 is for erased memory cells. Data is programmed from S0 to S1-S7.

Each data state corresponds to a unique value for the three data bits stored in the memory cell. In one embodiment, S0=111, S1=110, S2=101, S3=100, S4=011, S5=010, S6=001 and S7=000. Other mapping of data to states S0-S7 can also be used. The specific relationship between the data programmed into the memory cell and the threshold voltage levels of the cell depends upon the data encoding scheme adopted for the cells. For example, U.S. Pat. No. 6,222,762 and U.S. Patent Application Publication No. 2004/0255090, "Tracking Cells For A Memory System," filed on Jun. 13, 2003, describe various data encoding schemes for multi-state flash memory cells. In one embodiment, data values are assigned to the threshold voltage ranges using a Gray code assignment so that if the threshold voltage of a floating gate erroneously shifts to its neighboring threshold voltage distribution, only one bit will be affected. However, in other embodiments, Gray code is not used.

In one embodiment, all of the bits of data stored in a memory cell are stored in the same logical page. In other embodiments, each bit of data stored in a memory cell corresponds to different logical pages. Thus, a memory cell storing three bits of data would include data in a first page, data in a second page and data in a third page. In some embodiments, all of the memory cells connected to the same word line would store data in the same three pages of data. In some embodiments, the memory cells connected to a word line can be grouped into different sets of pages (e.g., by odd and even bit lines, or by other arrangements).

In some devices, the memory cells will be erased to state S0. From state S0, the memory cells can be programmed to any of states S1-S7. In one embodiment, known as full sequence programming, memory cells can be programmed from the erased state S0 directly to any of the programmed states S1-S7. For example, a population of memory cells to be programmed may first be erased so that all memory cells in the population are in erased state S0. While some memory cells are being programmed from state S0 to state S1, other memory cells are being programmed from state S0 to state S2, state S0 to state S3, state S0 to state S4, state S0 to state S5, state S0 to state S6, and state S0 to state S7. Full sequence programming is graphically depicted by the seven curved arrows of FIG. 8.

FIG. 12 shows a set of verify target levels Vv1, Vv2, Vv3, Vv4, Vv5, Vv6, and Vv7. These verify levels are used as comparison levels (also known as target levels and/or compare levels) during the programming process. For example, when programming memory cells to state S1, the system will check to see if the threshold voltages of the memory cells have reached Vv1. If the threshold voltage of a memory cell has not reached Vv1, then programming will continue for that memory cell until its threshold voltage is greater than or equal to Vv1. If the threshold voltage of a memory cell has reached Vv1, then programming will stop for that memory cell. Verify target level Vv2 is used for memory cells being programmed to state S2. Verify target level Vv3 is used for memory cells being programmed to state S3. Verify target level Vv4 is used for memory cells being programmed to state S4. Verify target level Vv5 is used for memory cells being programmed to state S5. Verify target level Vv6 is used for memory cells being programmed to state S6. Verify target level Vv7 is used for memory cells being programmed to state S7.

FIG. 12 also shows a set of read compare levels Vr1, Vr2, Vr3, Vr4, Vr5, Vr6, and Vr7. These read compare levels are used as comparison levels during the read process. By testing whether the memory cells turn on or remain off in response to the read compare levels Vr1, Vr2, Vr3, Vr4, Vr5, Vr6, and Vr7 being separately applied to the control gates of the memory cells, the system can determine for which states that memory cells are storing data.

In general, during verify operations and read operations, the selected word line is connected to a voltage (one example of a reference signal), a level of which is specified for each read operation (e.g., see read compare levels Vr1, Vr2, Vr3, Vr4, Vr5, Vr6, and Vr7, of FIG. 8) or verify operation (e.g. see verify target levels Vv1, Vv2, Vv3, Vv4, Vv5, Vv6, and Vv7 of FIG. 8) in order to determine whether a threshold voltage of the concerned memory cell has reached such level. After applying the word line voltage, the conduction current of the memory cell is measured to determine whether the memory cell turned on (conducted current) in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell. During a read or verify process, the unselected memory cells are provided with one or more read pass voltages at their control gates so that these memory cells will operate as pass gates (e.g., conducting current regardless of whether they are programmed or erased).

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods known in the art for verifying/reading. Other read and verify techniques known in the art can also be used.

Figure 13:
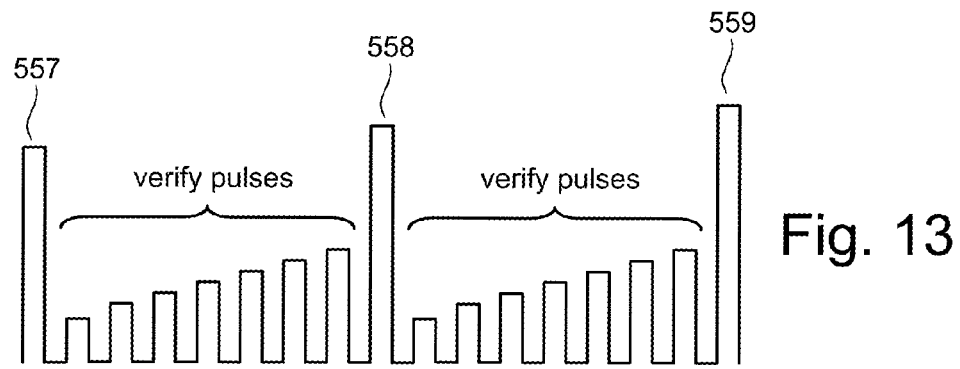
FIG. 13 depicts three programming pulses, and the verify pulses applied between the programming pulses.

In some embodiments, the program voltage applied to the control gate includes a series of pulses that are increased in magnitude with each successive pulse by a predetermined step size (e.g. 0.2 v, 0.3 v, 0.4 v, or others). Between pulses, some memory systems will verify whether the individual memory cells have reached their respective target threshold voltage ranges. For example, FIG. 13 shows a portion of a signal applied to the control gates of a plurality of memory cells connected to a common word line. FIG. 13 shows programming pulses 557, 558 and 559, with a set of verify pulses between the programming pulses. When performing full sequence programming in one embodiment, the verification process between programming pulses will test for each of the threshold voltage distribution (data states) S1-S7. Therefore, FIG. 13 shows seven verify pulses that have magnitudes corresponding to verify target levels Vv1, Vv2, Vv3, Vv4, Vv5, Vv6, and Vv7. In some embodiments, one or more of the verify operations can be skipped (and, therefore one or more of the verify pulses can be skipped) because the verify operation is not necessary or superfluous. For example, if none of the memory cells being programmed according to FIG. 12 have reached Vv2, there is no reason to verify at Vv7.

Figure 14:
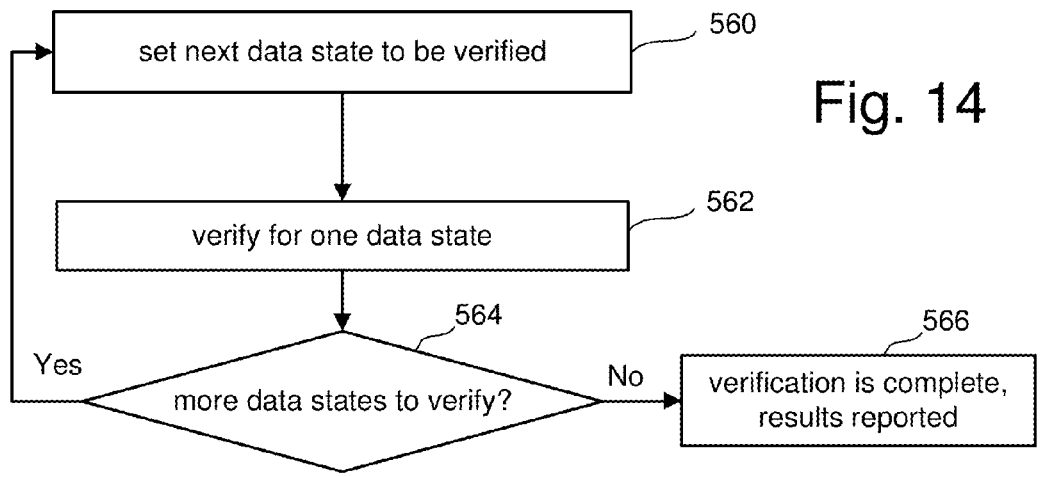
FIG. 14 is a flow chart describing one embodiment for verifying programming.

FIG. 14 is a flow chart describing one embodiment of a process for verifying whether programming was successful. In step 560, the next state to be verified is set. As discussed in the example of FIGS. 12 and 13, memory cells storing three bits of data may store that data in any of eight data states. As S0 represents erased memory cells, then memory cells can be programmed to any of seven programmed states (e.g., S1-S7). Therefore, in one embodiment, there are seven data states that need to be verified. One of those seven is chosen in step 570. A verify operation is performed for the chosen state in step 562. In one embodiment, the verify target level (levels Vv1, Vv2, Vv3, Vv4, Vv5, Vv6, and Vv7) for the chosen state is applied to the selected word line and then they sense amplifier is used to see whether the memory cell conducts. If it conducts, then verify has failed. If it does not conduct, then programming has been verified. If there are more states to verify (step 564), then the process loops back to step 560. Otherwise, verification is complete and the results are reported in step 566.

Figure 15A:
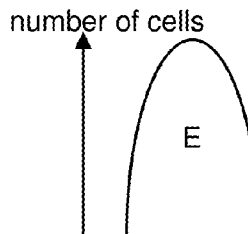
FIGS. 15A, 15B, 15C, 15D, and 15E show various threshold voltage distributions and describe a process for programming non-volatile memory.
Figure 15B:
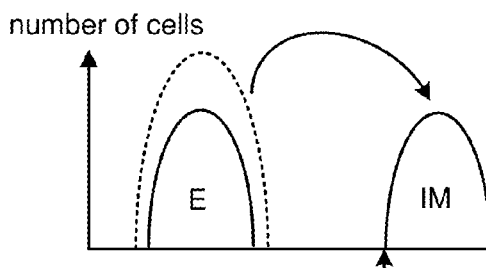

FIG. 12 shows a programming process that includes one phase where all memory cells connected to the same word line are programmed concurrently during that one phase. FIGS. 15A-E illustrates a multi-phase programming approach. In this embodiment, the programming process includes three phases. Prior to programming, the memory cells are erased so that all memory cells connected to a common word line are in an erased threshold voltage distribution E, as depicted in FIG. 15A. During the first phase of programming, those memory cells whose targets (due to the data to be stored in those memory cells) are data states S4, S5, S6 or S7 are programmed to an intermediate state IM. Those memory cells are targeted for data states S0, S1, S2 or S3 and remain in the erased threshold voltage distribution E. The first phase is graphically depicted by FIG. 14B. Memory cells being programmed to intermediate state IM are programmed to a target threshold voltage of VvIM.

Figure 15C:
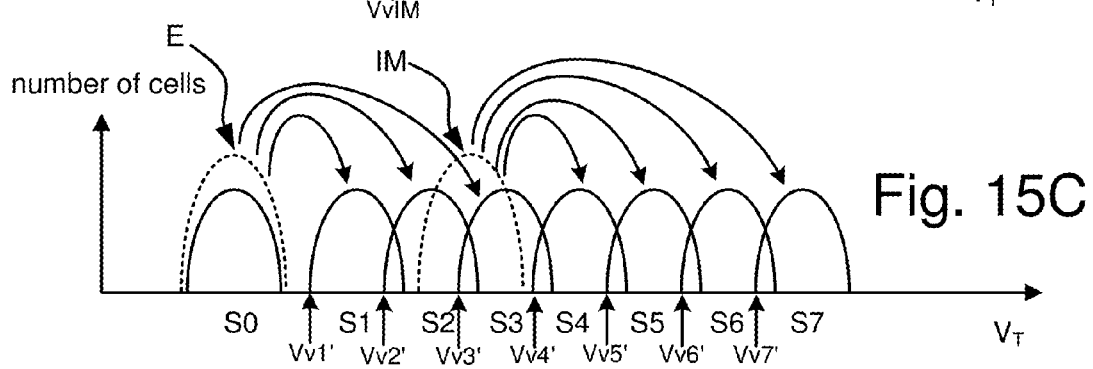
Figure 15D:
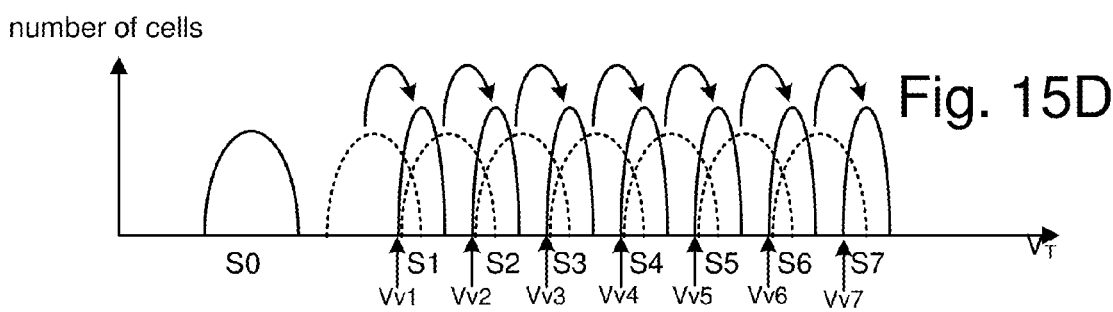
Figure 15E:
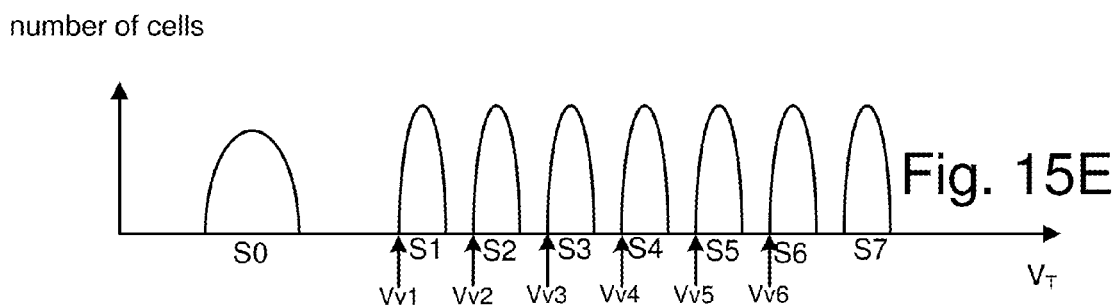

During the second phase of the programming process of FIGS. 15A-E, those memory cells that are in the erased threshold voltage distribution E are programmed to their target data states. For example, those memory cells to be programmed to data state S3 are programmed from erased threshold voltage distribution E to data state S3, those memory cells to be programmed to data state S2 are programmed from erased threshold voltage distribution E to data state S2, those memory cells to be programmed to data state S1 are programmed from erase threshold voltage distribution E to data state S1, and those memory cells to be in data state S0 are not programmed during the second phase of the programming process. Thus, erased threshold voltage distribution E becomes data state S0. Also, during the second phase, memory cells are programmed from the intermediate state IM to various data states S4-S7. For example, those memory cells to be programmed to data state S7 are programmed from the intermediate state IM to data state S7, those memory cells targeted to be in data state S6 are programmed from intermediate state IM to data state S6, both memory cells to be programmed to data state S5 are programmed from intermediate state IM to data state S5, and those memory cells to be programmed to data state S4 are programmed from intermediate state IM to data state S4. This second phase of programming is illustrated in FIG. 15C.

As can be seen in FIG. 15C, at the end of the second phase of programming data states S1-S7 overlap with neighboring data states. For example, data state S1 overlaps with data state S2, data state S2 overlaps with data states S1 and S3, data state S3 overlaps with data states S2 and S4, data state S4 overlaps with data states S3 and S5, data state S5 overlaps with data states S4 and S6, and data state S6 overlaps with data states S5 and S7. In some embodiments, all or some of the data states do not overlap.

In the third phase of programming, each of data states S1-S7 are tightened so that they no longer overlap with neighboring states. This is depicted graphically by FIG. 15D. The final result of the three phrase programming process is depicted in step 15E, which shows data states S0-S7. In some embodiments, data state S0 is wider than data states S1-S7. FIG. 14F shows one example of how data is encoded for the data states of FIGS. 15A-E.

In some embodiments, those memory cells to be programmed to data state S4 are not programmed during the second phase and, therefore, remain in intermediate state IM. During the third programming phase, the memory cells are programmed from IM to S4. In other embodiments, memory cells destined for other states can also remain in IM or E during the second phase.

Figures 15F, 16:
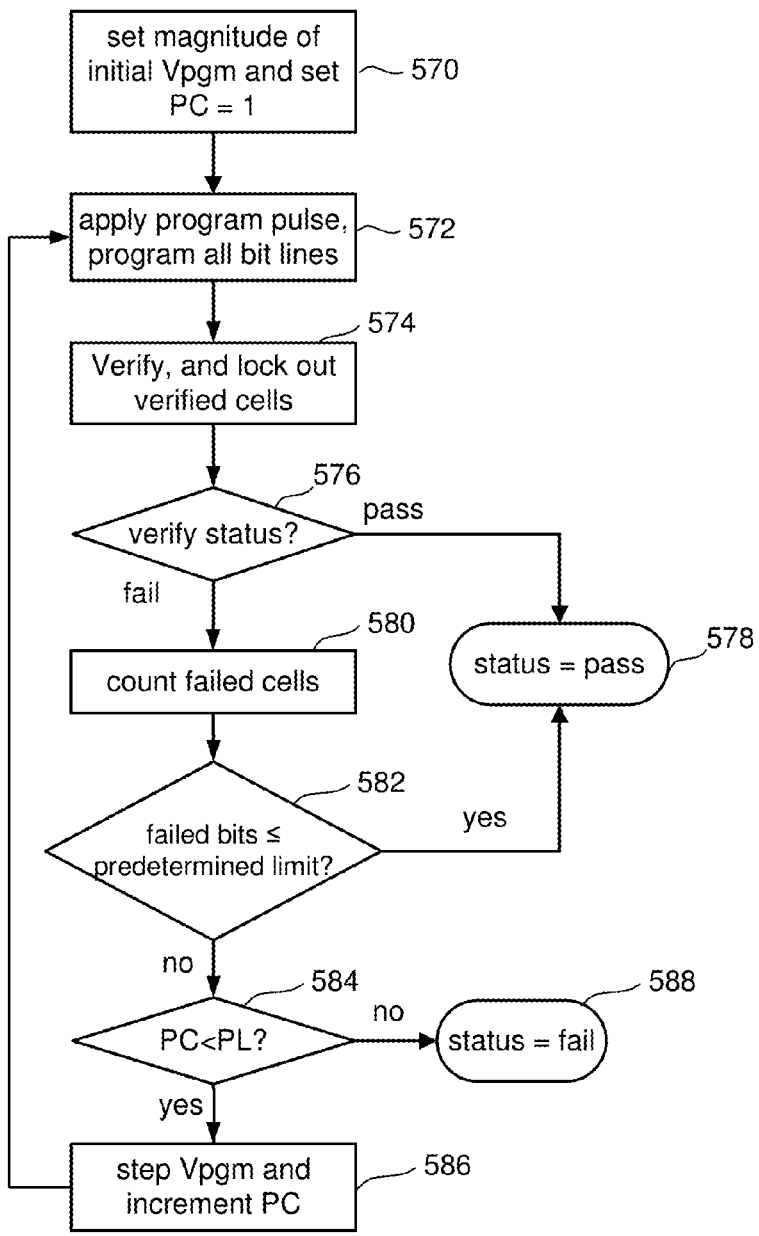
FIG. 15F is a table depicting an example data encoding.
FIG. 16 is a flow chart describing one embodiment of a process for programming non-volatile memory.

FIG. 16 is a flow chart describing one embodiment of a process for performing programming on memory cells connected to a common word line to one or more targets (e.g., data states or threshold voltage ranges). The process of FIG. 16 can be performed one or multiple times during step 556 of FIG. 7. For example, the process of FIG. 16 can be used to program memory cells from erased data state E to programmed data state P of FIG. 8; from data state E of FIG. 9 to any of data states A, B or C performing full sequence programming, for the first pass and/or second pass of FIG. 10, and any stage of the multi-stage programming process of FIGS. 11A-C.

The process of FIG. 16 can be used to program memory cells (e.g., full sequence programming) from state S0 directly to any of states S1-S7 as depicted in FIG. 12. Alternatively, the process of FIG. 16 can be used to perform one or each of the phases of the process of FIG. 15A-E. For example, when performing the process of FIG. 14A, the process of FIG. 16 is used to implement the first phase that includes programming some of the memory cells from state E to state IM. The process of FIG. 15 can then be used again to implement the second phase that includes programming some of the memory cells from state E to states S1-S3 and from state IM to states S4-S7. The process of FIG. 16 can be used again to adjust states S1-S7 in the third phase (see FIG. 14D). The process of FIG. 16 can also be used with other multi-phase programming processes.

Typically, the program voltage applied to the control gate during a program operation is applied as a series of program pulses. Between programming pulses are a set of verify pulses to perform verification, as depicted (for example) in FIG. 13. In many implementations, the magnitude of the program pulses is increased with each successive pulse by a predetermined step size. In step 570 of FIG. 16, the programming voltage (Vpgm) is initialized to the starting magnitude (e.g., ~12-16V or another suitable level) and a program counter PC maintained by state machine 222 is initialized at 1. In step 572, a program pulse of the program signal Vpgm is applied to the selected word line (the word line selected for programming). In one embodiment, the group of memory cells being programmed concurrently are all connected to the same word line (the selected word line). The unselected word lines receive one or more boosting voltages (e.g., ~7-11 volts) to perform boosting schemes known in the art. If a memory cell should be programmed, then the corresponding bit line is grounded. On the other hand, if the memory cell should remain at its current threshold voltage, then the corresponding bit line is connected to Vdd to inhibit programming. In step 572, the program pulse is concurrently applied to all memory cells connected to the selected word line so that all of the memory cells connected to the selected word line are programmed concurrently. That is, they are programmed at the same time (or during overlapping times). In this manner all of the memory cells connected to the selected word line will concurrently have their threshold voltage change, unless they have been locked out from programming.

In step 574, the appropriate memory cells are verified using the appropriate set of target (compare) levels to perform one or more verify operations. In one embodiment, the verification process is performed by applying the testing whether the threshold voltages of the memory cells selected for programming have reached the appropriate verify compare voltage (Vv1, Vv2, Vv3, Vv4, Vv5, Vv6, and Vv7). In one embodiment, the process of the flow chart of FIG. 14 is performed during step 574.

In step 576, it is determined whether all the memory cells have reached their target threshold voltages (pass). If so, the programming process is complete and successful because all selected memory cells were programmed and verified to their target states. A status of "PASS" is reported in step 578. If, in 576, it is determined that not all of the memory cells have reached their target threshold voltages (fail), then the programming process continues to step 580.

In step 580, the system counts the number of memory cells that have not yet reached their respective target threshold voltage distribution. That is, the system counts the number of cells that have failed the verify process. This counting can be done by the state machine, the controller, or other logic. In one implementation, each of the sense block 300 (see FIG. 3) will store the status (pass/fail) of their respective cells. These values can be counted using a digital counter. As described above, many of the sense blocks have an output signal that is wire-Or'd together. Thus, checking one line can indicate that no cells of a large group of cells have failed verify. By appropriately organizing the lines being wired-Or together (e.g., a binary tree-like structure), a binary search method can be used to determine the number of cells that have failed. In such a manner, if a small number of cells failed, the counting is completed rapidly. If a large number of cells failed, the counting takes a longer time. In another alternative, each of the sense amplifiers can output an analog voltage or current if its corresponding memory cell has failed and an analog voltage or current summing circuit can be used to count the number of memory cells that have failed.

In one embodiment, there is one total count, which reflects the total number of memory cells currently being programmed that have failed the last verify step. In another embodiment, separate counts are kept for each data state.

In step 582, it is determined whether the count from step 580 is less than or equal to a predetermined limit. In one embodiment, the predetermined limit is the number of bits that can be corrected by ECC during a read process for the page of memory cells. If the number of failed cells is less than or equal to the predetermined limit, than the programming process can stop and a status of "PASS" is reported in step 578. In this situation, enough memory cells programmed correctly such that the few remaining memory cells that have not been completely programmed can be corrected using ECC during the read process. In some embodiments, step 580 will count the number of failed cells for each sector, each target data state or other unit, and those counts will individually or collectively be compared to a threshold in step 582.

In another embodiment, the predetermined limit can be less than the number of bits that can be corrected by ECC during a read process to allow for future errors. When programming less than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed or other criteria.

If number of failed memory cells is not less than the predetermined limit, than the programming process continues at step 584 and the program counter PC is checked against the program limit value (PL). Examples of program limit values include 20 and 30; however, other values can be used. If the program counter PC is not less than the program limit value PL, then the program process is considered to have failed and a status of FAIL is reported in step 588. If the program counter PC is less than the program limit value PL, then the process continues at step 586 during which time the Program Counter PC is incremented by 1 and the program voltage Vpgm is stepped up to the next magnitude.

For example, the next pulse will have a magnitude greater than the previous pulse by a step size (e.g., a step size of 0.1-0.4 volts). After step 586, the process loops back to step 572 and another program pulse is applied to the selected word line.

Figure 17:
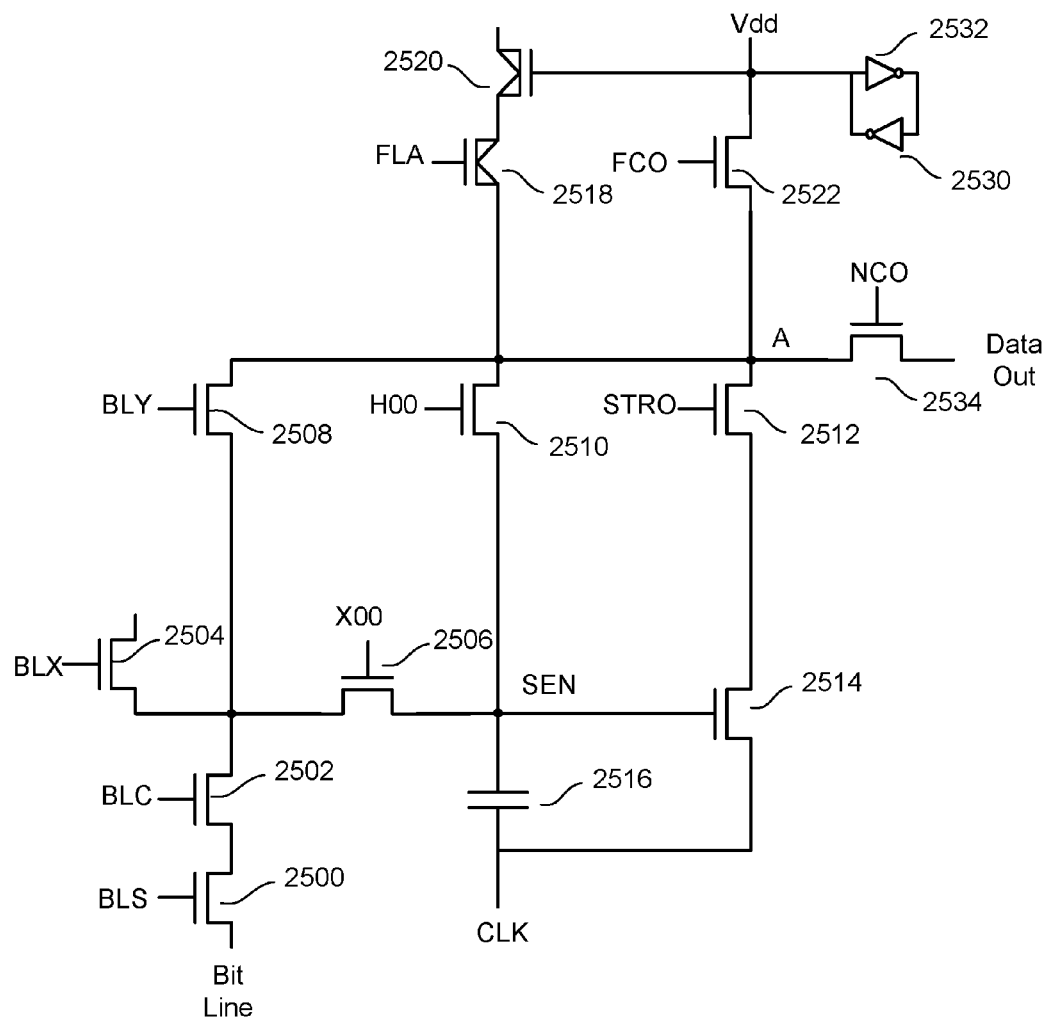
FIG. 17 is a schematic diagram of one embodiment of sense circuitry.

FIG. 17 is a schematic diagram depicting a circuit from sense circuitry 470 (see FIG. 4). As described below, the circuit of FIG. 17 will pre-charge a capacitor (or other charge storage device) to a pre-charge magnitude, discharge the capacitor through the memory cell for a strobe time, and sense voltage at the capacitor after the strobe time. The strobe time and/or the pre-charge magnitude can be based on the position of the memory cell being sensed with respect to the sense amplifier. Though FIG. 17 features one capacitor, in some embodiments, any suitable charge storage device can replace or complement this capacitor. The sense voltage will be indicative of whether the memory cells conducted the current being sensed for, which is indicative of whether the threshold voltage of the memory cell is greater than or less than threshold voltage being tested for (corresponding to the control gate voltage). If the threshold voltage of the memory cell is greater than the threshold voltage being tested, then, during a verify operation, the memory cell will complete programming, as appropriate based on the processes described above. FIG. 17 shows transistor 2500 connected to the Bit Line and transistor 2502. Transistor 2500 receives the signal BLS at its gate, and is used to connect to or isolate the Bit Line. Transistor 2502 receives the signal BLC at its gate, and is used as a voltage clamp. The gate voltage BLC is biased at a constant voltage equal to the desired Bit Line voltage plus the threshold voltage of transistor 2502. The function of transistor 2502, therefore, is to maintain a constant Bit Line voltage during a sensing operation (during read or verify), even if the current through the Bit Line changes. As will be shown later, in some embodiments of the disclosed technology, BLC is subject to adjustment in order to vary the bit line voltage according to the programmed state of the block and/or the location of the word line being sensed with respect to the source select line.

Transistor 2502 is connected to transistors 2504, 2506 and 2508. Transistor 2506 is connected to capacitor 2516 at the node marked SEN. The purpose of transistor 2506 is to connect capacitor 2516 to Bit Line 2500 and disconnect capacitor 2516 from Bit Line 2500 so that capacitor 2516 is in selective communication with Bit Line 2500. In other words, transistor 2506 regulates the strobe time mentioned above with respect to step 856. That is, while transistor 2506 is turned on capacitor 2516 can discharge through the Bit Line, and when transistor 2506 is turned off capacitor 2516 cannot discharge through the Bit Line.

The node at which transistor 2506 connects to capacitor 2516 is also connected to transistor 2510 and transistor 2514. Transistor 2510 is connected to transistors 2508, 2512 and 2518. Transistor 2518 is also connected to transistor 2520. Transistors 2518 and 2520 are PMOS transistors while the other transistors of FIG. 17 are NMOS transistors. Transistors 2510, 2518, and 2520 provide a pre-charging path to capacitor 2516. A voltage (e.g. Vdd or other voltage) is applied to the source of transistor 2520. By appropriately biasing transistors 2510, 2518 and 2520, the voltage applied to the source of transistor 2520 can be used to pre-charge capacitor 2516. After pre-charging, capacitor 2516 can discharge through the Bit Line via transistor 2506 (assuming that transistors 2500 and 2502 are conducting).

The circuit of FIG. 17 includes inverters 2530 and 2532 forming a latch circuit. The output of inverter 2532 is connected to the input of inverter 2530 and the output of inverter 2530 is connected to the input of inverter 2532 as well as transistors 2520 and 2522. The input of inverter 2532 will receive Vdd and the two inverters 2530, 2532 will act as a latch to store Vdd. The input of inverter 2532 can also be connected to another value. Transistors 2512 and 2522 provide a path for communicating the data stored by inverters 2530 and 2532 to transistor 2514. Transistor 2522 receives the signal FCO at its gate. Transistor 2512 receives the signal STRO at its gate. By raising or lowering FCO and STRO, a path is provided or cut off between the inverters 2530, 2532 and transistor (sensing switch) 2514. The gate of transistor 2514 is connected capacitor 2516, transistor 2506 and transistor 2510 at the node marked SEN. The other end of capacitor 2516 is connected to the signal CLK.

As discussed above, capacitor 2516 is pre-charged via transistors 2510, 2518 and 2520. This will raise the voltage at the SEN node to a pre-charge voltage level (Vpre). When transistor 2506 turns on, capacitor 2516 can discharge its charge through the Bit Line and the selected memory cell if the threshold voltage of the memory cell is below the voltage level being tested for. If the capacitor 2516 is able to discharge, then the voltage at the capacitor (at the SEN node) will decrease.

The pre-charge voltage (Vpre) at the SEN node is greater than the threshold voltage of transistor 914; therefore, prior to the strobe time, transistor 2514 is on (conducting). Since transistor 2514 is on during the strobe time, then transistor 2512 should be off. If the capacitor does not discharge during the strobe time, then the voltage at the SEN node will remain above the threshold voltage of transistor 2514 and the charge at the inverters 2530, 2532 can be discharged into the CLK signal when STRO turns on transistor 2512. If the capacitor discharges sufficiently during the strobe time, then the voltage at the SEN node will decrease below the threshold voltage of transistor 2514; thereby, turning off transistor 2514 and the data (e.g., Vdd) stored at inverters 2530, 2532 from being discharged through CLK. So testing whether the diodes 2530, 2532 maintain their charge or discharge will indicate the result of the verification process. In one embodiment, the result can be read at node A via transistor 2534 (Data Out) by turning on transistor 2534 gate signal NCO.

The pre-charge level of capacitor 2516 (and, thus, the pre-charge voltage at node SEN) is limited by the current passing through transistor 2510. The current that passes through transistor 2510 is limited by the gate voltage H00. As such, the pre-charge voltage at node SEN is limited by the voltage H00 less the threshold voltage of transistor 2510. With this arrangement, the system can regulate the pre-charge voltage at node SEN by regulating H00. A larger voltage at H00 results in a larger voltage at the SEN node when pre-charging. A lower voltage at H00 results in a lower voltage at the SEN node when pre-charging.

When the system performs a read operation, the voltage applied to the control gate of the cell may cause the channel (connected to the bit line) of the cell to conduct. If this happens, a capacitor is discharged through the channel, lowering in voltage as it discharges.

Figure 18:
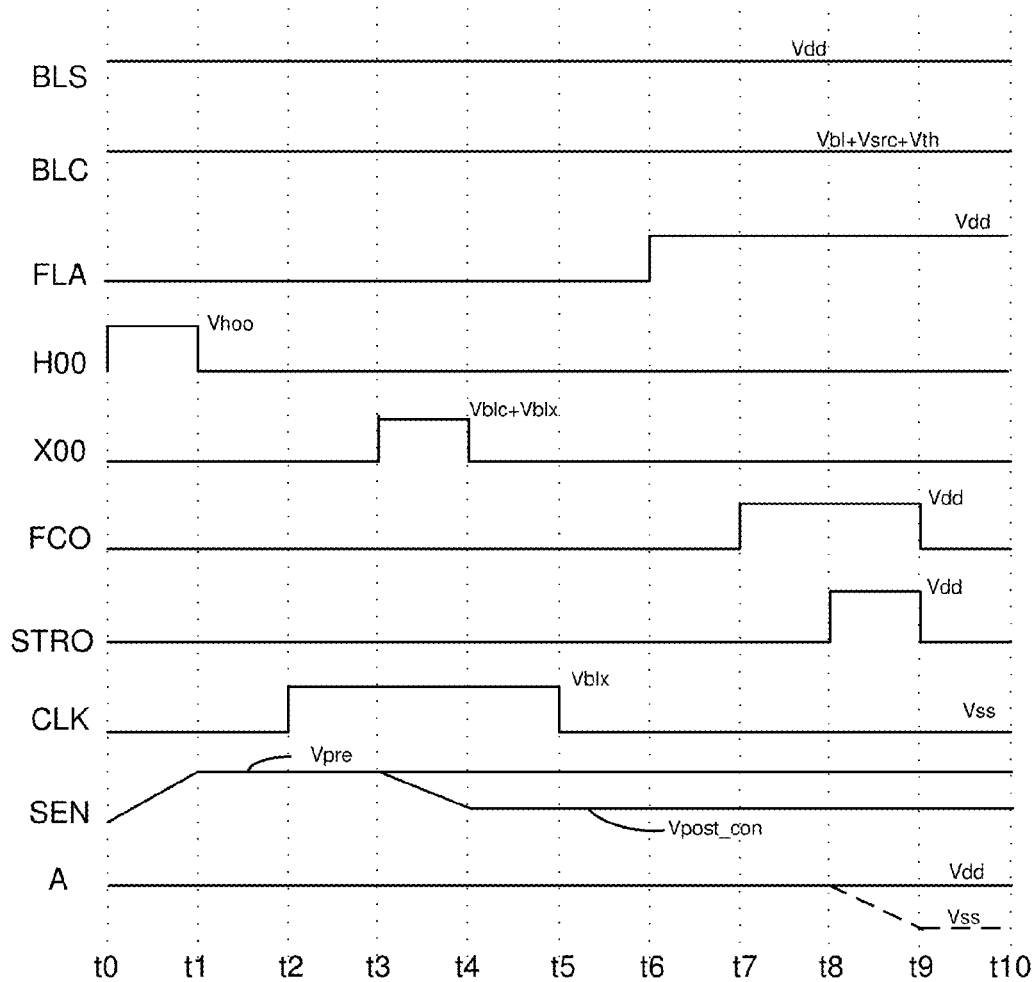
FIG. 18 is a timing diagram that describes the behavior of signals depicted in FIG. 16.

FIG. 18 is a timing diagram describing the behavior of various signals from FIG. 16. The signal BLS is at Vdd the entire time depicted and the signal BLC is at Vbl+Vsrc+Vth, where Vbl is the voltage of the Bit Line, Vsrc is the voltage of the source line and Vth is the threshold voltage of transistor 902. The signal FLA starts at Vss at t0 and goes to Vdd at T6. When the signal FLA is at Vss, the pre-charging path is regulated by transistor 2510. At t0, the voltage of H00 is raised from ground to a pre-charge level. The raising of the voltage at H00 turns on transistor 2510 and opens up the pre-charge path. The magnitude of the voltage at H00 is set. FIG. 18 shows H00 going to Vhoo. Note that in some embodiments, the circuit of FIG. 17 can respond to more than one voltage magnitude for H00. For example, in one embodiment, the output of the circuit of FIG. 17 is a linear function with respect to position of the memory cell being sensed so that there are many different possible voltage magnitudes for H00, depending on position of the memory cell being sensed. The signal H00 will stay at the pre-charge voltage (Vhoo) until time t1. While H00 is high, transistor 2510 turns on and capacitor 2516 will pre-charge between T0 and T1, as depicted by the voltage at SEN (depicted second from the bottom on FIG. 14). At time t1, H00 is brought down to Vss and the pre-charging is completed.

The signal X00 is used to allow capacitor 2516 to be in communication with the Bit Line so that the capacitor can discharge through the Bit Line and selected memory cell. At time t3, X00 is raised to Vblc+Vblx, where Vblc is the voltage of the signal BLC and Vblx is the voltage of the signal BLX (both discussed above). At time t4, the voltage at X00 is lowered to Vss. Between times t3 and t4, known as the integration time, capacitor 2516 will be in communication with the Bit Line in order to allow it to discharge through the Bit Line and the selected memory cell (depending on the threshold voltage of the selected memory cell). The signal CLK is raised to Vblx at time t2 and lowered back down to Vss at time T5 to prevent any fighting conditions in the circuit and to allow proper discharge of capacitor 2516.

As discussed above, because H00 is raised between t0 and t1, capacitor 2516 (and SEN node) will charge up between t0 and t1 (the pre-charge). This is depicted in FIG. 18 with the SEN node charging from Vss to Vpre. The solid line for Vpre represents an example pre-charging of the node SEN (and capacitor 2516) in response to Vh00 being applied to the gate of transistor 2510.

When X00 is raised up at t3, capacitor 2516 can initially pre-charge the bit line and then discharge through the Bit Line (if the threshold voltage is at the appropriate level). As depicted in FIG. 18 between t3 and t4, the voltage at the SEN node can will dissipate from Vpre to Vpost_con if the memory cell turns on (conducts) because its threshold voltage is less than or equal to the voltage being applied to its control gate. If the threshold voltage for the memory cell being tested is higher than the voltage applied to its control gate, capacitor 2516 will not discharge and the voltage will remain at Vpre. The period between t3 and t4 is the strobe time and can be adjusted, as described above.

FIG. 18 shows that the signal FCO is raised to Vdd at t7 and lowered to Vss at T9. The signal STRO is raised to Vdd at t8 and lowered at t9. Between times t8 and t9, there is a path between the inverters 2530, 2532 and transistor 2514. If the voltage at the node SEN is greater than the threshold voltage of transistor 2514, then there will be a path from the inverters 2530, 2532 to CLK and the data at the inverters 2530,932 will dissipate through the signal CLK and through the transistor 2514. If the voltage at the node SEN is lower than threshold voltage of transistor 2514 (e.g. if the capacitor discharged), then transistor 2514 will turn off and the voltage stored by the inverters 2530, 2532 will not dissipate into CLK. FIG. 18 shows the voltage level at node A at Vdd. If the voltage of the capacitor does not dissipate (e.g., due to not enough current flowing because the threshold voltage of the selected memory cell is greater than the voltage being tested for), then transistor 2514 will remain on and the voltage at node A will dissipate to Vss (as depicted by the dashed line). If the voltage of the capacitor does dissipate (e.g., due to sufficient current flowing because the threshold voltage of the selected memory cell is below the voltage being tested for), then transistor 2514 will turn off and the voltage at node A will remain at Vdd (as depicted by the solid line). The output of node A is provided to the Data Out signal via transistor 2534 by applying Vdd to the signal NCO.

Figure 19:
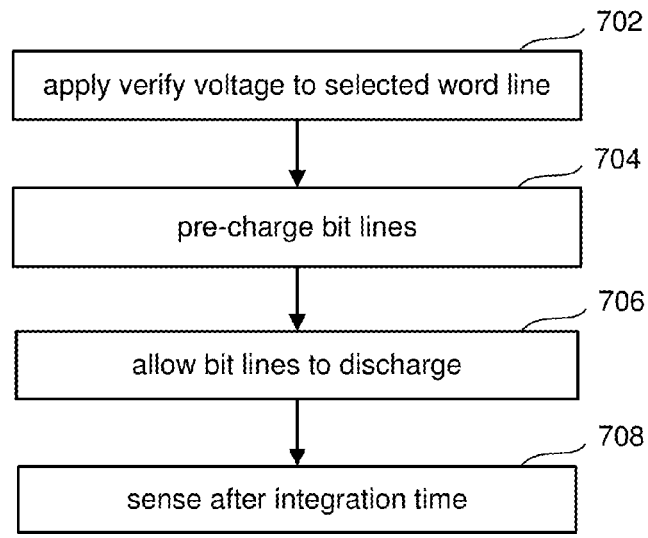
FIG. 19 is a flow chart describing one embodiment for performing a single strobe sensing operation for reading data.

FIG. 19 is a flow chart describing a single strobe sensing operation performed according to the timing diagram of FIG. 18. In one embodiment, the process of FIG. 19 can be performed during step 562 of FIG. 14. In step 702, the appropriate verify compare voltage (e.g., Vv, Vv1, Vv2, Vv3, Vv4, Vv5, Vv6, or Vv7) is applied to the selected word line. In step 704, all of the bit lines are pre-charged. In one example embodiment, the bit lines are pre-charged by charging capacitor 2516 and then putting the bit line in communication with the charged capacitor so that the bit lines charges up (see t3 of FIG. 18). In step 706, the bit line is allowed to discharge, for example, by discharging the capacitor 2516 (see t5-t6 of FIG. 18). After a predetermined time period, referred to as the "integration time," the voltage of the capacitor 2516 (or the SEN node) is sampled as described above to see whether the respective memory cell(s) conducted in step 708. As described above, the verification process is performed simultaneously for thousands of memory cells connected to the same word line and different bit lines.

One issue with the process of FIG. 19 is that all bit lines are charged up, even if the respective memory cells connected to the bit lines are not being programmed (ie because they are to remain in the erased state). For example, in the embodiment of FIG. 8, approximately half of the memory cells connected to a selected word line could be remaining in the erased state E. Therefore, charging the bit lines for all of those memory cells remaining in the erased state E wastes power. To minimize any waste of power, some embodiments use the process of FIG. 20 to perform verification. In general, the process of FIG. 20 reduces the current (and, therefore, power) by not charging bit lines for memory cells not being programmed (e.g., remaining in the erased state or otherwise not being programmed during the current program pulse).

Figure 20:
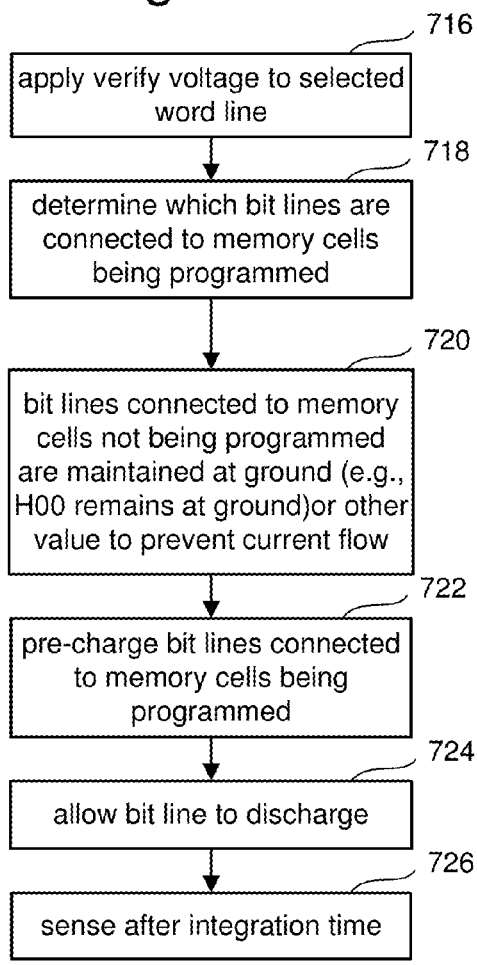
FIG. 20 is a flow chart describing one embodiment for performing verification of programming, with lockout function enabled.

In step 716 of FIG. 20, the appropriate verify compare voltage is applied to the selected word line. In step 718, the system determines which bit lines are connected to memory cells being programmed and which bit lines are connected to memory cells not being programmed. Since this verify process is part of the programming process, the system has the data being programmed and can easily see which memory cells are to be programmed and which are not. For example, the data can be stored in the data latches 494. In step 720, the bit lines connected to memory cells not being programmed (memory cells connected to the selected word line, but not intending to have their threshold voltage changed by the latest program pulse) will be maintained at ground so that no current flows. In other embodiments, the bit lines will be set at another voltage, such as the same level as CELSRC (the source line voltage), to ensure no potential difference between the bit line and source line, resulting in no current flow in the bit line. Other bit line voltages that prevent current flow can also be used. In one set of embodiments, the goal is to have Vbl (the bit line voltage) =VCELSRC such that no cell current flows. If VCELSRC=0V (positive sensing), then bit lines are grounded. In a negative sensing method, the bit lines are not grounded, they are simply charged up to the CELSRC level. In step 722, those bit lines connected to memory cells that are receiving programming will be pre-charged. In step 724, the bit lines will be allowed to discharge. Those bit lines connected to memory cells having threshold voltage lower than the verify voltage applied to the word line will discharge because the memory cells will conduct while bit lines connected to memory cells having threshold voltage higher than the verify voltage applied to the word line will not discharge because the memory cells will not conduct.) After a predetermined time period, referred to as the "integration time," the voltage of the capacitor 2516 (or the SEN node) is sampled as described above to see whether the respective memory cell(s) conducted in step 726. In one embodiment, the processes of FIGS. 19 and 20 can be performed using the sense amplifiers at the direction state machine 222 and/or controller 244.

Figure 21A:
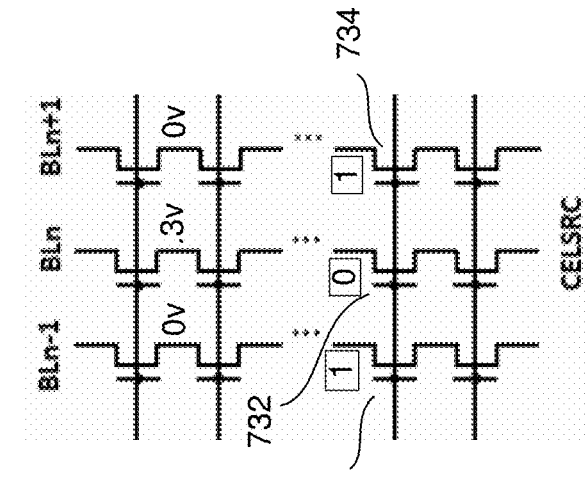
FIG. 21A shows three NAND strings during verification.
Figure 21B:
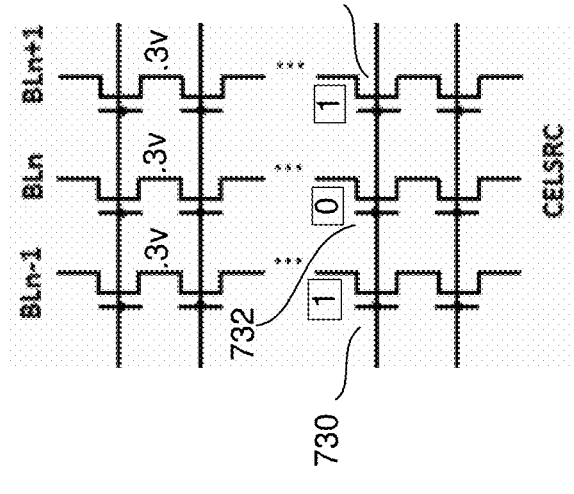
FIG. 21B shows three NAND strings during reading.

The process of FIG. 20 does save power because no charge is used for bit lines connected to memory cells not currently being programmed. For example, FIG. 21A shows three NAND strings during the verification process of FIG. 20. The three NAND strings are each connected to a bit line (i.e. bit lines BLn−1, BLn, BLn+1). Memory cell 732, to be storing one bit of data as a logical "0," is receiving programming while memory cells 730 and 734, to be storing one bit of data as a logical "1," will not be receiving programming and will remain in the erased state. Therefore, step 720 of FIG. 20 will keep the bit lines BLn−1 and BLn+1 (as well as the channels of the connected NAND strings) at ground (0 v). However, step 722 of FIG. 20 will cause bit line BLn as well as the channel of the connected NAND string) to charge to a pre-charge voltage (e.g., 0.3 v).

Figure 21C:
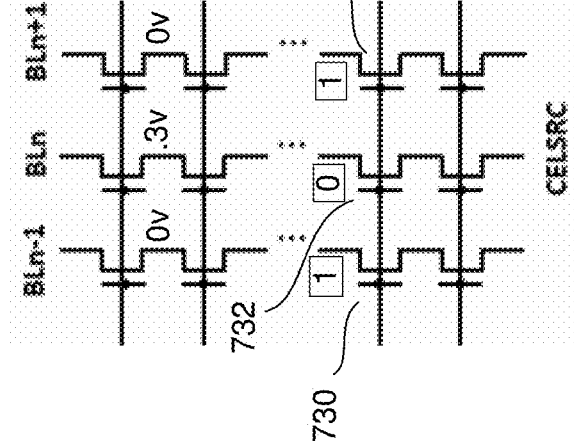
FIG. 21C shows three NAND strings during reading using a two strobe sensing operation.
Figure 21D:
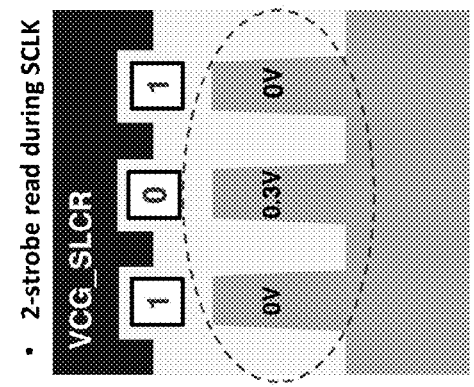
FIG. 21D shows three NAND strings during verification.
Figure 21E:
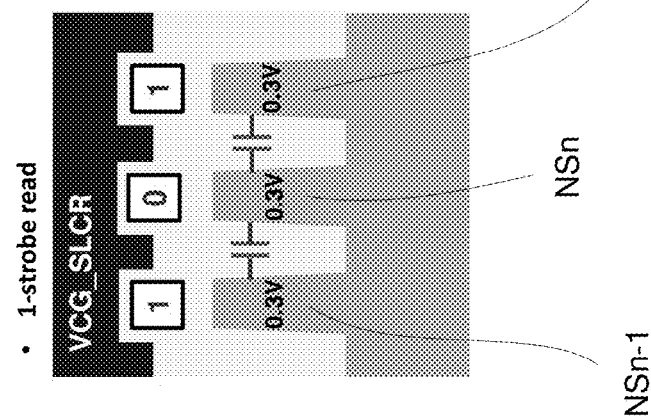
FIG. 21E shows three NAND strings during reading.
Figure 21F:
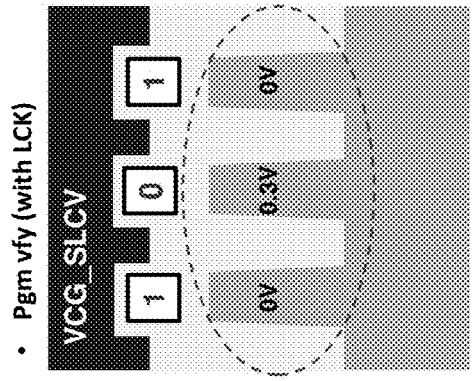
FIG. 21F shows three NAND strings during reading using a two strobe sensing operation.

FIGS. 21D, 21E and 21F show portions of three NAND strings. FIG. 21D shows the portions of the three NAND strings during a verification process. FIG. 21E shows the portions of the three NAND strings during a single strobe reading processes. FIG. 21F shows the portions of the three NAND strings during a two strobe reading processes. Conventional single strobe reading processes will charge all bit lines and read from all memory cells connected to a word line. Therefore, during a conventional reading process, the three NAND strings will be in the condition depicted in FIG. 21E, which shows all three NAND strings (NSn−1, NSn, NSn+1) pre-charged to 0.3 v. When a neighboring NAND string is charged, it will capacitvely couple to its neighbors, as depicted by the capacitors in FIG. 21E. Channel potential on the NAND strings NSn−1 & NSn+1 couple to the channel on the NAND string NSn, thus raising its potential and making the memory cells on Nand String NSn easier to turn ON. Therefore, during a reading process for memory cells on Nand String NSn, a capacitive coupling from the two neighboring NAND strings may cause the threshold voltage of the memory cell to appear lower than it really is. Since there will be no analogous capacitive coupling during verify (due to step 720 maintaining bit lines at ground or connected to CELSRC), the conditions at the time of reading do not match the conditions at the time of verification, which may lead to an error reading data.

It is proposed that during the reading process, the conditions should match that of the time of performing the verification of programming. That is, the conditions during reading should be as depicted in FIG. 21C and FIG. 21F, with the bit lines connected to memory cells in the erased state being at ground rather than being charged to 0.3 v volts.

Figure 22:
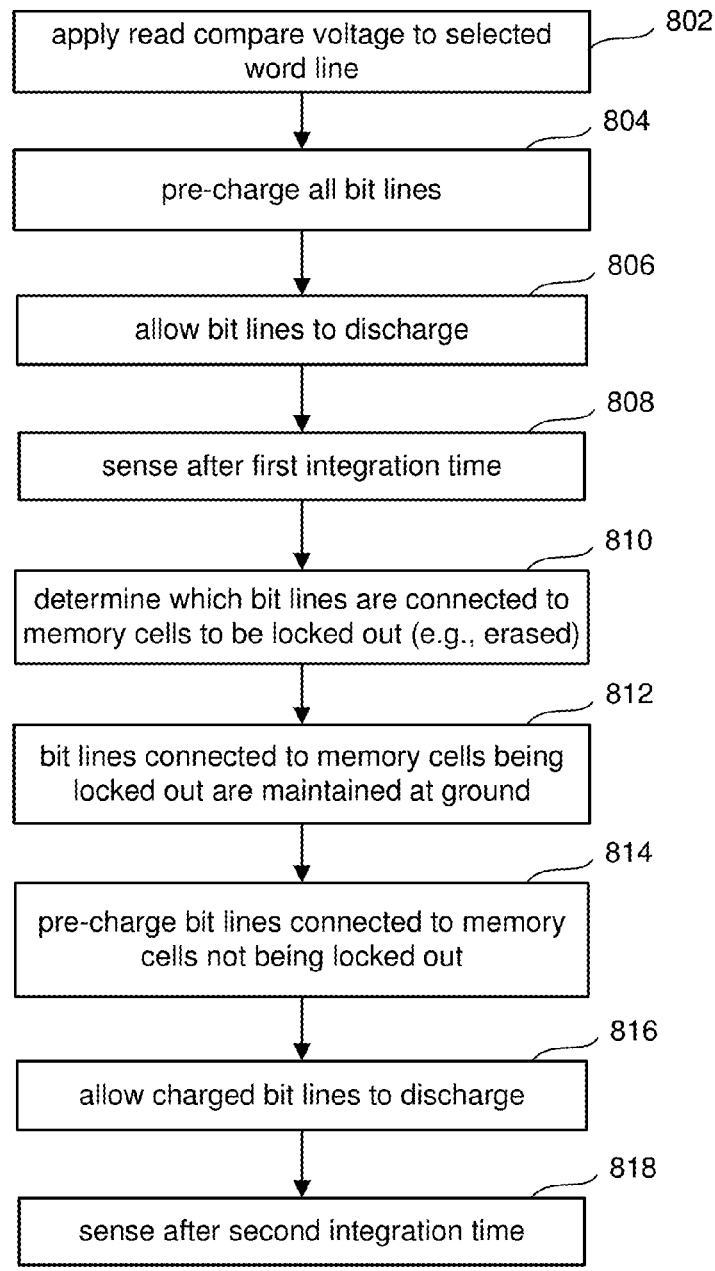
FIG. 22 is a flow chart describing one embodiment for performing a two strobe sensing operation for reading data.
Figure 22A:
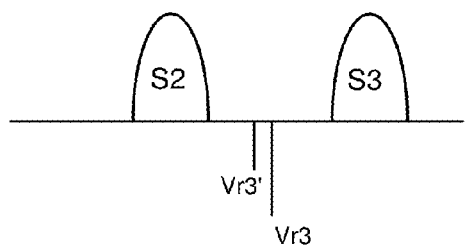
FIG. 22A shows two threshold voltage distributions, corresponding to two data states.

One example method for performing a reading operation that better matches the conditions of reading to the conditions of verification (using the process of FIG. 20 to save power) is depicted in FIG. 22. The reading operation of FIG. 22 uses two strobe sensing to better match the conditions during verification. In step 802 of FIG. 22, the appropriate read compare voltage (e.g., Vr, Vra, Vrb, Vrc, Vr1, Vr2, Vr3, Vr4, Vr5, Vr6, Vr7) is applied to the selected word line. In step 804, all bit lines connected to memory cells connected to the selected word line are pre-charged, as described above. In one embodiment, all bit lines for a selected block are pre-charged. In one example embodiment, the bit lines are pre-charged by charging capacitor 2516 and then putting the bit line in communication with the charged capacitor so that the bit lines charges up (see t3 of FIG. 18). In step 806, the bit lines are allowed to discharge, as explained above with respect to FIGS. 17 and 18. In step 808, the current through the selected memory cells is measured after a first integration time. In one embodiment, as described above with respect to FIGS. 17 and 18, the voltage at the SEN node (ie the voltage at capacitor 2516 of the sense amplifier) is measured to determine whether it is below or above a pre-determined reference) after the first integration time (a preset period of time). When describing the sensing operation above with respect to FIGS. 17 and 18, the integration time is set to accurately measure whether the threshold voltage of the memory cells are in the data state associated the read compare voltage (or higher data states). This integration time is referred to in FIG. 22 as the second integration time (see step 818, discussed below), The first integration time of step 808 is shorter than the second integration time of step 818 so that the testing in step 808 will test for slightly lower threshold voltages. For example, FIG. 22A shows data states S2 and S3. Using the second integration time discussed below with respect to step 818 tests to see whether memory cells have a threshold voltage greater than or less than Vr3. However, using the first integration time of step 808 tests to see whether memory cells have a threshold voltage greater than or less than Vr3', where Vr3'<Vr3. In one embodiment, steps 804-808 implement the behavior depicted in FIG. 18.

In step 810 of FIG. 22, the system determines which bit lines are connected to memory cells that should be locked out. In one embodiment, all of the memory cells that sensed to be on in step 808 (they conducted enough current so that the voltage at SEN was sufficiently dissipated after the first integration time), are locked out for the remainder of the operation of FIG. 22. For example, in a system that stores one bit of data in the memory cells, the read compare voltage applied in step 802 will be Vr (see FIG. 8) and step 810 will attempt to lock out memory cells in the erased state E. Those bit lines connected to memory cells that are determined to be locked out are maintained at ground (see step 812) for the remainder of the operation of FIG. 22 or they are set to another voltage (e.g., CELSRC) to prevent current from flowing in the bit line. In step 814, the bit lines connected to memory cells that are not locked out are pre-charged, as described above. In step 816, the bit lines that are charged are allowed to discharge, as explained above. In step 818, the current through the selected memory cells is measured after the second integration time. For example, as described above, the voltage at the SEN node (i.e. the voltage at capacitor 2516 of the sense amplifier) is measured to determine whether it is below or above a pre-determined reference) after the second integration time (a preset period of time). Those memory cells that did not turn on (their current was not high enough to cause the SEN node to sufficiently dissipate it voltage) are determined to have threshold voltage greater than the read compare voltage that was first applied in step 802 and maintained throughout the operation of FIG. 22. In the example of the system that stores one bit of data in the memory cells mentioned above, step 818 will identify those memory cells in the programmed state P. In one embodiment, steps 814-818 implement the behavior depicted in FIG. 18; therefore, the operation of FIG. 22 includes performing the actions of FIG. 18 twice while applying the same read compare voltage to the selected word line in order to simultaneously read data from multiple memory cells connected to the selected word line. In one embodiment, the operation of FIG. 22 is be performed using the sense amplifiers at the direction state machine 222 and/or controller 244.

Note that instead of using two different integration times for the first and second sense operation during the two strobe reading operation, in another embodiment, the integration time can be kept the same while the world line voltage used during the first sense operation is lowered as compared to the second sense operation. In either case, the purpose is to identify and lock out the highly conducting cells.

An advantage of the two strobe (see steps 808 and 818) reading operation of FIG. 22 is that, when used in conjunction with the verification process of FIG. 20, the conditions for almost all memory cell are the same during verify (see FIG. 21A) and they are during the sensing of steps 812-818 (see FIG. 21C). However, a disadvantage of the reading operation of FIG. 22 as compared to a convention reading operation that uses only a single strobe is that the two strobe operation of FIG. 22 takes more time to complete. One strategy to balance the accuracy of the two strobe reading operation versus the speed of the one strobe reading operation is to use the one strobe reading operation process for word lines that experience the largest apparent shift in threshold voltage due to the mismatch of conditions described above. In one set of example embodiments, memory cells closer to the bit line contact will experience the largest apparent shift in threshold voltage due to higher channel potential closer to the bit line contact, resulting in the mismatch of conditions described above; therefore, reading data from word lines closer to the bit line contact will use a two strobe reading operation and reading data from word lines further from the bit line contact will use a one strobe reading operation. This strategy is implemented in the process of FIG. 23.

Figure 23:
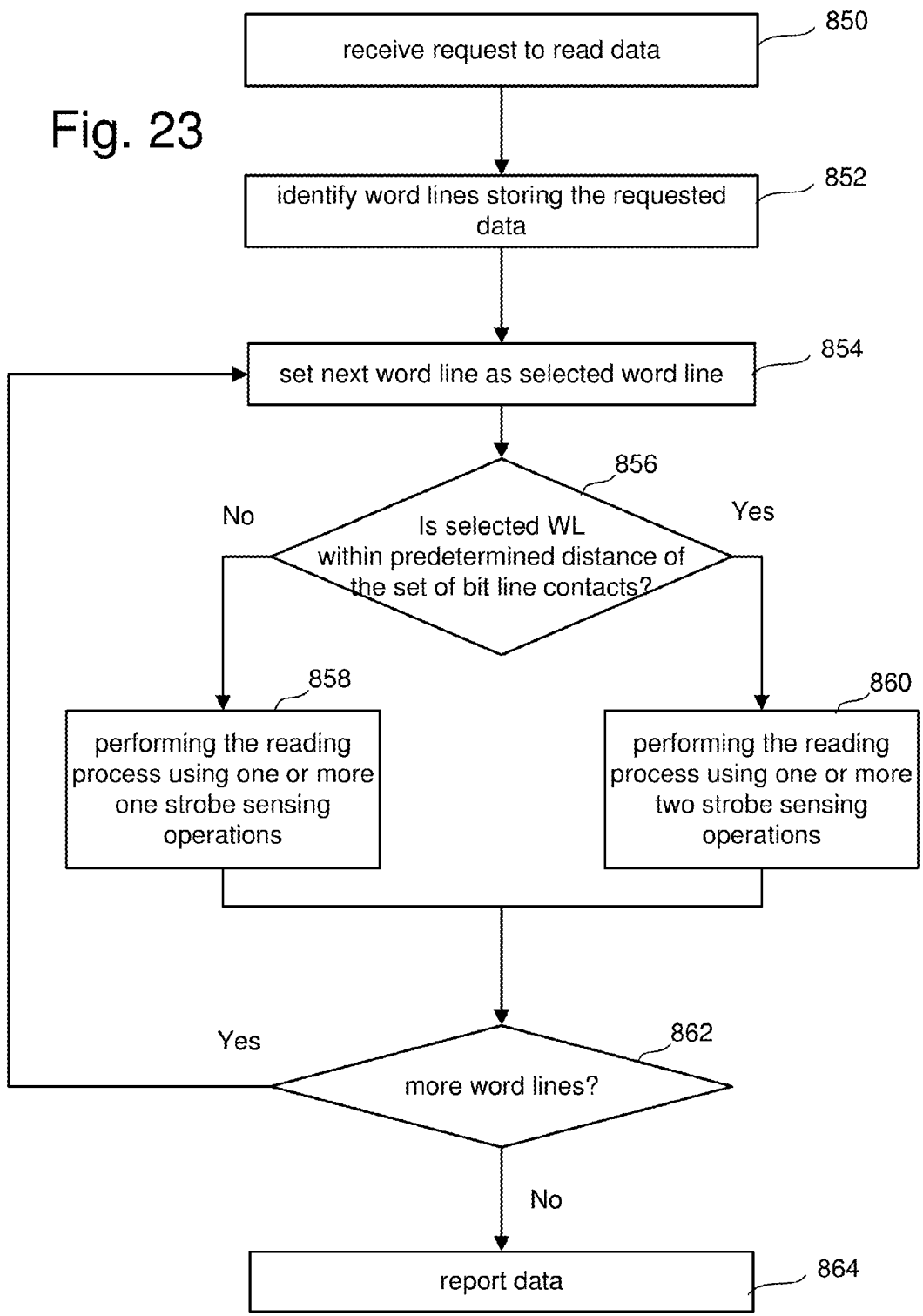
FIG. 23 is a flow chart describing one embodiment of a process for reading data.

FIG. 23 is a flow chart that described a process for reading data. In one example, the process of FIG. 23 is performed one or more times during step 526 of FIG. 6. In step 850 of FIG. 23, a request to read data is received (at the Controller, memory chip, or state machine). In step 852, the system will identify the one or more word lines storing the requested data. If the requested data is stored in memory cells connected to one word line, then that one word line is set as the selected word line in step 854. If the requested data is stored in memory cells connected to multiple word lines, then one of those word line is set as the selected word line in step 854. In step 856, it is determined whether the selected word line is within a predetermined distance of the set of bit line contacts. The bit line contacts are the start of the bit line that connected (contacts) the signal line(s) that connects the bit line to the sense amplifier. So, "distance of the set of bit line contacts" could also be thought of as distance to the start of the bit lines or distance to the sense amplifiers. In one embodiment, the system will keep track of the physical distance. In another embodiment, the block will be divided into zones, with one zone being closer to the bit line contacts (or sense amplifiers) and another block being further from the bit line contacts. In another embodiment, the first X word lines are considered within the predetermined distance. In an embodiment that numbers the word lines 0-X, with word line 0 (also referred to as WL0) closest to the source and furthest from the bit line contacts, then word lines WL0-WL(X/3) are not within the predetermined distance and word lines WL(X/3+1)-WLX are within the predetermined distance. In an example implementation with 128 word lines, word lines WL0-WL39 are not within the predetermined distance and word lines WL40-WL127 are within the predetermined distance. In other embodiments, the division between not within the predetermined distance and within the predetermined distance can be other than WL40 or WL(X/3+1), and can be determined based on simulations or testing of actual parts to determine which word lines will see a larger apparent shift in threshold voltage.

If it is determined that the current selected word lines is not within the predetermined distance, then the reading process is performed using one or more single strobe read operations in step 858. One example of a single strobe read operation that can be performed one or more times during step 858 is the process of FIG. 23A. In step 880 of FIG. 23A, the appropriate read compare voltage (e.g., Vr, Vra, Vrb, Vrc, Vr1, Vr2, Vr3, Vr4, Vr5, Vrb, Vr7) is applied to the selected word line. In step 882, all bit lines connected to memory cells connected to the selected word line are pre-charged, as described above. In one embodiment, all bit lines for a selected block are pre-charged. In one example embodiment, the bit lines are pre-charged by charging capacitor 2516 and then putting the bit line in communication with the charged capacitor so that the bit lines charges up (see t3 of FIG. 18). In step 884, the bit lines are allowed to discharge, as explained above with respect to FIGS. 17 and 18. In step 886, the current through the selected memory cells is measured after the second integration time. In one embodiment, as described above with respect to FIGS. 17 and 18, the voltage at the SEN node (ie the voltage at capacitor 2516 of the sense amplifier) is measured to determine whether it is below or above a pre-determined reference) after the first integration time (a preset period of time). In one embodiment, steps 880-886 implement the behavior depicted in FIG. 18.

If it is determined that the current selected word lines is within the predetermined distance, then the reading process is performed using one or more two strobe read operations in step 860. One example of a two strobe read operation that can be performed one or more times during step 860 is the process of FIG. 22.

After both step 858 and step 860, the process continues at step 862. If there are more word lines for which data needs to be read (step 862), then the process loops back to step 854 and the next word line is set to be the selected word line. If there are no more word lines for which data needs to be read (step 862), then instep 864 the data read is reported to the requester. In one embodiment, the process of FIG. 23 is be performed by the state machine 222 and/or controller 244.

FIGS. 24, 25, 26 and 27 describe embodiments of a non-volatile storage system that stores two bits of data per memory cell, perform verification according to the process of FIG. 20, and reads data using the process of FIG. 23. That is, during verification, bit lines connected to memory cells that are to remain in the erased state will not be pre-charged. Similarly, when reading memory cells on word lines that are within the predetermined distance from the bit line contacts, a two strobe sensing operation will be used so that the second strobe will sense data while bit lines connected to memory cells that are in the erased state are pre-charged. This way the conditions when reading will match the conditions when verifying (for the word lines that are within the predetermined distance from the bit line contacts).

In one set of embodiments, the two bits of data in each memory cell are stored in different pages, such as an upper page and a lower page (see, e.g., FIGS. 10 and 11C). FIG. 24A is a table that describes a process for verification. Each column represents a data state for a system that stores two bits of data. Each row pertains to a verify operation. A box is shaded to indicate pre-charging for bit lines connected to memory cells intended to be programmed to the respective data state when performing a verify operation for the respective verify compare voltage. A box is not shaded to indicate no pre-charging (ie grounding or connected to the source line to prevent current) for bit lines connected to memory cells intended to be programmed to the respective data state when performing a verify operation for the respective verify compare voltage. For example, when verifying using Vva applied to the selected word line, bit lines connected to memory cells intended for state E will not be pre-charged and bit lines connected to memory cells intended for states A, B and C will be pre-charged. FIG. 24B is a table that shows which bit lines are charged (shaded) and which are at ground (or connected to the source lime to prevent current)/uncharged (unshaded) when reading data for the lower page. FIG. 24C is a table that shows which bit lines are charged (shaded) and which are at ground (or connected to the source lime to prevent current)//uncharged (unshaded) when reading data for the upper page.

FIG. 24 is a flow chart describing one embodiment of a single strobe sensing operation for reading data stored in the lower page that can be performed as part of step 858 of FIG. 23. In step 902 of FIG. 24, Vrb is applied to the selected word line. In step 904, all bit lines connected to memory cells connected to the selected word line are pre-charged, as described above. In step 906, the bit lines are allowed to discharge, as explained above with respect to FIGS. 17 and 18. In step 908, the current through the selected memory cells is measured after the integration time. In one embodiment, the integration time used in step 908 is the second integration time described above. Memory cells that are determined to have turned on (because the conducted a sufficient amount of current) are determined to be storing logical "1" in the lower page (see FIGS. 10 and 11C) in step 910

FIG. 25 is a flow chart describing one embodiment of a two strobe sensing operation for reading data stored in the lower page that can be performed as part of step 860 of FIG. 23. In step 920 of FIG. 25, read compare voltage Vra is applied to the selected word line. In step 922, all bit lines connected to memory cells connected to the selected word line are pre-charged, as described above. In step 924, the bit lines are allowed to discharge, as explained above with respect to FIGS. 17 and 18. In step 926, the current through the selected memory cells is measured after the first integration time. Memory cells that are determined to have turn on (because the conducted a sufficient amount of current) are determined to be in the erased data state E (see FIGS. 9-11). Those memory cells in the erased state will be locked out from the second strobe. In step 930, the read compare voltage Vrb is applied to the selected word line. In step 932, the bit lines connected to memory cells not in the erased state are pre-charged as discussed above. Those bit lines connected to memory cells that are determined to be in the erased states (will be locked out) are maintained at ground (see step 934) for the remainder of the operation of FIG. 25, or connected to another voltage (e.g. CELSRC) to prevent current flowing on the bit line. In step 936, the bit lines that are pre-charged are allowed to discharge, as explained above. In step 940, the current through the selected memory cells is measured after the second integration time, as described above. Memory cells that are determined to have turned on (because the conducted a sufficient amount of current) are determined to be storing logical "1" in the lower page (see FIGS. 10 and 11C) in step 942. Note that when sensing in step 940 (the second strobe), bit lines connected to memory cells in the erased state will not be charged, which matches the condition during verification.

Figure 26:
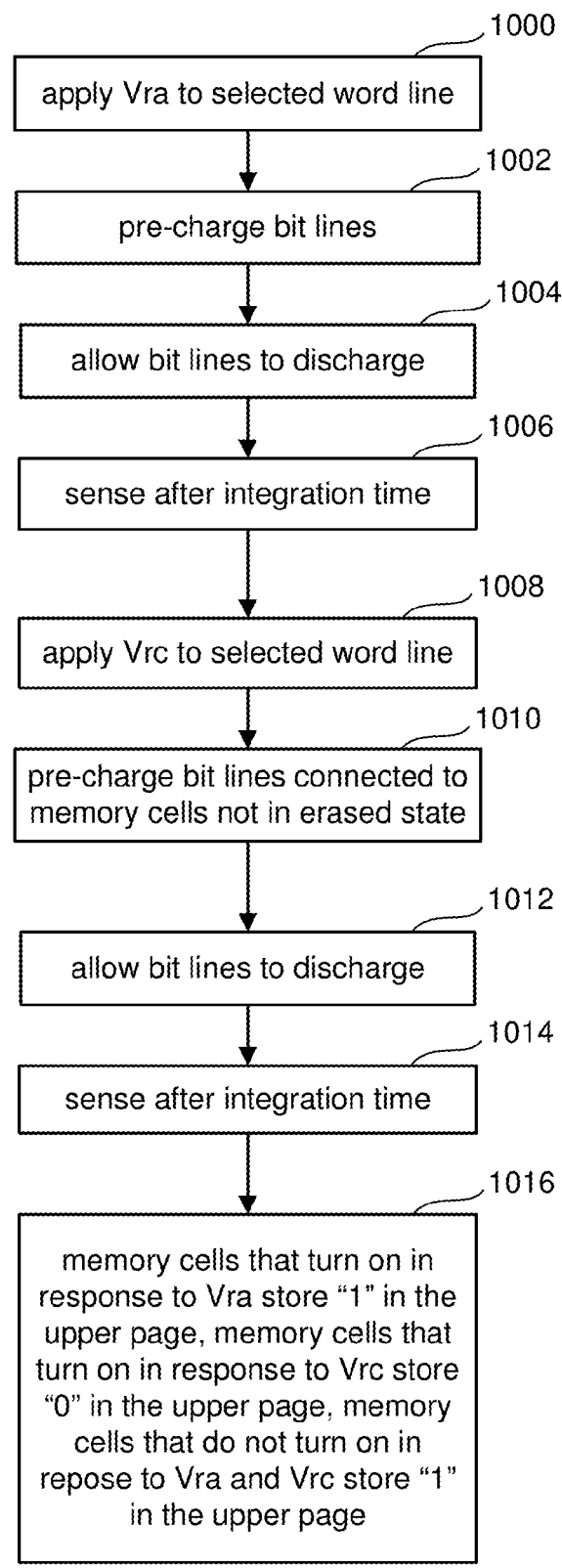
FIG. 26 is a flow chart describing one embodiment of a process for performing an upper page read with only one strobe sensing.

FIG. 26 is a flow chart describing one embodiment of a single strobe sensing operation for reading data stored in the upper page that can be performed as part of step 858 of FIG. 23. In step 1000 of FIG. 26, the read compare voltage Vra is applied to the selected word line. In step 1002, all bit lines connected to memory cells connected to the selected word line are pre-charged, as described above. In step 1004, the bit lines are allowed to discharge, as explained above with respect to FIGS. 17 and 18. In step 1006, the current through the selected memory cells is measured after the integration time. In one embodiment, the integration time used in step 1006 is the second integration time described above. The data latches 494 will store the results of the sensing. In step 1008, the read compare voltage Vrc is applied to the selected word line. In step 1010, all bit lines connected to memory cells connected to the selected word line are pre-charged, as described above. In step 1012, the bit lines are allowed to discharge, as explained above with respect to FIGS. 17 and 18. In step 1014, the current through the selected momory cells is measured after the integration time. In one embodiment, the integration time used in step 1006 is the second integration time described above. In step 1016, it is determined that memory cells that turn on in response to Vra store "1" in the upper page, memory cells that turn on in response to Vrc store "0" in the upper page, and memory cells that do not turn on in repose to Vra and Vrc store "1" in the upper page.

Figure 27:
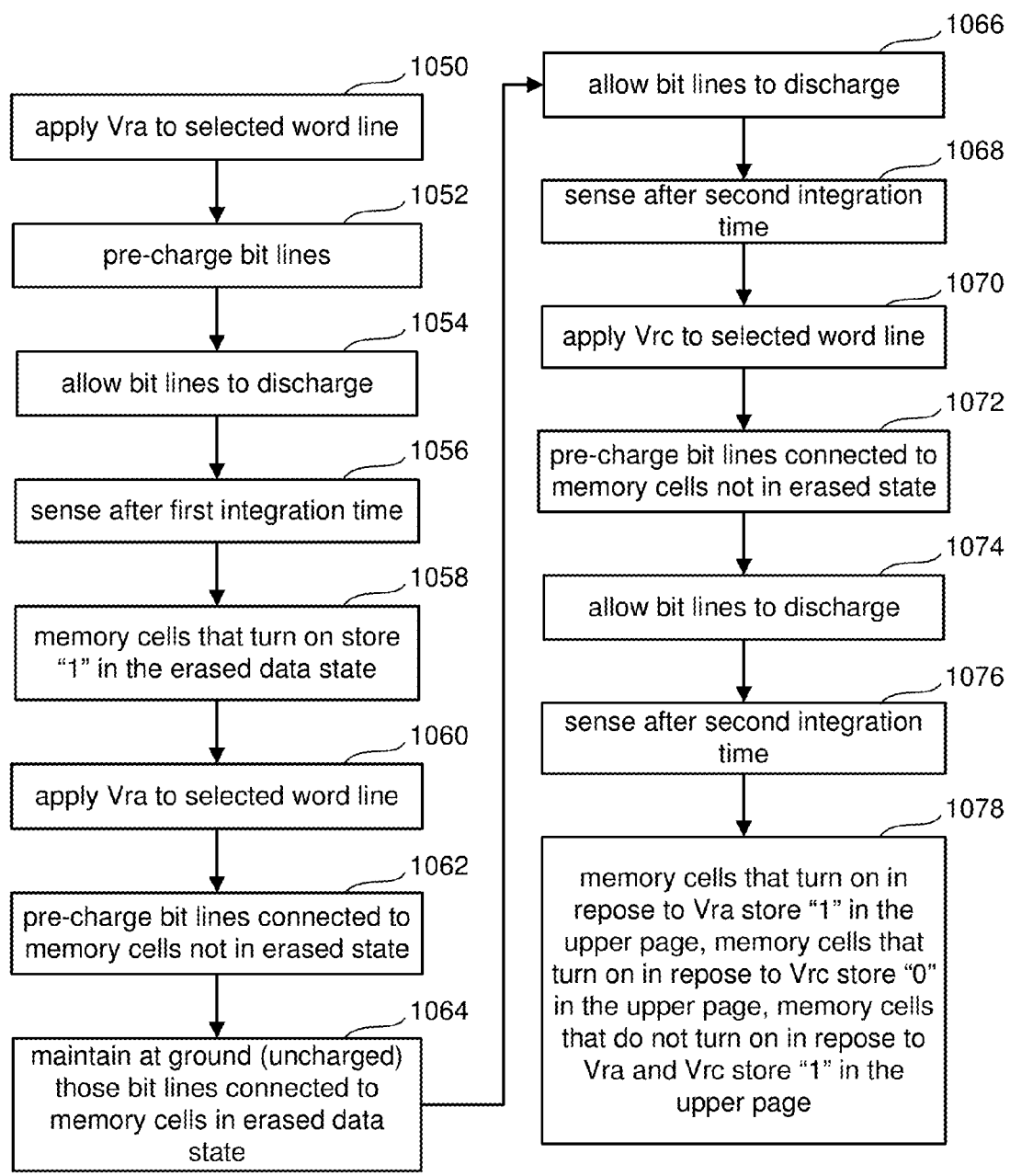
FIG. 27 is a flow chart describing one embodiment of a process for performing an upper page read with two strobe sensing.

FIG. 27 is a flow chart describing one embodiment of a two strobe sensing operation for reading data stored in the upper page that can be performed as part of step 860 of FIG. 23. In step 1050 of FIG. 27, read compare voltage Vra is applied to the selected word line. In step 1052, all bit lines connected to memory cells connected to the selected word line are pre-charged, as described above. In step 1054, the bit lines are allowed to discharge, as explained above with respect to FIGS. 17 and 18. In step 1056, the current through the selected memory cells is measured after the first integration time. Memory cells that are determined to have turn on (because the conducted a sufficient amount of current) are determined to be in the erased data state E (see FIGS. 9-11). Those memory cells in the erased state will be locked out from the second strobe. In step 1060, the read compare voltage Vra is continued to be applied to the selected word line. In step 1062, the bit lines connected to memory cells not in the erased state are pre-charged as discussed above. Those bit lines connected to memory cells that are determined to be in the erased states (will be locked out) are maintained at ground (see step 1064) for the remainder of the operation of FIG. 27, or connected to another voltage (e.g. CELSRC) to prevent current flowing on the bit line. In step 1066, the bit lines that are pre-charged are allowed to discharge, as explained above. In step 1068, the current through the selected memory cells is measured after the second integration time, as described above. In step 1070, the read compare voltage Vrc is applied to the selected word line. In step 1072, the bit lines connected to memory cells not in the erased state are pre-charged as discussed above. Those bit lines connected to memory cells that are determined to be in the erased states in step 1059 will continue to be locked out and maintained at ground. In step 1074, the bit lines that are pre-charged are allowed to discharge, as explained above. In step 1076, the current through the selected memory cells is measured after the second integration time, as described above. In step 1078, it is determined that memory cells that turn on in response to Vra store "1" in the upper page, memory cells that turn on in response to Vrc store "0" in the upper page, and memory cells that do not turn on in repose to Vra and Vrc store "1" in the upper page.

FIGS. 28-34 describe embodiments of a non-volatile storage system that stores three bits of data per memory cell, perform verification according to the process of FIG. 20 (or a modified version thereof), and reads data using the process of FIG. 23. This way the conditions when reading will match the conditions when verifying (for the word lines that are within the predetermined distance from the bit line contacts). In another set of embodiments, the processes of FIGS. 28-34 can be used for all word lines (thereby not using the process of FIG. 23).

Figure 20A:
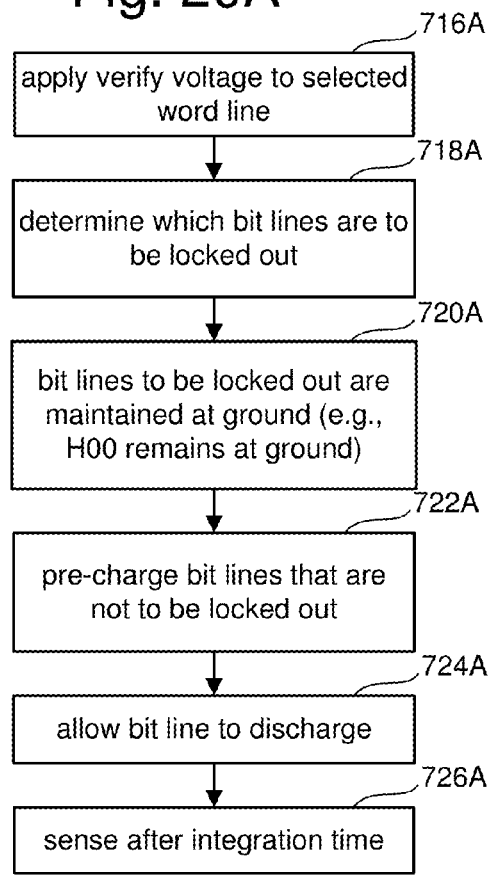
FIG. 20A is a flow chart describing one embodiment for performing verification of programming, with lockout function enabled.

FIG. 28 is a table that describes a process for verification. Each column represents a data state for a system that stores three bits of data. Each row pertains to a verify operation. A box is shaded to indicate pre-charging for bit lines connected to memory cells intended to be programmed to the respective data state when performing a verify operation for the respective verify compare voltage. A box is not shaded to indicate no pre-charging (ie grounding) for bit lines connected to memory cells intended to be programmed to the respective data state when performing a verify operation for the respective verify compare voltage. For example, when verifying using Vv3 applied to the selected word line, bit lines connected to memory cells intended for states S0, S1, S2 will not be pre-charged and bit lines connected to memory cells intended for states S3, S4, S5, S6, S7 will be pre-charged. Note that, in one embodiment, the bit lines connected to memory cells intended for states S3, S4, S5, S6, S7 will be pre-charged irrespective of whether those cells have reached their target levels or not. The information of FIG. 28 is used to modify the process of FIG. 20. FIG. 20A is a flow chart that is a modification of the process of FIG. 20 in order to implement the table of FIG. 28. In step 716A of FIG. 20A, the appropriate verify compare voltage is applied is applied to the selected word line. In step 718A, the system determines which bit lines are to be locked out based on the table of FIG. 28. In step 720A, the bit lines connected to memory cells being locked from the verify operation out will be maintained at ground or at CELSRC in order to prevent current from flowing in the bit lines. In step 722A, those bit lines connected to memory cells not being locked out from the verify operation will be pre-charged. In step 724A, the bit lines that are pre-charged will be allowed to discharge. Those bit lines connected to memory cells having threshold voltage lower than the verify voltage applied to the word line will discharge because the memory cells will conduct while those bit lines connected to memory cells having threshold voltage higher than the verify voltage applied to the word line will not discharge because the memory cells will not conduct. After the integration time (e.g., second integration time) the voltage of the capacitor 2516 (or the SEN node) is sampled as described above to see whether the respective memory cell(s) conducted in step 726A. In one embodiment, the process of FIG. 20A is performed using the sense amplifiers at the direction state machine 222 and/or controller 244.

FIG. 29 is a table that shows which bit lines are charged (shaded) and which are at ground/uncharged (unshaded) when reading data for the lower page. FIG. 30 is a table that shows which bit lines are charged (shaded) and which are at ground/uncharged (unshaded) when reading data for the middle page. FIG. 31 is a table that shows which bit lines are charged (shaded) and which are at ground/uncharged (unshaded) when reading data for the upper page. In general, when applying a read compare voltage, those memory cells in data states lower in voltage than the applied read compare voltage will have connected bit lines at ground (uncharged) and those memory cells in data states higher in voltage than the applied read compare voltage will have connected bit lines pre-charged.

In the embodiments of FIGS. 28-34, separately for multiple data states of the plurality of data states, the verifying of the programming for the respective data state comprises sensing whether non-volatile storage elements have reached the respective data state while bit lines connected to non-volatile storage elements intended to be programmed to a first set of data states are charged and bit lines connected to non-volatile storage elements intended to be programmed to a second set of data states are uncharged as compared to charged bit lines. The data states in the first set of data states and the data states in the second set of data states are pre-determined based on the respective data state for which verifying programming is being performed. By the term "uncharged" it is meant that the bit lines are at ground or receive a very small amount of charging as compared to the pre-charging.

In the embodiments of FIGS. 28-34, reading data includes, for at least the subset of the data states, separately executing a reading process that comprises performing a first sensing to identify at least a subset of non-volatile storage elements in the second set of data states and performing a second sensing that includes bit lines connected to non-volatile storage elements not sensed to be in the second set of the data states being charged and bit lines connected to non-volatile storage elements sensed to be in the second set of the data states being uncharged in comparison to bit lines that are charged.

Figure 32:
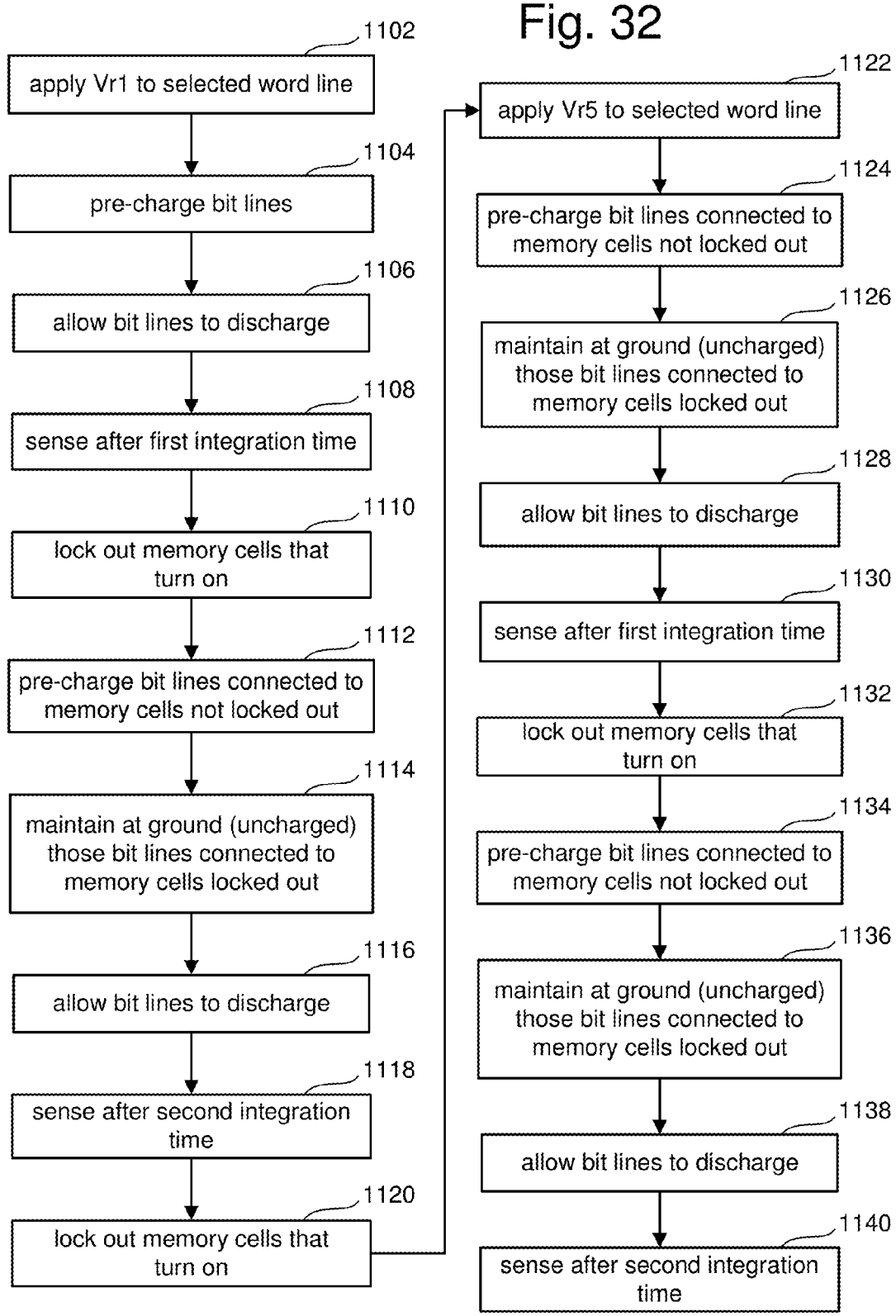
FIG. 32 is a flow chart describing one embodiment of a process for reading for a page of data.

FIG. 32 is a flow chart describing one embodiment of a two strobe sensing operation for reading data stored in the lower page that can be performed as part of step 860 of FIG. 23. In step 1102 of FIG. 32, read compare voltage Vr1 is applied to the selected word line. In step 1104, all bit lines connected to memory cells connected to the selected word line are pre-charged, as described above. In step 1106, the bit lines are allowed to discharge, as explained above with respect to FIGS. 17 and 18. In step 1108, the current through the selected memory cells is measured after the first integration time. Memory cells that are determined to have turned on (because the conducted a sufficient amount of current) are determined to be in data states lower than Vr1 (See FIGS. 12 and 15). Those memory cells in lower data states will be locked out from the second strobe. In step 1112, the bit lines connected to memory cells in data states above Vr1 (S2, S3, S4, S5, S6, S7) are pre-charged as discussed above. Those bit lines connected to memory cells that are determined to be in the data states lower than Vr1 will be locked out by maintaining the bit lines at ground (see step 1114) for the remainder of the operation of FIG. 32, or connected to another voltage (e.g. CELSRC) to prevent current flowing on the bit line. In step 1116, the bit lines that are pre-charged are allowed to discharge, as explained above. In step 1118, the current through the selected memory cells is measured after the second integration time, as described above. In step 1120, memory cells that were determined to have turned on in response to Vr1 in step 116 are locked out for the remainder of the operation of FIG. 32.

In step 1122 of FIG. 32, read compare voltage Vr5 is applied to the selected word line. In step 1124, bit lines connected to memory cells not locked out are pre-charged, as described above. In step 1126, bit lines connected to memory cells that are locked out remain uncharged (ie at ground), or connected to another voltage (e.g. CELSRC) to prevent current flowing on the bit line. In step 1128, the bit lines are allowed to discharge, as explained above with respect to FIGS. 17 and 18. In step 1130, the current through the selected memory cells is measured after the first integration time. Memory cells that are determined to have turn on (because the conducted a sufficient amount of current) are determined to be in data states lower than Vr5 (S0, S1, S2, S3, S4). Those memory cells in lower data states will be locked out from the second strobe. In step 1132, the bit lines connected to memory cells in data states above Vr5 (S5, S6, S7) are pre-charged in step 1134, as discussed above. Those bit lines connected to memory cells that are determined to be in the data states lower than Vr5 will be locked out in step 1136 by maintaining the bit lines at ground for the remainder of the operation of FIG. 32, or connected to another voltage (e.g. CELSRC) to prevent current flowing on the bit line. In step 1138, the bit lines that are pre-charged are allowed to discharge, as explained above. In step 1140, the current through the selected memory cells is measured after the second integration time, as described above. Memory cells that turn on in response to Vr1 or do not turn on in response to Vr5 store a logical "1" in the lower page. Memory cells that do not turn on in response to Vr1 and do turn on in response to Vr5 store a logical "1" in the lower page.

A one strobe sensing operation for reading data stored in the lower page that can be performed as part of step 858 of FIG. 23 includes performing steps 1102-1108 and 1122-1130 of FIG. 32, except using the second integration time in steps 1108 and 1130.

Figure 33:
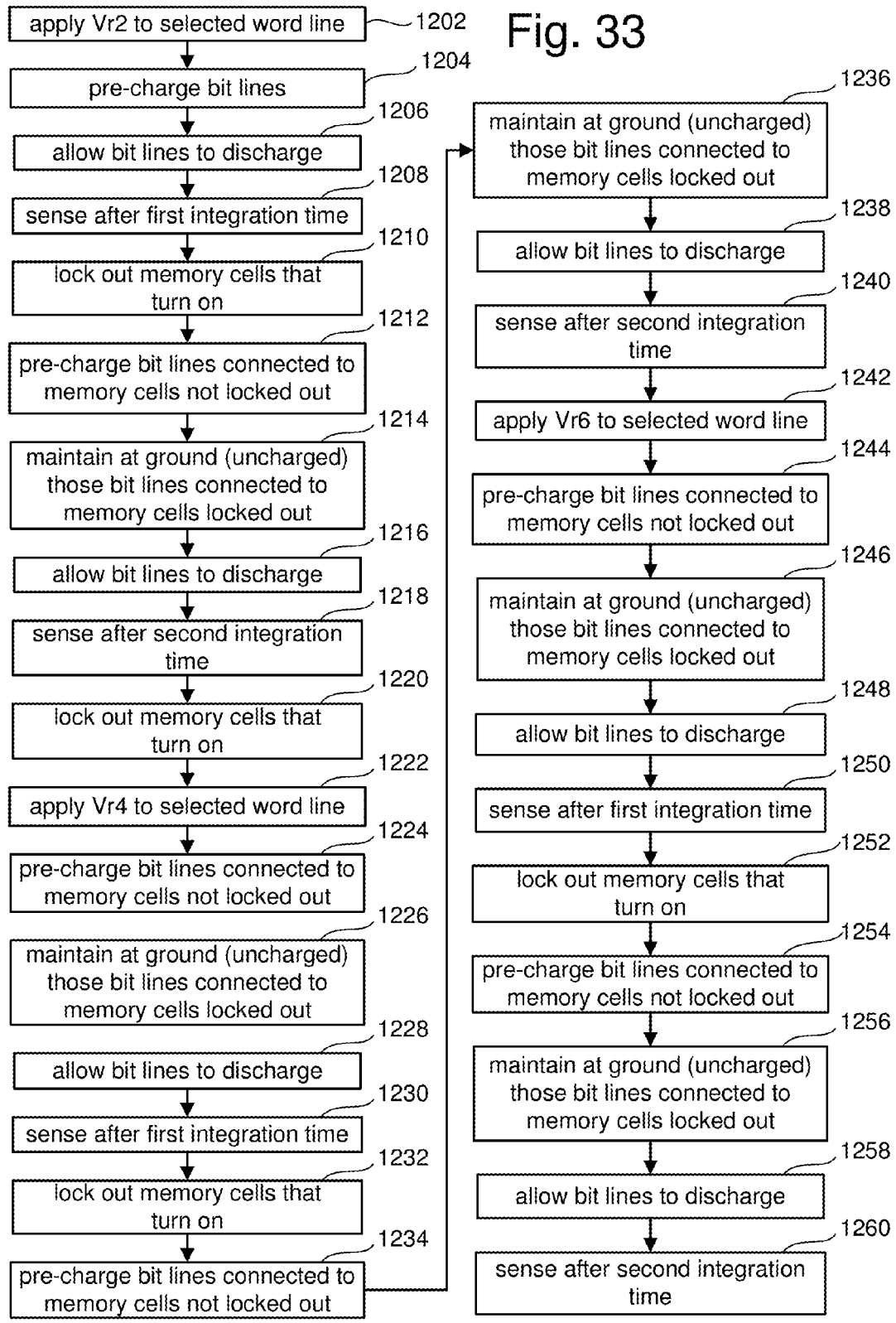
FIG. 33 is a flow chart describing one embodiment of a process for reading for a page of data.

FIG. 33 is a flow chart describing one embodiment of a two strobe sensing operation for reading data stored in the middle page that can be performed as part of step 860 of FIG. 23. In step 1202 of FIG. 32, read compare voltage Vr2 is applied to the selected word line. In step 1204, all bit lines connected to memory cells connected to the selected word line are pre-charged, as described above. In step 1206, the bit lines are allowed to discharge, as explained above with respect to FIGS. 17 and 18. In step 1208, the current through the selected memory cells is measured after the first integration time. Memory cells that are determined to have turned on (because the conducted a sufficient amount of current) are determined to be in data states lower than Vr2. Those memory cells in lower data states will be locked out for the remainder of the process of FIG. 33, in step 1210. In step 1212, the bit lines connected to memory cells in data states above Vr2 (Vr2, Vr3, Vr4, Vr5, Vr6, Vr7) are pre-charged as discussed above. In step 1214, those bit lines connected to memory cells that are determined to be in the data states lower than Vr2 will be locked out by maintaining the bit lines at ground for the remainder of the operation of FIG. 33, or connected to another voltage (e.g. CELSRC) to prevent current flowing on the bit line. In step 1216, the bit lines that are pre-charged are allowed to discharge, as explained above. In step 1218, the current through the selected memory cells is measured after the second integration time, as described above. In step 1220, memory cells that were determined to have turned on in response to Vr2 are locked out for the remainder of the operation of FIG. 33.

In step 1222 of FIG. 32, read compare voltage Vr4 is applied to the selected word line. In step 1224, bit lines connected to memory cells not locked out are pre-charged, as described above. In step 1226, bit lines connected to memory cells that are locked out remain uncharged (ie at ground), or connected to another voltage (e.g. CELSRC) to prevent current flowing on the bit line. In step 1228, the bit lines are allowed to discharge, as explained above with respect to FIGS. 17 and 18. In step 1230, the current through the selected memory cells is measured after the first integration time. Memory cells that are determined to have turned on (because the conducted a sufficient amount of current) are determined to be in data states lower than Vr4 (S0, S1, S2, S3). Tin step 1232, those memory cells in lower data states will be locked out from the second strobe and the remainder of the process of FIG. 33. In step 1234, the bit lines connected to memory cells in data states above Vr4 (S4, S5, S6, S7) are pre-charged, as discussed above. Those bit lines connected to memory cells that are determined to be in the data states lower than Vr5 will be locked out in step 1236 by maintaining the bit lines at ground for the remainder of the operation of FIG. 33, or connected to another voltage (e.g. CELSRC) to prevent current flowing on the bit line. In step 1238, the bit lines that are pre-charged are allowed to discharge, as explained above. In step 1240, the current through the selected memory cells is measured after the second integration time, as described above.

In step 1242 of FIG. 33, read compare voltage Vr6 is applied to the selected word line. In step 1244, bit lines connected to memory cells not locked out are pre-charged, as described above. In step 1246, bit lines connected to memory cells that are locked out remain uncharged (ie at ground), or connected to another voltage (e.g. CELSRC) to prevent current flowing on the bit line. In step 1248, the bit lines are allowed to discharge, as explained above with respect to FIGS. 17 and 18. In step 1250, the current through the selected memory cells is measured after the first integration time. Memory cells that are determined to have turn on (because the conducted a sufficient amount of current) are determined to be in data states lower than Vr6 (S0, S1, S2, S3, S4,S5). In step 1252, those memory cells in lower data states will be locked out from the second strobe. In step 1254, the bit lines connected to memory cells in data states above Vr6 (Vr6, Vr7), as discussed above. Those bit lines connected to memory cells that are determined to be in the data states lower than Vr6 will be locked out in step 1256 by maintaining the bit lines at ground for the remainder of the operation of FIG. 33, or connected to another voltage (e.g. CELSRC) to prevent current flowing on the bit line. In step 1258, the bit lines that are pre-charged are allowed to discharge, as explained above. In step 1260, the current through the selected memory cells is measured after the second integration time, as described above. Memory cells that turn on in response to Vr2 store a logical "1" in the middle page. Memory cells that do not turn on in response to Vr2 but do turn on in response to Vr4 store a logical "0" in the middle page. Memory cells that do not turn on in response to Vr4 but do turn on in response to Vr6 store a logical "1" in the middle page. Memory cells that do not turn on in response to Vr6 store a logical "0" in the middle page.

A one strobe sensing operation for reading data stored in the middle page that can be performed as part of step 858 of FIG. 23 includes performing steps 1202-1210, 1222-1230 and 1242-1250 of FIG. 33, except using the second integration time in steps 1208, 1230 and 1250.

Figure 34:
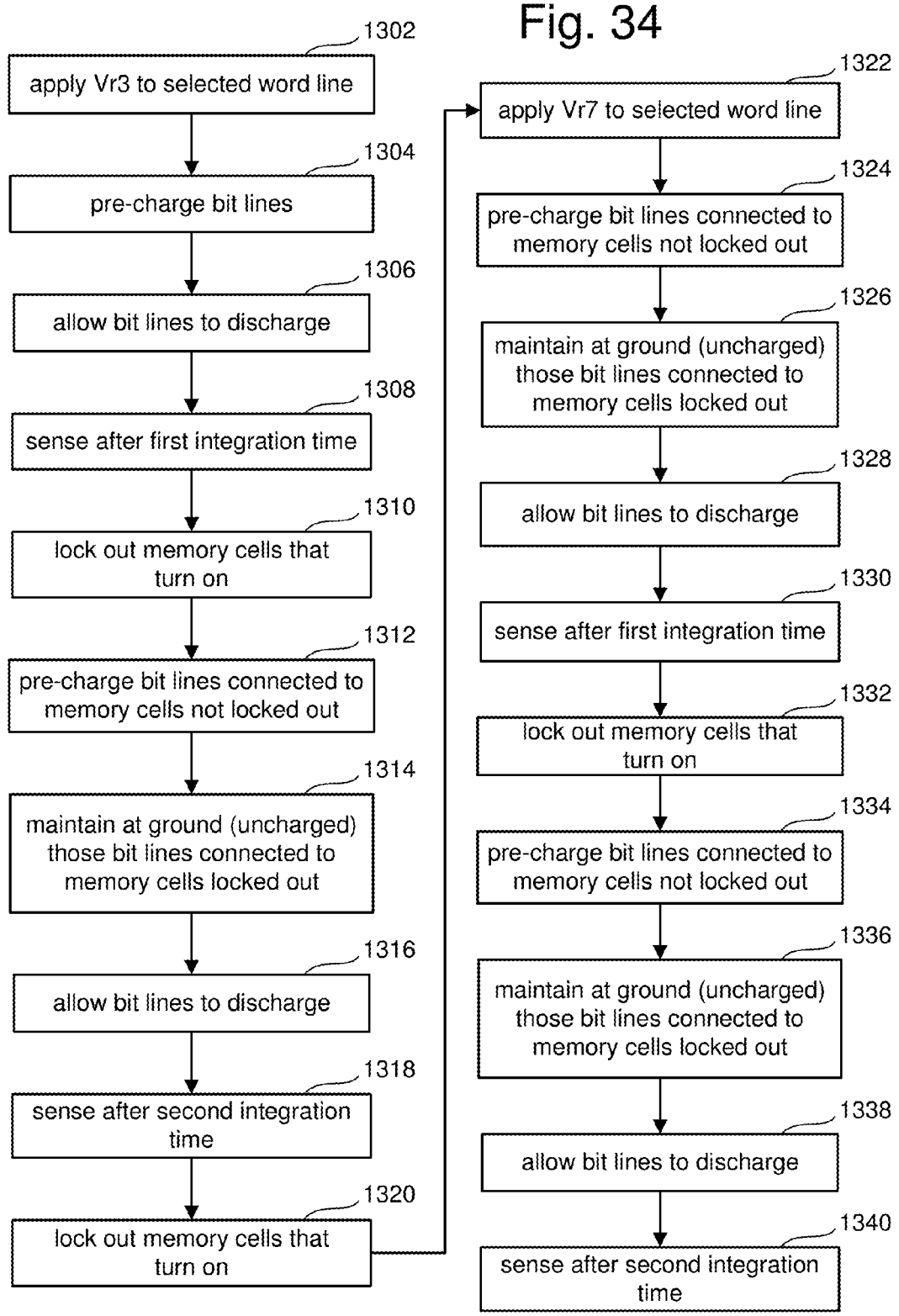
FIG. 34 is a flow chart describing one embodiment of a process for reading for a page of data.

FIG. 34 is a flow chart describing one embodiment of a two strobe sensing operation for reading data stored in the upper page that can be performed as part of step 860 of FIG. 23. In step 1302 of FIG. 34, read compare voltage Vr3 is applied to the selected word line. In step 1304, all bit lines connected to memory cells connected to the selected word line are pre-charged, as described above. In step 1306, the bit lines are allowed to discharge, as explained above with respect to FIGS. 17 and 18. In step 1308, the current through the selected memory cells is measured after the first integration time. Memory cells that are determined to have turned on (because the conducted a sufficient amount of current) are determined to be in data states lower than Vr3. In step 1310, those memory cells in lower data states will be locked out from the second strobe. In step 1312, the bit lines connected to memory cells in data states above Vr3 (S3, S4, S5, S6, S7) are pre-charged as discussed above. In step 1314, those bit lines connected to memory cells that are determined to be in the data states lower than Vr3 will be locked out by maintaining the bit lines at ground for the remainder of the operation of FIG. 34, or connected to another voltage (e.g. CELSRC) to prevent current flowing on the bit line. In step 1316, the bit lines that are pre-charged are allowed to discharge, as explained above. In step 1318, the current through the selected memory cells is measured after the second integration time, as described above. In step 1320, memory cells that were determined to have turned on in response to Vr3 in step 136 are locked out for the remainder of the operation of FIG. 34.

In step 1322 of FIG. 32, read compare voltage Vr7 is applied to the selected word line. In step 1324, bit lines connected to memory cells not locked out are pre-charged, as described above. In step 1326, bit lines connected to memory cells that are locked out remain uncharged (ie at ground), or connected to another voltage (e.g. CELSRC) to prevent current flowing on the bit line. In step 1328, the bit lines are allowed to discharge, as explained above with respect to FIGS. 17 and 18. In step 1330, the current through the selected memory cells is measured after the first integration time. Memory cells that are determined to have turned on (because the conducted a sufficient amount of current) are determined to be in data states lower than Vr7. Those memory cells in lower data states will be locked out from the second strobe in step 1332. The bit lines connected to memory cells in the data stats above Vr7 are pre-charged in step 1334, as discussed above. Those bit lines connected to memory cells that are determined to be in the data states lower than Vr5 will be locked out in step 1336 by maintaining the bit lines at ground for the remainder of the operation of FIG. 34, or connected to another voltage (e.g. CELSRC) to prevent current flowing on the bit line. In step 1338, the bit lines that are pre-charged are allowed to discharge, as explained above. In step 1340, the current through the selected memory cells is measured after the second integration time, as described above. Memory cells that turn on in response to Vr3 store a logical "1" in the upper page. Memory cells that do not turn on in response to Vr3 and do turn on in response to Vr7 store a logical "0" in the upper page. Memory cells that do not turn on in response to Vr7 store logical "1" in the upper page.

A one strobe sensing operation for reading data stored in the upper page that can be performed as part of step 858 of FIG. 23 includes performing steps 1302-1308 and 1322-1330 of FIG. 34, except using the second integration time in steps 1308 and 1330.

FIGS. 35-41 describe embodiments of a non-volatile storage system that stores three bits of data per memory cell, perform verification according to the process of FIG. 20A, and reads data using the process of FIG. 23. This way the conditions when reading will match the conditions when verifying (for the word lines that are within the predetermined distance from the bit line contacts). In another set of embodiments, the processes of FIGS. 35-41 can be used for all word lines (thereby not using the process of FIG. 23).

FIG. 35 is a table that describes a process for verification, and is in the same format as the table of FIG. 28. Each column represents a data state for a system that stores three bits of data. Each row pertains to a verify operation. A box is shaded to indicate pre-charging for bit lines connected to memory cells intended to be programmed to the respective data state when performing a verify operation for the respective verify compare voltage. A box is not shaded to indicate no pre-charging (ie grounding) for bit lines connected to memory cells intended to be programmed to the respective data state when performing a verify operation for the respective verify compare voltage. The information of FIG. 35 is used to configure the process of FIG. 20A.

FIG. 36 is a table that shows which bit lines are charged (shaded) and which are at ground/uncharged (unshaded) when reading data for the lower page. FIG. 37 is a table that shows which bit lines are charged (shaded) and which are at ground/uncharged (unshaded) when reading data for the middle page. FIG. 38 is a table that shows which bit lines are charged (shaded) and which are at ground/uncharged (unshaded) when reading data for the upper page.

Figure 39:
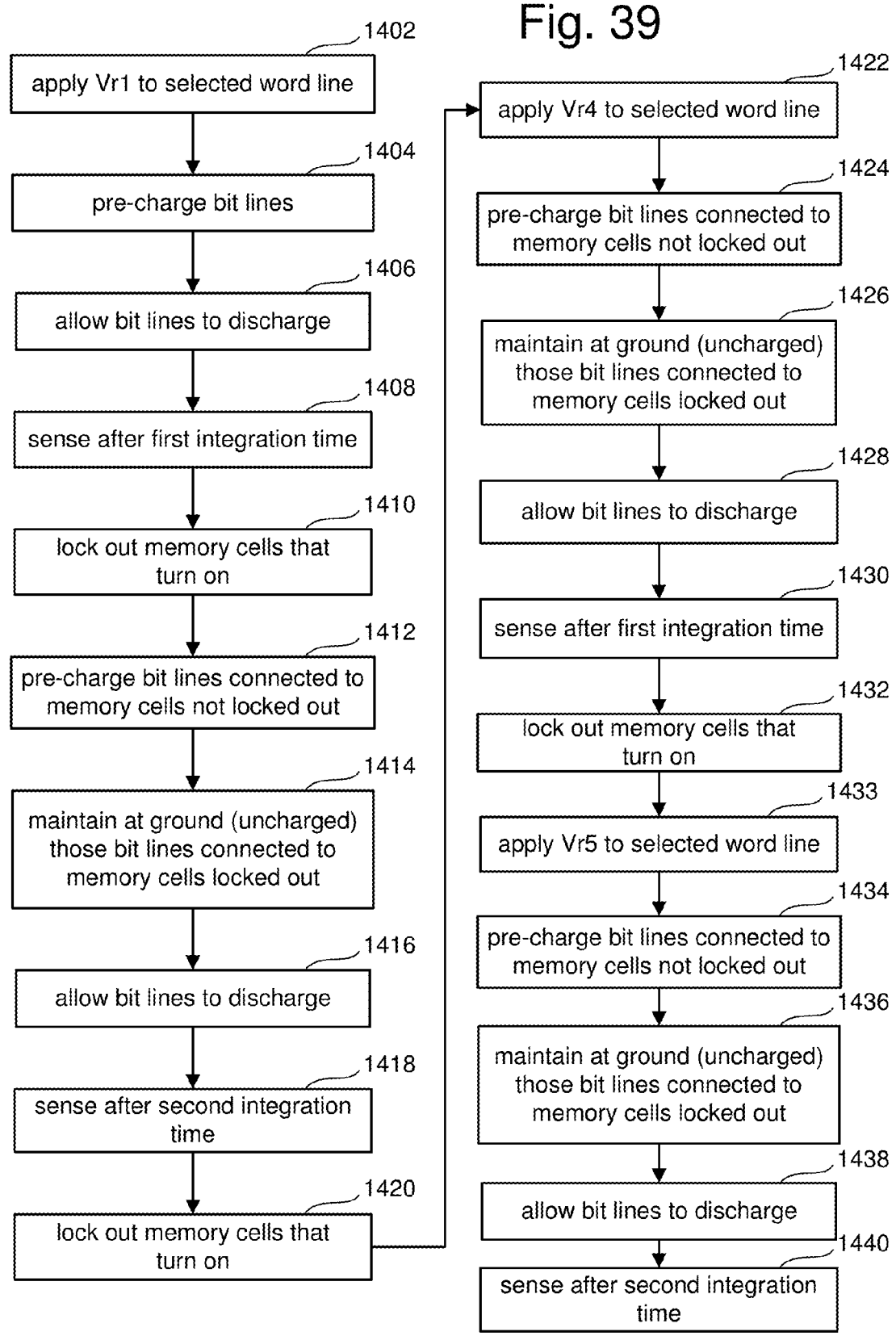
FIG. 39 is a flow chart describing one embodiment of a process for reading for a page of data.

FIG. 39 is a flow chart describing one embodiment of a two strobe sensing operation for reading data stored in the lower page that can be performed as part of step 860 of FIG. 23. In step 1402 of FIG. 39, read compare voltage Vr1 is applied to the selected word line. In step 1404, all bit lines connected to memory cells connected to the selected word line are pre-charged, as described above. In step 1406, the bit lines are allowed to discharge, as explained above with respect to FIGS. 17 and 18. In step 1408, the current through the selected memory cells is measured after the first integration time. Memory cells that are determined to have turned on will be locked out for the remainder of FIG. 39. In step 1412, the bit lines connected to memory cells not locked out are pre-charged as discussed above. Those bit lines connected to memory cells locked out will be maintained at ground (see step 1414), or connected to another voltage (e.g. CELSRC) to prevent current flowing on the bit line. In step 1416, the bit lines that are pre-charged are allowed to discharge, as explained above. In step 1418, the current through the selected memory cells is measured after the second integration time, as described above. In step 1420, memory cells that were determined to have turned on in response to Vr1 in step 146 are locked out for the remainder of the operation of FIG. 39.

In step 1422 of FIG. 39, read compare voltage Vr4 is applied to the selected word line. In step 1424, bit lines connected to memory cells not locked out are pre-charged, as described above. In step 1426, bit lines connected to memory cells that are locked out remain uncharged (ie at ground), or connected to another voltage (e.g. CELSRC) to prevent current flowing on the bit line. In step 1428, the bit lines are allowed to discharge, as explained above with respect to FIGS. 17 and 18. In step 1430, the current through the selected memory cells is measured after the first integration time. Alternatively, the second integration time can be used. In step 1432, those memory cells that turned on will be locked out for the remainder of the process of FIG. 39. In step 1433, Vr5 is applied to the selected word line. In step 1434, the bit lines connected to memory cells not already locked out are pre-charged, as discussed above. Those bit lines connected to memory cells that are determined to be locked are maintained at ground, or connected to another voltage (e.g. CELSRC) to prevent current flowing on the bit line. In step 1438, the bit lines that are pre-charged are allowed to discharge, as explained above. In step 1440, the current through the selected memory cells is measured after the second integration time, as described above.

Figure 40:
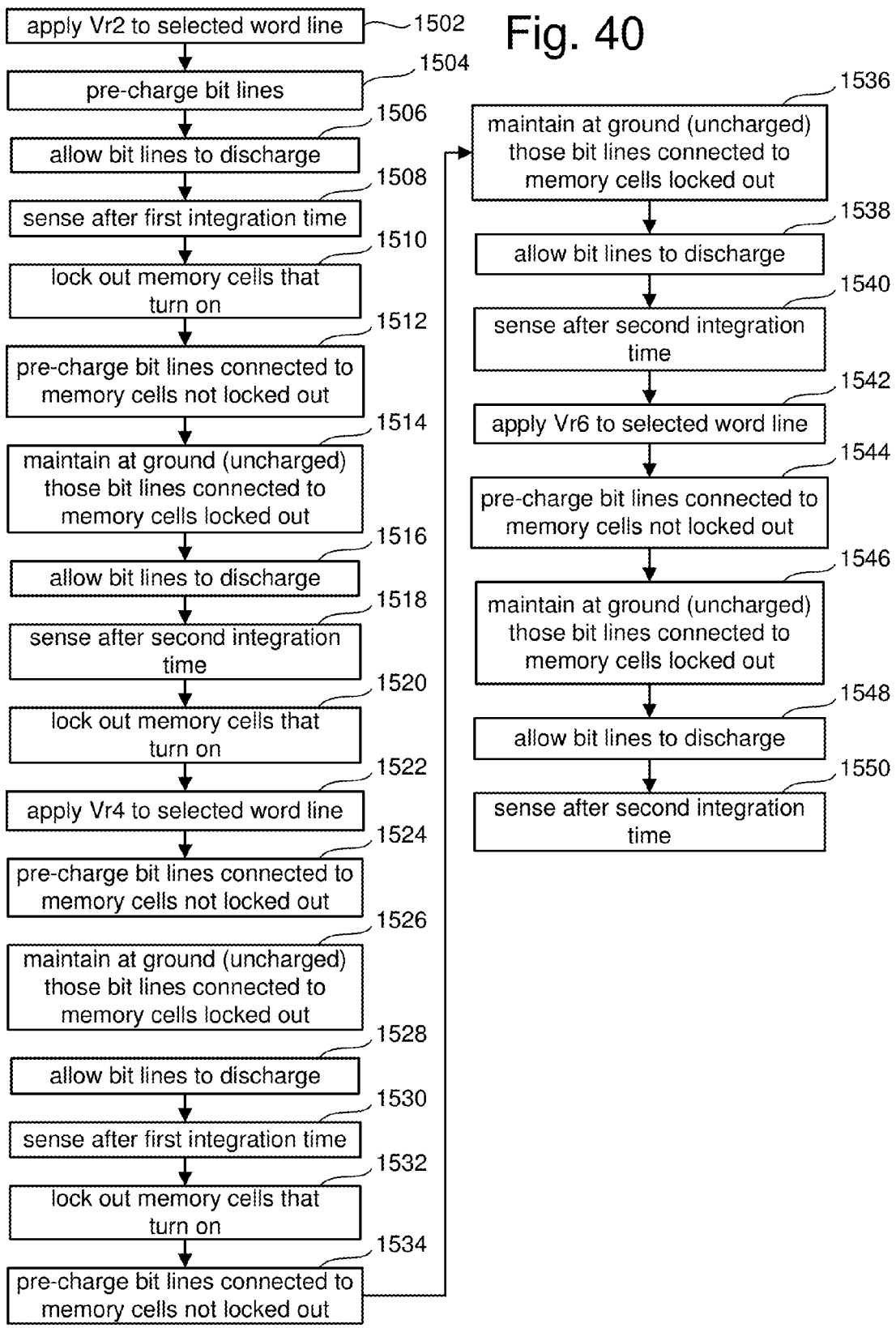
FIG. 40 is a flow chart describing one embodiment of a process for reading for a page of data.

FIG. 40 is a flow chart describing one embodiment of a two strobe sensing operation for reading data stored in the middle page that can be performed as part of step 860 of FIG. 23. In step 1502 of FIG. 40, read compare voltage Vr2 is applied to the selected word line. In step 1504, all bit lines connected to memory cells connected to the selected word line are pre-charged, as described above. In step 1506, the bit lines are allowed to discharge, as explained above with respect to FIGS. 17 and 18. In step 1508, the current through the selected memory cells is measured after the first integration time. In step 1510, memory cells that are determined to have turned on (because the conducted a sufficient amount of current) will be locked out for the remainder of the process of FIG. 40. In step 1512, the bit lines connected to memory cells that are not locked out are pre-charged as discussed above. In step 1514, those bit lines connected to memory cells that are determined to be locked out are maintained at ground, or connected to another voltage (e.g. CELSRC) to prevent current flowing on the bit line. In step 1516, the bit lines that are pre-charged are allowed to discharge, as explained above. In step 1518, the current through the selected memory cells is measured after the second integration time, as described above. In step 1520, memory cells that were determined to have turned on in response to Vr2 are locked out for the remainder of the operation of FIG. 40. Once a memory cell is locked out for the read operation, it remains locked out until the end of the read operation. Therefore, if a memory cell is locked out any time during the process of FIG. 40, it remains locked out until the process of FIG. 40 is completed. This applies to the other two strobe sensing operations described herein.

In step 1522 of FIG. 32, read compare voltage Vr4 is applied to the selected word line. In step 1524, bit lines connected to memory cells not locked out are pre-charged, as described above. In step 1526, bit lines connected to memory cells that are locked out remain uncharged (ie at ground), or connected to another voltage (e.g. CELSRC) to prevent current flowing on the bit line. In step 1528, the bit lines are allowed to discharge, as explained above with respect to FIGS. 17 and 18. In step 1530, the current through the selected memory cells is measured after the first integration time. Memory cells that are determined to have turned on are locked out (step 1532) for the remainder of the process of FIG. 40. In step 1534, the bit lines connected to memory cells not locked out are pre-charged, as discussed above. Those bit lines connected to memory cells that are determined to be locked will be maintained at ground, or connected to another voltage (e.g. CELSRC) to prevent current flowing on the bit line. In step 1538, the bit lines that are pre-charged are allowed to discharge, as explained above. In step 1540, the current through the selected memory cells is measured after the second integration time, as described above. In step 1542 of FIG. 40, read compare voltage Vr6 is applied to the selected word line. In step 1544, bit lines connected to memory cells not locked out are pre-charged, as described above. In step 1546, bit lines connected to memory cells that are locked out remain uncharged (ie at ground). In step 1548, the bit lines are allowed to discharge, as explained above with respect to FIGS. 17 and 18. In step 1550, the current through the selected memory cells is measured after the second integration time.

Figure 41:
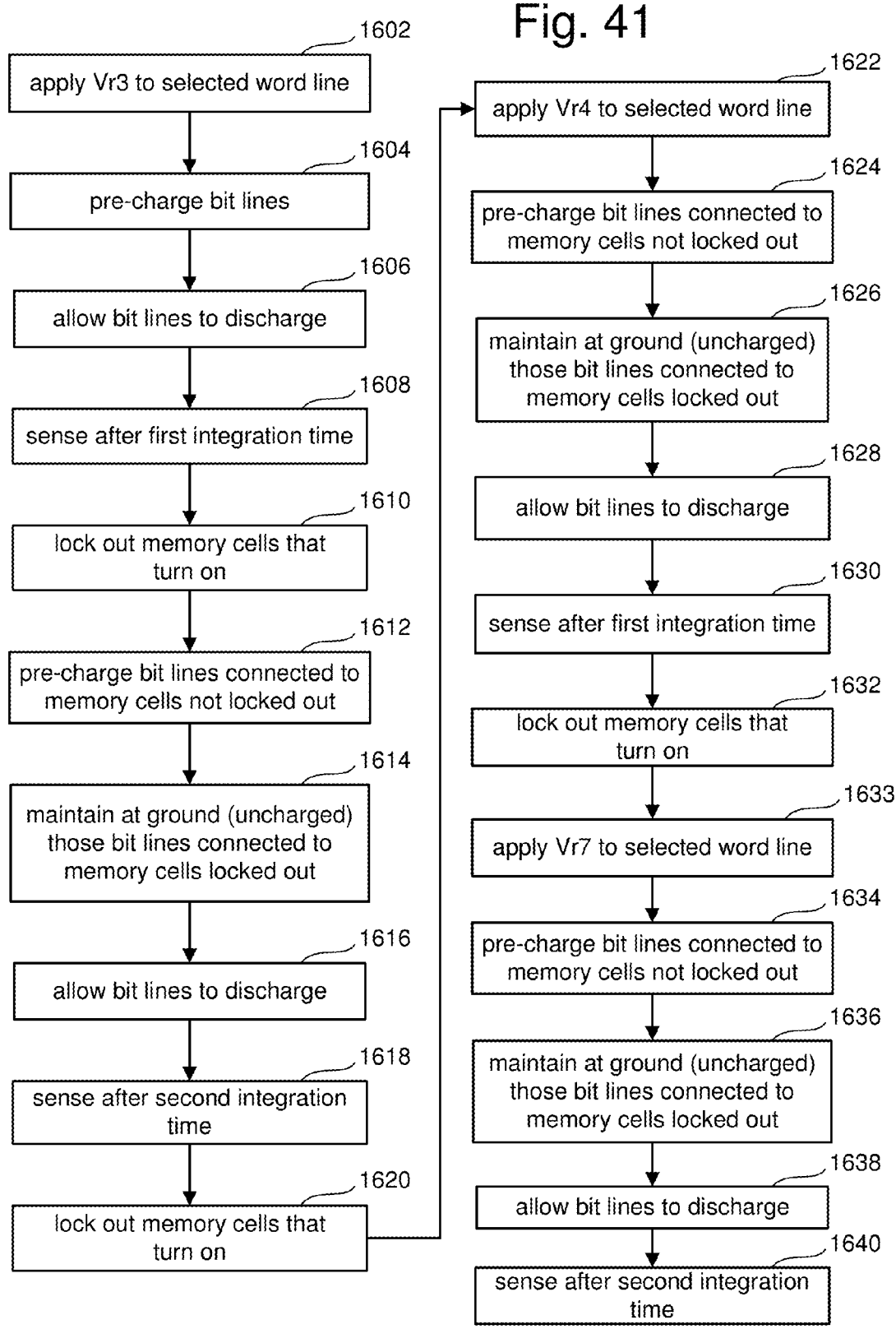
FIG. 41 is a flow chart describing one embodiment of a process for reading for a page of data.

FIG. 41 is a flow chart describing one embodiment of a two strobe sensing operation for reading data stored in the upper page that can be performed as part of step 860 of FIG. 23. In step 1602 of FIG. 34, read compare voltage Vr3 is applied to the selected word line. In step 1604, all bit lines connected to memory cells connected to the selected word line are pre-charged, as described above. In step 1606, the bit lines are allowed to discharge, as explained above with respect to FIGS. 17 and 18. In step 1608, the current through the selected memory cells is measured after the first integration time. Memory cells that are determined to have turned on will be locked out in step 1610. In step 1612, the bit lines connected to memory cells not locked out are pre-charged as discussed above. In step 1614, those bit lines connected to memory cells that are locked will be maintained at ground for the remainder of the operation of FIG. 41, or connected to another voltage (e.g. CELSRC) to prevent current flowing on the bit line. In step 1616, the bit lines that are pre-charged are allowed to discharge, as explained above. In step 1618, the current through the selected memory cells is measured after the second integration time, as described above. In step 1620, memory cells that were determined to have turned on in response to Vr3 in step 1618 are locked out for the remainder of the operation of FIG. 41.

In step 1622 of FIG. 32, read compare voltage Vr4 is applied to the selected word line. In step 1624, bit lines connected to memory cells not locked out are pre-charged, as described above. In step 1626, bit lines connected to memory cells that are locked out remain uncharged (ie at ground), or connected to another voltage (e.g. CELSRC) to prevent current flowing on the bit line. In step 1628, the bit lines are allowed to discharge, as explained above with respect to FIGS. 17 and 18. In step 1630, the current through the selected memory cells is measured after the first integration time. In step 1632, memory cells that turned on will be locked out for the remained of FIG. 41. In step 1633, Vr7 is applied to the selected word line. The bit lines connected to memory cells not locked out are pre-charged in step 1634, as discussed above. Those bit lines connected to memory cells that are locked out will be maintained at ground, or connected to another voltage (e.g. CELSRC) to prevent current flowing on the bit line. In step 1638, the bit lines that are pre-charged are allowed to discharge, as explained above. In step 1640, the current through the selected memory cells is measured after the second integration time, as described above.

FIGS. 42-48 describe embodiments of a non-volatile storage system that stores three bits of data per memory cell, perform verification according to the process of FIG. 20A, and reads data using the process of FIG. 23. This way the conditions when reading will match the conditions when verifying (for the word lines that are within the predetermined distance from the bit line contacts). In another set of embodiments, the processes of FIGS. 35-41 can be used for all word lines (thereby not using the process of FIG. 23).

FIG. 42 is a table that describes a process for verification, and is in the same format as the table of FIG. 28. Each column represents a data state for a system that stores three bits of data. Each row pertains to a verify operation. A box is shaded to indicate pre-charging for bit lines connected to memory cells intended to be programmed to the respective data state when performing a verify operation for the respective verify compare voltage. A box is not shaded to indicate no pre-charging (ie grounding) for bit lines connected to memory cells intended to be programmed to the respective data state when performing a verify operation for the respective verify compare voltage. The information of FIG. 42 is used to configure the process of FIG. 20A.

FIG. 43 is a table that shows which bit lines are charged (shaded) and which are at ground/uncharged (unshaded) when reading data for the lower page. FIG. 44 is a table that shows which bit lines are charged (shaded) and which are at ground/uncharged (unshaded) when reading data for the middle page. FIG. 45 is a table that shows which bit lines are charged (shaded) and which are at ground/uncharged (unshaded) when reading data for the upper page.

Figure 46:
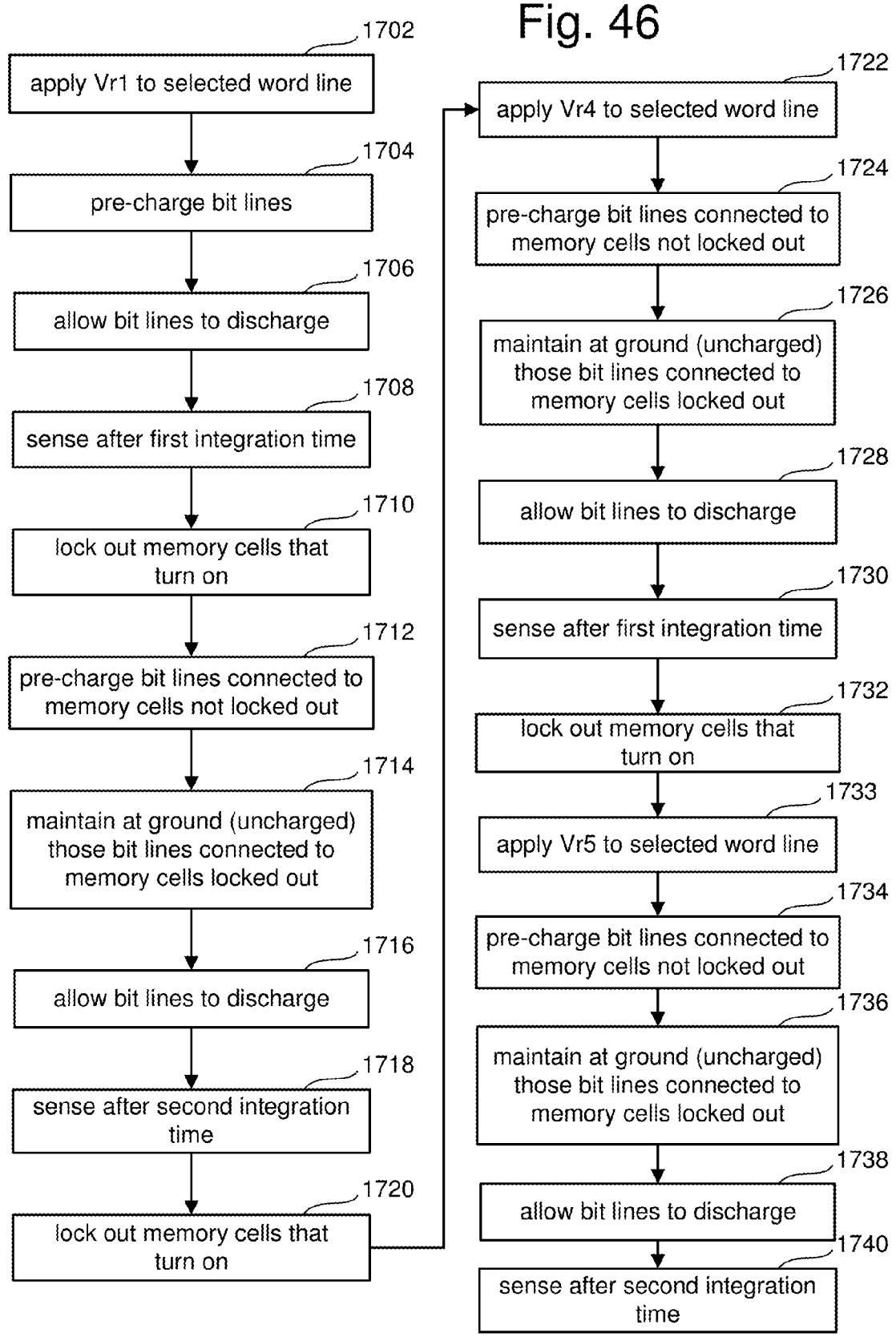
FIG. 46 is a flow chart describing one embodiment of a process for reading for a page of data.

FIG. 46 is a flow chart describing one embodiment of a two strobe sensing operation for reading data stored in the lower page that can be performed as part of step 860 of FIG. 23, for the embodiment of FIG. 43. In step 1702 of FIG. 46, read compare voltage Vr1 is applied to the selected word line. In step 1704, all bit lines connected to memory cells connected to the selected word line are pre-charged, as described above. In step 1706, the bit lines are allowed to discharge, as explained above with respect to FIGS. 17 and 18. In step 1708, the current through the selected memory cells is measured after the first integration time. Memory cells that are determined to have turned on will be locked out for the remainder of FIG. 46. In step 1712, the bit lines connected to memory cells not locked out are pre-charged as discussed above. Those bit lines connected to memory cells locked out will be maintained at ground (see step 1714), or connected to another voltage (e.g. CELSRC) to prevent current flowing on the bit line. In step 1716, the bit lines that are pre-charged are allowed to discharge, as explained above. In step 1718, the current through the selected memory cells is measured after the second integration time, as described above. In step 1720, memory cells that were determined to have turned on in response to Vr1 are locked out for the remainder of the operation of FIG. 46.

In step 1722 of FIG. 46, read compare voltage Vr4 is applied to the selected word line. In step 1724, bit lines connected to memory cells not locked out are pre-charged, as described above. In step 1726, bit lines connected to memory cells that are locked out remain uncharged (ie at ground), or connected to another voltage (e.g. CELSRC) to prevent current flowing on the bit line. In step 1728, the bit lines are allowed to discharge, as explained above with respect to FIGS. 17 and 18. In step 1730, the current through the selected memory cells is measured after the first integration time. Alternatively, the second integration time can be used. In step 1732, those memory cells that turned on will be locked out for the remainder of the process of FIG. 46. In step 1733, Vr5 is applied to the selected word line. In step 1734, the bit lines connected to memory cells not already locked out are pre-charged, as discussed above. Those bit lines connected to memory cells that are determined to be locked are maintained at ground (step 1736), or connected to another voltage (e.g. CELSRC) to prevent current flowing on the bit line. In step 1738, the bit lines that are pre-charged are allowed to discharge, as explained above. In step 1740, the current through the selected memory cells is measured after the second integration time, as described above.

Figure 47:
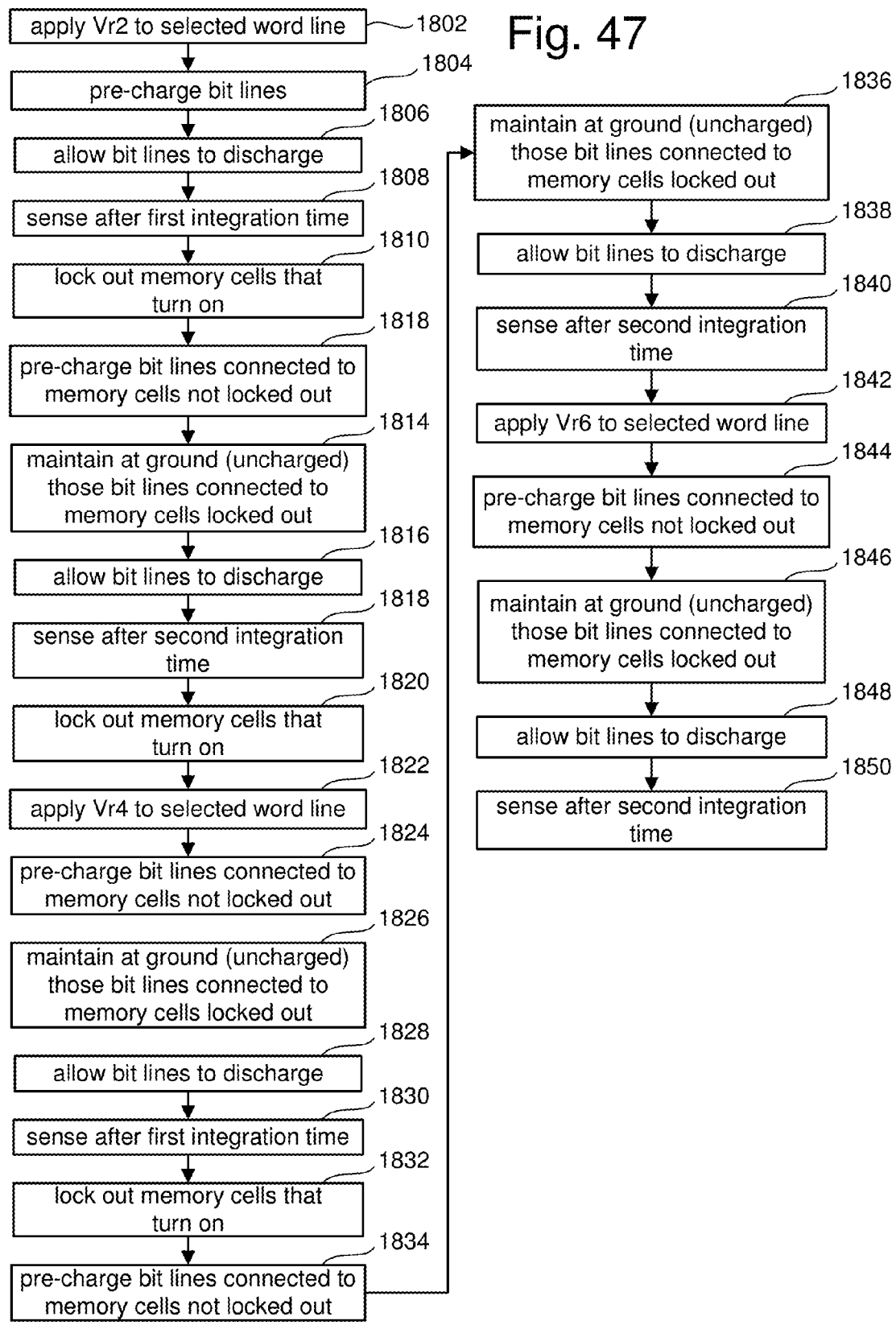
FIG. 47 is a flow chart describing one embodiment of a process for reading for a page of data.

FIG. 47 is a flow chart describing one embodiment of a two strobe sensing operation for reading data stored in the middle page that can be performed as part of step 860 of FIG. 23. In step 1802 of FIG. 47, read compare voltage Vr2 is applied to the selected word line. In step 1804, all bit lines connected to memory cells connected to the selected word line are pre-charged, as described above. In step 1806, the bit lines are allowed to discharge, as explained above with respect to FIGS. 17 and 18. In step 1808, the current through the selected memory cells is measured after the first integration time. In step 1810, memory cells that are determined to have turned on (because the conducted a sufficient amount of current) will be locked out for the remainder of the process of FIG. 40. In step 1812, the bit lines connected to memory cells that are not locked out are pre-charged as discussed above. In step 1814, those bit lines connected to memory cells that are determined to be locked out are maintained at ground, or connected to another voltage (e.g. CELSRC) to prevent current flowing on the bit line. In step 1816, the bit lines that are pre-charged are allowed to discharge, as explained above. In step 1818, the current through the selected memory cells is measured after the second integration time, as described above. In step 1820, memory cells that were determined to have turned on in response to Vr2 are locked out for the remainder of the operation of FIG. 47. Once a memory cell is locked out for the read operation, it remains locked out until the end of the read operation. Therefore, if a memory cell is locked out any time during the process of FIG. 40, it remains locked out until the process of FIG. 40 is completed. This applies to the other two strobe sensing operations described herein.

In step 1822 of FIG. 32, read compare voltage Vr4 is applied to the selected word line. In step 1824, bit lines connected to memory cells not locked out are pre-charged, as described above. In step 1826, bit lines connected to memory cells that are locked out remain uncharged (ie at ground), or connected to another voltage (e.g. CELSRC) to prevent current flowing on the bit line. In step 1828, the bit lines are allowed to discharge, as explained above with respect to FIGS. 17 and 18. In step 1830, the current through the selected memory cells is measured after the first integration time. Memory cells that are determined to have turned on are locked out (step 1832) for the remainder of the process of FIG. 40. In step 1834, the bit lines connected to memory cells not locked out are pre-charged, as discussed above. Those bit lines connected to memory cells that are determined to be locked will be maintained at ground, or connected to another voltage (e.g. CELSRC) to prevent current flowing on the bit line (step 1836). In step 1838, the bit lines that are pre-charged are allowed to discharge, as explained above. In step 1840, the current through the selected memory cells is measured after the second integration time, as described above. In step 1842 of FIG. 47, read compare voltage Vr6 is applied to the selected word line. In step 1844, bit lines connected to memory cells not locked out are pre-charged, as described above. In step 1846, bit lines connected to memory cells that are locked out remain uncharged (ie at ground), or connected to another voltage (e.g. CELSRC) to prevent current flowing on the bit line. In step 1848, the bit lines are allowed to discharge, as explained above with respect to FIGS. 17 and 18. In step 1850, the current through the selected memory cells is measured after the second integration time.

Figure 48:
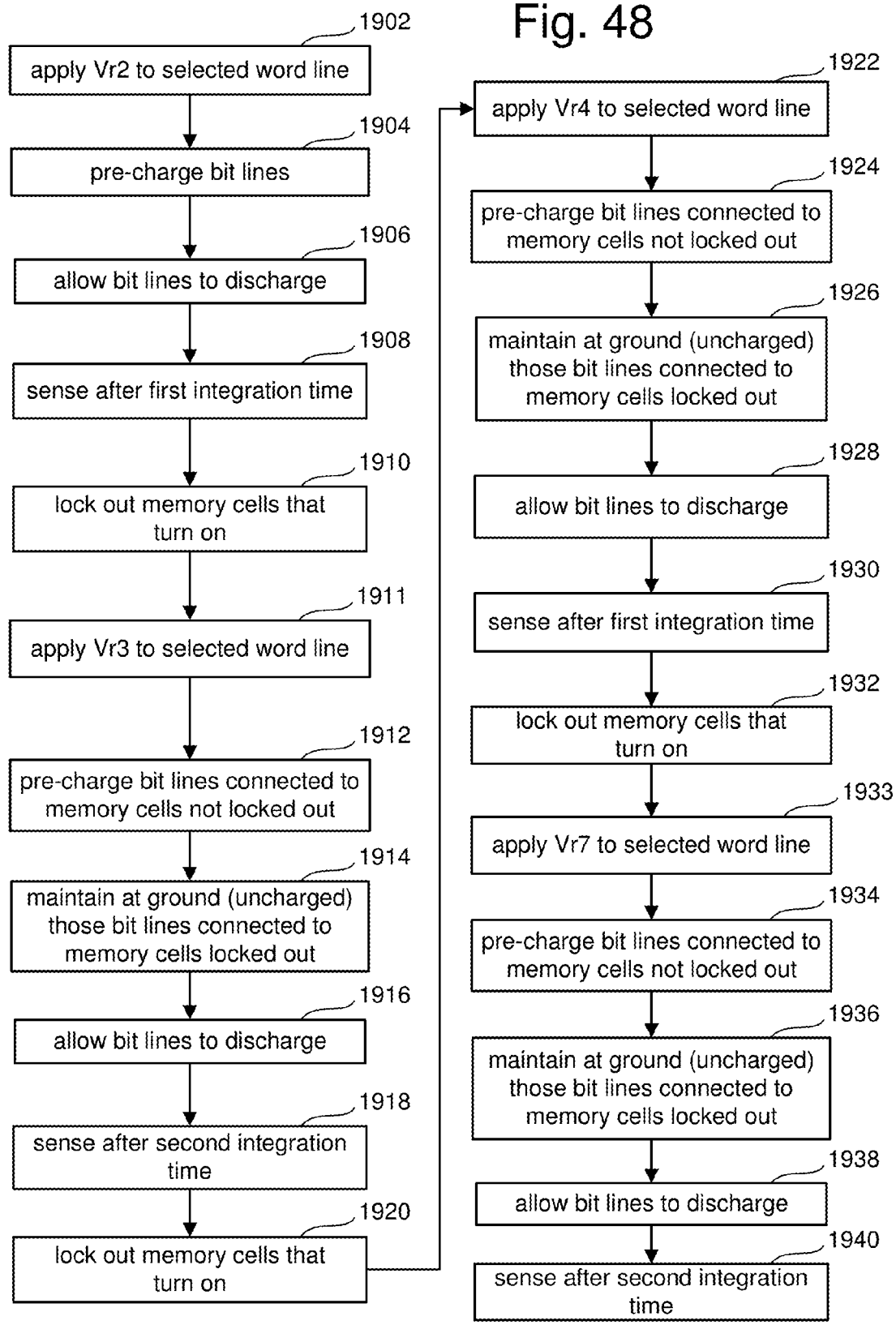
FIG. 48 is a flow chart describing one embodiment of a process for reading for a page of data.

FIG. 48 is a flow chart describing one embodiment of a two strobe sensing operation for reading data stored in the upper page that can be performed as part of step 860 of FIG. 23. In step 1902 of FIG. 48, read compare voltage Vr2 is applied to the selected word line. In step 1904, all bit lines connected to memory cells connected to the selected word line are pre-charged, as described above. In step 1906, the bit lines are allowed to discharge, as explained above with respect to FIGS. 17 and 18. In step 1908, the current through the selected memory cells is measured after the first integration time. Memory cells that are determined to have turned on will be locked out in step 1910. In step 1912, the bit lines connected to memory cells not locked out are pre-charged as discussed above. In step 1914, those bit lines connected to memory cells that are locked will be maintained at ground, or connected to another voltage (e.g.

CELSRC) to prevent current flowing on the bit line, for the remainder of the operation of FIG. 48. In step 1916, the bit lines that are pre-charged are allowed to discharge, as explained above. In step 1918, the current through the selected memory cells is measured after the second integration time, as described above. In step 1920, memory cells that were determined to have turned on in response to Vr2 in step 1918 are locked out for the remainder of the operation of FIG. 48.

In step 1922 of FIG. 48, read compare voltage Vr4 is applied to the selected word line. In step 1924, bit lines connected to memory cells not locked out are pre-charged, as described above. In step 1926, bit lines connected to memory cells that are locked out remain uncharged (ie at ground), or connected to another voltage (e.g. CELSRC) to prevent current flowing on the bit line. In step 1928, the bit lines are allowed to discharge, as explained above with respect to FIGS. 17 and 18. In step 1930, the current through the selected memory cells is measured after the first integration time. In step 1932, memory cells that turned on will be locked out for the remained of FIG. 41. In step 1933, Vr7 is applied to the selected word line. The bit lines connected to memory cells not locked out are pre-charged in step 1934, as discussed above. Those bit lines connected to memory cells that are locked out will be maintained at ground, or connected to another voltage (e.g. CELSRC) to prevent current flowing on the bit line (step 1936). In step 1938, the bit lines that are pre-charged are allowed to discharge, as explained above. In step 1940, the current through the selected memory cells is measured after the second integration time, as described above.

FIGS. 49-52 describe another embodiment of a non-volatile storage system that stores three bits of data per memory cell, perform verification according to the process of FIG. 20 (or a modified version thereof), and reads data using the process of FIG. 23. This way the conditions when reading will match the conditions when verifying (for the word lines that are within the predetermined distance from the bit line contacts). In another set of embodiments, the processes of FIGS. 49-52 can be used for all word lines (thereby not using the process of FIG. 23).

In the embodiments of FIGS. 49-52, either the bottom half states (S0, S1, S2, S3) or the top half states (S4, S5, S6, S7) bit lines are pre-charged depending on the state being verified. Similarly, during read, a S4 read operation (applying Vv4) is performed prior to reading, to distinguish the bottom and top half states, followed by selectively charging up bit lines during the actual read operation, to match verify and read operation conditions.

FIG. 49 is a table that describes a process for verification. Each column represents a data state for a system that stores three bits of data. Each row pertains to a verify operation. A box is shaded to indicate pre-charging for bit lines connected to memory cells intended to be programmed to the respective data state when performing a verify operation for the respective verify compare voltage. A box is not shaded to indicate no pre-charging (e.g., grounding or connecting to source line) for bit lines connected to memory cells intended to be programmed to the respective data state when performing a verify operation for the respective verify compare voltage. For example, when verifying using Vv3 applied to the selected word line, bit lines connected to memory cells intended for states S0, S1, S2 and S3 will be pre-charged and bit lines connected to memory cells intended for states S4, S5, S6, and S7 will not be pre-charged. The information of FIG. 49 is used to modify the process of FIG. 20.

FIG. 50 is a table that shows which bit lines are charged (shaded) and which are at ground/uncharged (unshaded) when reading data for the lower page. FIG. 51 is a table that shows which bit lines are charged (shaded) and which are uncharged (unshaded) when reading data for the middle page. FIG. 52 is a table that shows which bit lines are charged (shaded) and which are uncharged (unshaded) when reading data for the upper page. For example, when reading the middle page, if Vr2 is being used then (in the second strobe) bit lines connected to memory cells intended for states S0, S1, S2 and S3 will be pre-charged and bit lines connected to memory cells intended for states S4, S5, S6, and S7 will not be pre-charged, and if Vr4 is being used then (in the second strobe) bit lines connected to memory cells intended for states S0, S1, S2 and S3 will not be pre-charged and bit lines connected to memory cells intended for states S4, S5, S6, and S7 will be pre-charged. As mentioned above, the first strobe will include reading when Vr4 is applied to the selected word line.

FIG. 53 is a flow chart describing one embodiment of a two strobe sensing operation for reading data stored in the lower page that can be performed as part of step 860 of FIG. 23, for the embodiment of FIG. 50. In step 2002 of FIG. 53, read compare voltage Vr4 is applied to the selected word line. In step 2004, all bit lines connected to memory cells connected to the selected word line are pre-charged, as described above. In step 2006, the bit lines are allowed to discharge, as explained above with respect to FIGS. 17 and 18. In step 2008, the current through the selected memory cells is measured after the first integration time. Memory cells that are determined to have turned on are noted to be in low states (e.g., S0-S3), in step 2010. Memory cells that are determined to not turn on are noted to be in high states (e.g., S4-S7), in step 2012.

In step 2014, memory cells noted to be in high states are locked out. In step 2022, read compare voltage Vr1 is applied to the selected word line. In step 2024, the bit lines connected to memory cells not locked out are pre-charged as discussed above. Those bit lines connected to memory cells locked out will be maintained at ground (see step 2026), or connected to another voltage (e.g. CELSRC) to prevent current flowing on the bit line. In step 2028, the bit lines that are pre-charged are allowed to discharge, as explained above. In step 2030, the current through the selected memory cells is measured after the second integration time, as described above.

In step 2032, memory cells noted to be in low states are locked out, and the memory cells noted to be in high states are no longer locked out. In step 2034, read compare voltage Vr5 is applied to the selected word line. In step 2036, the bit lines connected to memory cells not locked out are pre-charged as discussed above. Those bit lines connected to memory cells locked out will be maintained at ground (see step 2038), or connected to another voltage (e.g. CELSRC) to prevent current flowing on the bit line. In step 2040, the bit lines that are pre-charged are allowed to discharge, as explained above. In step 2041, the current through the selected memory cells is measured after the second integration time, as described above. The results of the sensing of FIG. 53 is recorded and used to identify the data stored.

FIG. 54 is a flow chart describing one embodiment of a two strobe sensing operation for reading data stored in the middle page that can be performed as part of step 860 of FIG. 23, for the embodiment of FIG. 51. In step 2102 of FIG. 54, read compare voltage Vr4 is applied to the selected word line. In step 2104, all bit lines connected to memory cells connected to the selected word line are pre-charged, as described above. In step 2106, the bit lines are allowed to discharge, as explained above with respect to FIGS. 17 and 18. In step 2108, the current through the selected memory cells is measured after the first integration time. Memory cells that are determined to have turned on are noted to be in low states (e.g., S0-S3), in step 2110. Memory cells that are determined to not turn on are noted to be in high states (e.g., S4-S7), in step 2112.

In step 2114, memory cells noted to be in high states are locked out. In step 2120, read compare voltage Vr2 is applied to the selected word line. In step 2122, the bit lines connected to memory cells not locked out are pre-charged as discussed above. Those bit lines connected to memory cells locked out will be maintained at ground (see step 2124), or connected to another voltage (e.g. CELSRC) to prevent current flowing on the bit line. In step 2126, the bit lines that are pre-charged are allowed to discharge, as explained above. In step 2128, the current through the selected memory cells is measured after the second integration time, as described above.

In step 2130, memory cells noted to be in low states are locked out, and the memory cells in high states are no longer locked out. In step 2132, read compare voltage Vr4 is applied to the selected word line. In step 2134, the bit lines connected to memory cells not locked out are pre-charged as discussed above. Those bit lines connected to memory cells locked out will be maintained at ground (see step 2136), or connected to another voltage (e.g. CELSRC) to prevent current flowing on the bit line. In step 2138, the bit lines that are pre-charged are allowed to discharge, as explained above. In step 2140, the current through the selected memory cells is measured after the second integration time, as described above. In step 2142, those memory cells sensed to be on in step 2140 are locked out.

In step 2144, read compare voltage Vr6 is applied to the selected word line. In step 2146, the bit lines connected to memory cells not locked out are pre-charged as discussed above. Those bit lines connected to memory cells locked out will be maintained at ground (see step 2148), or connected to another voltage (e.g. CELSRC) to prevent current flowing on the bit line. In step 2150, the bit lines that are pre-charged are allowed to discharge, as explained above. In step 2152, the current through the selected memory cells is measured after the second integration time, as described above. The results of the sensing of FIG. 54 is recorded and used to identify the data stored.

FIG. 55 is a flow chart describing one embodiment of a two strobe sensing operation for reading data stored in the upper page that can be performed as part of step 860 of FIG. 23, for the embodiment of FIG. 52. In step 2202 of FIG. 55, read compare voltage Vr4 is applied to the selected word line. In step 2204, all bit lines connected to memory cells connected to the selected word line are pre-charged, as described above. In step 2206, the bit lines are allowed to discharge, as explained above with respect to FIGS. 17 and 18. In step 2208, the current through the selected memory cells is measured after the first integration time. Memory cells that are determined to have turned on are noted to be in low states (e.g., S0-S3), in step 2210. Memory cells that are determined to not turn on are noted to be in high states (e.g., S4-S7), in step 2212.

In step 2214, memory cells noted to be in high states are locked out. In step 2222, read compare voltage Vr3 is applied to the selected word line. In step 2224, the bit lines connected to memory cells not locked out are pre-charged as discussed above. Those bit lines connected to memory cells locked out will be maintained at ground (see step 2226), or connected to another voltage (e.g. CELSRC) to prevent current flowing on the bit line. In step 2228, the bit lines that are pre-charged are allowed to discharge, as explained above. In step 2230, the current through the selected memory cells is measured after the second integration time, as described above.

In step 2232, memory cells noted to be in low states are locked out, and the memory cells noted to be in high states are no longer locked out. In step 2234, read compare voltage Vr7 is applied to the selected word line. In step 2236, the bit lines connected to memory cells not locked out are pre-charged as discussed above. Those bit lines connected to memory cells locked out will be maintained at ground (see step 2238), or connected to another voltage (e.g. CELSRC) to prevent current flowing on the bit line. In step 2240, the bit lines that are pre-charged are allowed to discharge, as explained above. In step 2241, the current through the selected memory cells is measured after the second integration time, as described above. The results of the sensing of FIG. 55 is recorded and used to identify the data stored.

One embodiment includes a method of operating non-volatile storage, comprising: identifying a selected word line for a reading process, a set of non-volatile storage elements are connected to the selected word line; determining whether the selected word line is within a threshold distance of a set of bit line contacts for bit lines connected to the set of non-volatile storage elements; performing the reading process using one or more two strobe sensing operations if the selected word line is within a threshold distance of the set of bit line contacts; and performing the reading process using one or more one strobe sensing operations if the selected word line is not within the threshold distance of the set of bit line contacts.

One embodiment includes a non-volatile storage system, comprising: a plurality of non-volatile storage elements; a plurality of bit lines connected to the plurality of non-volatile storage elements; a plurality of word lines connected to the plurality of non-volatile storage elements; and one or more control circuits connected to the bit lines and word lines, the one or more control circuits are configured to perform a read process for a subset of the non-volatile storage elements that are connected to a selected word line of the plurality of word lines by driving a reference voltage on the selected word line, the one or more control circuits are configured to perform two sensing operations for the reference voltage if the selected word line is located in a first region, the one or more control circuits are configured to perform one sensing operation for the reference voltage if the selected word line is located in a second region, the first region is closer to a charging source for the bit lines than the second region.

One embodiment includes a method of operating non-volatile storage, comprising: programming data and verifying programming for a plurality of non-volatile storage elements, the verifying programming is performed by charging a first subset of a set of bit lines to a pre-charge level and maintaining a second subset of the set of bit lines at ground, or connected to the source voltage (e.g. CELSRC) to prevent current flowing on the bit line, the set of bit lines are connected to the plurality of non-volatile storage elements; receiving a request to read requested data, the requested data is at least a subset of the data programmed; identifying word lines connected to non-volatile storage elements storing the requested data; for identified word lines that are in a first group of word lines closer to bit line contacts for bit lines connected to the non-volatile storage elements storing the requested data, performing a reading process using one or more two strobe sensing operations; and for identified word lines that are in a second group of word lines further than the first group from bit line contacts for bit lines connected to the non-volatile storage elements storing the requested data, performing a reading process using only one strobe sensing operations.

One embodiment includes a non-volatile storage system, comprising: a plurality of non-volatile storage elements; a plurality of bit lines connected to the plurality of non-volatile storage elements; a plurality of word lines connected to the plurality of non-volatile storage elements; and one or more control circuits connected to the bit lines and word lines, the one or more control circuits configured to identify a selected word line of the plurality of word lines for a reading process, a subset of non-volatile storage elements are connected to the selected word line, the one or more control circuits configured to determine whether the word line is within a threshold distance of a set of bit line contacts for bit lines connected to the set of non-volatile storage elements, the one or more control circuits configured to perform the reading process using one or more two strobe sensing operations if the word line is within the threshold distance of the set of bit line contacts, and to performing the reading process using one or more one strobe sensing operations if the word line is within the threshold distance of the set of bit line contacts.

One embodiment includes a method of operating non-volatile storage, comprising: programming and verifying programming for a plurality of non-volatile storage elements that store multiple bits of data in a plurality of data states, the plurality of non-volatile storage elements are connected to a plurality of bit lines, separately for multiple data states of the plurality of data states the verifying programming for the respective data state comprises sensing whether non-volatile storage elements have reached the respective data state while bit lines connected to non-volatile storage elements intended to be programmed to a first set of data states are charged and bit lines connected to non-volatile storage elements intended to be programmed to a second set of data states are uncharged as compared to charged bit lines, the data states in the first set of data states and the data states in the second set of data states are pre-determined based on the respective data state for which verifying programming is being performed; and for at least the subset of the data states, separately executing a reading process that comprises performing a first sensing to identify at least a subset of non-volatile storage elements in the second set of data states and performing a second sensing that includes bit lines connected to non-volatile storage elements not sensed to be in the second set of the data states being charged and bit lines connected to non-volatile storage elements sensed to be in the second set of the data states being uncharged in comparison to bit lines that are charged.

Various alternatives include the programming includes applying a set of program pulses and the verifying programming includes only one sensing per data state per program pulse; the data states in the first set of data states and the data states in the second set of data states are determined regardless of whether non-volatile storage elements have successfully completed programming; the first set of data states is not the same for every data state of the multiple data states and the second set of data states is not the same for every data state of the multiple data states; the first set of data states is different for each data state of the multiple data states and the second set of data states is different for each data state of the multiple data states; the first sensing comprises applying a reference voltage to a word line connected to the non-volatile storage elements, charging the plurality of bit lines, and comparing a voltage of a capacitor connected to a selected bit line after a first time period and the second sensing comprises applying the reference voltage to the word line connected to the non-volatile storage elements, charging the bit lines connected to non-volatile storage elements not sensed to be in the second set of the data states, and comparing a voltage of the capacitor after a second time period that is longer than the first time period; wherein for each data state of the multiple data states: the first set of data states includes the respective data state for which verifying programming is being performed and data states higher in threshold voltage than the respective data state for which verifying programming is being performed and the second set of data states are data states lower in threshold voltage than the respective data state for which verifying programming is being performed; for a first group of data states of the multiple data states: the first set of data states includes the respective data state for which verifying programming is being performed and data states higher in threshold voltage than the respective data state for which verifying programming is being performed and the second set of data states includes data states lower in threshold voltage than the respective data state for which verifying programming is being performed, and for a second group of data states of the multiple data states: the first set of data states includes half of the data states and the second set of data states includes half of the data states, all of the data states of the second set of data states are lower in threshold voltage than the data states of the first set of data states; for a first data state of data states of the multiple data states: the first set of data states includes the first data state and data states higher in threshold voltage than the first data state and the second set of data states only includes an erased state, for a second group of data states of the multiple data states: the first set of data states includes all but the lowest two data states and the second set of data states includes the lowest two data states, for a third group of data states of the multiple data states: the first set of data states includes half of the data states, and the second set of data states includes half of the data states, all of the data states of the second set of data states are lower in threshold voltage than the data states of the first set of data states; for a first group of data states of the multiple data states: the first set of data states includes the respective data state for which verifying programming is being performed and data states higher in threshold voltage than the respective data state for which verifying programming is being performed and the second set of data states are data states lower in threshold voltage than the respective data state for which verifying programming is being performed and for a second group of data states of the multiple data states: the first set of data states includes a first subset of the data states, and the second set of data states includes a second subset of the data states, all of the data states of the second set of data states are lower in threshold voltage than the data states of the first set of data states.

One embodiment includes a non-volatile storage device, comprising: a plurality of non-volatile storage elements that are configured to store multiple bits of data in a plurality of data states, the plurality of data states include a particular state, lower states that represent threshold voltages lower than threshold voltages associated with the particular state and higher states that represent threshold voltages higher than threshold voltages associated with the particular state; a plurality of bit lines connected to the non-volatile storage elements; a word lines connected to the non-volatile storage elements; one or more control circuits connected to the bit lines and word lines, the one or more control circuits are configured to program at least a portion of the plurality of non-volatile storage elements including program a first subset of the non-volatile storage elements to the particular state, the one or more control circuits are configured to verify the programming of the first subset of the non-volatile storage elements to the particular state by charging bit lines connected to non-volatile storage elements intended to be programmed to a first subset of the data states as well as locking out bit lines connected to non-volatile storage elements intended to be programmed to a second subset of the states regardless of whether those non-volatile storage elements have completed programming, the one or more control circuits are configured to sense whether a non-volatile storage element is in the particular state or higher states by performing a first sensing operation to identify non-volatile storage elements in the second subset of data states and performing a second sensing operation that includes charging bit lines connected to non-volatile storage elements not sensed to be in the second subset of the data states as well as locking out bit lines connected to non-volatile storage elements sensed to be in the second subset of the states.

One embodiment includes a non-volatile storage device, comprising: a plurality of non-volatile storage elements that are configured to store multiple bits of data in a plurality of data states; a plurality of bit lines connected to the non-volatile storage elements; a word lines connected to the non-volatile storage elements; one or more control circuits connected to the bit lines and word lines, the one or more control circuits are configured to program at least a portion of the plurality of non-volatile storage elements and verify programming, separately for multiple data states of the plurality of data states the one or more control circuits are configured to verifying programming by sensing whether non-volatile storage elements have reached the respective data state while bit lines connected to non-volatile storage elements intended to be programmed to the respective data state or higher states are charged and bit lines connected to non-volatile storage elements intended to be programmed lower states are uncharged as compared to charged bit lines regardless of whether the non-volatile storage elements have successfully completed programming, the one or more control circuits are configured to perform a reading process that comprises a first sensing to identify at least a subset of non-volatile storage elements in the lower data states and a second sensing that includes bit lines connected to non-volatile storage elements not sensed to be in the lower data states being charged and bit lines connected to non-volatile storage elements sensed to be in the lower data states being uncharged in comparison to bit lines that are charged.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. A method of operating non-volatile storage, comprising:
identifying a selected word line for a reading process, a set of non-volatile storage elements are connected to the selected word line;
determining whether the selected word line is within a threshold distance of a set of bit line contacts for bit lines connected to the set of non-volatile storage elements;
performing the reading process using one or more two strobe sensing operations if the selected word line is within a threshold distance of the set of bit line contacts, each two strobe sensing operation includes performing two sensing operations of a condition of a non-volatile storage elements in order to determine whether the non-volatile storage element has a threshold voltage greater than a reference value; and
performing the reading process using one or more one strobe sensing operations if the selected word line is not within the threshold distance of the set of bit line contacts.

2. The method of claim 1, further comprising:
programming and verifying programming for the set of non-volatile storage elements, the verifying programming is performed while a first subset of the bit lines are charged and a second subset of the bit lines are uncharged.

3. The method of claim 1, further comprising:
programming and verifying programming for the set of non-volatile storage elements, the verifying programming is performed by charging a first subset of the bit lines to a pre-charge level and maintaining a second subset of the bit lines below the pre-charge level.

4. The method of claim 3, wherein:
the first subset of the bit lines are connected to non-volatile storage elements being programmed to a target data state; and
the second subset of the bit lines are connected to non-volatile storage elements remaining in the erased state.

5. The method of claim 1, wherein:
the selected word line is identified from a set word lines that comprise a block;
a first subset of the set of word lines is in a first region of the block;
a second subset of the set of word lines is in a second region of the block;
the first region is closer to the bit lines contacts for the block than the second region; and
the determining whether the selected word line is within the threshold distance of the set of bit line contacts for bit lines connected to the set of non-volatile storage elements comprises determining whether the selected word line is in the first region.

6. The method of claim 1, wherein the one or more two strobe sensing operations comprise:
driving a reference voltage on the selected word line;
charging, for a first strobe, the bit lines connected to the set of non-volatile storage elements;
sensing the bit lines, for the first strobe, at a first time interval in response to the reference voltage;
charging, for a second strobe, bit lines connected to the non-volatile storage elements sensed to be off in response to the reference voltage at the first time interval for the first strobe; and
sensing bit lines, for the second strobe, at a second time interval in response to the reference voltage, the second tine interval is longer than the first time interval.

7. The method of claim 1, wherein:
the selected word line is in a block; and the determining whether the selected word line is within the threshold distance comprises determining whether the selected word line is in a certain portion of the block.

8. The method of claim 1, wherein:
the set of non-volatile storage elements store multiple bits of data in an erased state and a plurality of programmed states; and
the performing the reading process using one or more two strobe sensing operations comprises:
driving a first reference voltage on the selected word line, the first reference voltage is for distinguishing between the erased state and a lowest of the programmed states,
charging, for a first strobe, the bit lines connected to the set of non-volatile storage elements,
sensing the bit lines, for the first strobe, in response to the first reference voltage,
driving a second reference voltage on the selected word line, the second reference voltage is for distinguishing between programmed states,
charging, for a second strobe, bit lines connected non-volatile storage elements sensed to be off in response to the first reference voltage for the first strobe, and
sensing bit lines in response to the first reference voltage.

9. The method of claim 1, wherein:
the set of non-volatile storage elements store multiple bits of data in an erased state and a plurality of programmed states; and
the performing the reading process using one or more two strobe sensing operations comprises:
driving a first reference voltage on the selected word line, the first reference voltage is for first distinguishing between the erased state and a lowest of the programmed states,
charging, for a first strobe, the bit lines connected to the set of non-volatile storage elements,
sensing the bit lines, for the first strobe, in response to the first reference voltage,
charging, for a second strobe, bit lines connected non-volatile storage elements sensed to be off in response to the first reference voltage for the first strobe,
sensing bit lines in response to the first reference voltage,
driving a second reference voltage on the selected word line, the second reference voltage is for distinguishing between programmed states,
charging bit lines connected non-volatile storage elements sensed to be off in response to the first reference voltage for the first strobe, and
sensing bit lines in response to the second reference voltage.

10. The method of claim 1, wherein:
the set of non-volatile storage elements store multiple bits of data in an erased state and a plurality of programmed states;
the method further comprises programming and verifying programming for the set of non-volatile storage elements, the verifying programming is performed while a first subset of the set of bit lines are charged and a second subset of the set of bit lines are uncharged, the first subset of bit lines are connected to non-volatile storage elements being programmed and the second subset of bit lines are connected to non-volatile storage elements remaining in the erased state; and
the performing the reading process using one or more two strobe sensing operations comprises sensing while the first subset of the set of bit lines are charged and the second subset of the set of bit lines are uncharged.

11. The method of claim 1, wherein:
the set of non-volatile storage elements store multiple bits of data in an erased state and a plurality of programmed states;
the method further comprises programming and verifying programming for the set of non-volatile storage elements, the verifying programming is performed while a first subset of the set of bit lines are charged and a second subset of the set of bit lines are uncharged; and
the performing the reading process using one or more two strobe sensing operations comprises sensing while the first subset of the set of bit lines are charged and the second subset of the set of bit lines are uncharged.

12. The method of claim 1, wherein:
the set of non-volatile storage elements store multiple bits of data in an erased state and a plurality of programmed states;
the method further comprises programming and verifying programming for the set of non-volatile storage elements, for each of the programmed states the verifying programming is performed while a first subset of the set of bit lines for the respective programmed state are charged and a second subset of the set of bit lines for the respective programmed state are uncharged;
the first subset of the set of bit lines are not all the same for the respective programmed states;
the second subset of the set of bit lines are not all the same for the respective programmed states; and
the performing the reading process using one or more two strobe sensing operations comprises, for each programmed state, sensing while the first subset of the set of bit lines for the respective programmed state are charged and the second subset of the set of bit lines for the respective programmed state are uncharged.

13. The method of claim 1, wherein:
the set of non-volatile storage elements store multiple bits of data in an erased state and a plurality of programmed states;
the method further comprises programming and verifying programming for the set of non-volatile storage elements, for each of the programmed states the verifying programming is performed while a first subset of the set of bit lines for the respective programmed state are charged and a second subset of the set of bit lines for the respective programmed state are uncharged;
the first subset of the set of bit lines are all different from each other for the respective programmed states;
the second subset of the set of bit lines are all different from each other for the respective programmed states; and
the performing the reading process using one or more two strobe sensing operations comprises, for each programmed state, sensing while the first subset of the set of bit lines for the respective programmed state are charged and the second subset of the set of bit lines for the respective programmed state are uncharged.

14. The method of claim 1, wherein:
the set of non-volatile storage elements store multiple bits of data in a plurality of data states;
the method further comprises programming and verifying programming for the set of non-volatile storage elements, separately for multiple data states of the plurality of data states the verifying programming for the respective data state comprises sensing whether non-volatile storage elements have reached the respective data state while bit lines connected to non-volatile storage elements intended to be programmed to a first set of data states are charged and bit lines connected to non-volatile storage elements intended to be programmed to a second set of data states are uncharged as compared to charged bit lines, the data states in the first set of data states and the data states in the second set of data states are pre-determined based on the respective data state for which verifying programming is being performed; and the performing the reading process using one or more two strobe sensing operations comprises, for at least the subset of the data states, separately executing a reading process that includes performing a first sensing to identify at least a subset of non-volatile storage elements in the second set of data states and performing a second sensing that includes bit lines connected to non-volatile storage elements not sensed to be in the second set of the data states being charged and bit lines connected to non-volatile storage elements sensed to be in the second set of the data states being uncharged in comparison to bit lines that are charged.

15. A non-volatile storage system, comprising:
a plurality of non-volatile storage elements;
a plurality of bit lines connected to the plurality of non-volatile storage elements;
a plurality of word lines connected to the plurality of non-volatile storage elements; and
one or more control circuits connected to the bit lines and word lines, the one or more control circuits are configured to perform a read process for a subset of the non-volatile storage elements that are connected to a selected word line of the plurality of word lines by driving a reference voltage on the selected word line, the one or more control circuits are configured to perform two sensing operations for the reference voltage to determine conditions of the non-volatile storage elements if the selected word line is located in a first region, the one or more control circuits are configured to perform one sensing operation for the reference voltage if the selected word line is located in a second region, the first region is closer to a charging source for the bit lines then the second region.

16. The non-volatile storage system of claim 15, wherein:
the set of non-volatile storage elements are capable of storing multiple bits of data in an erased state and a plurality of programmed states;
the one or more control circuits are configured to program and verify programming for the set of non-volatile storage elements, the verifying programming is performed while a first subset of the set of bit lines are charged and a second subset of the set of bit lines are uncharged, the first subset of bit lines are connected to non-volatile storage elements being programmed and the second subset of bit lines are connected to non-volatile storage elements remaining in the erased state; and
the one or more control circuits are configured to perform the two sensing operation by sensing while the first subset of the set of bit lines are charged and the second subset of the set of bit lines are uncharged.

17. The non-volatile storage system of claim 15, wherein:
the set of non-volatile storage elements are capable of storing multiple bits of data in an erased state and a plurality of programmed states;

the one or more control circuits are configured to program and verify programming for the set of non-volatile storage elements, the verifying programming is performed while a first subset of the set of bit lines are charged and a second subset of the set of bit lines are uncharged; and the one or more control circuits are configured to perform the two sensing operation by sensing while the first subset of the set of bit lines are charged and the second subset of the set of bit lines are uncharged.

18. The non-volatile storage system of claim 15, wherein:
the set of non-volatile storage elements are capable of storing multiple bits of data in an erased state and a plurality of programmed states;
the one or more control circuits are configured to program and verify programming for the set of non-volatile storage elements, the one or more control circuits verify programming by charging a first subset of the set of bit lines to a pre-charge level and maintaining a second subset of the set of bit lines below the pre-charge level;
the first subset of the set of bit lines are not all the same for the respective programmed states;
the second subset of the set of bit lines are not all the same for the respective programmed states; and
the one or more control circuits are configured to perform the two sensing operations by, for each programmed state, sensing while the first subset of the set of bit lines for the respective programmed state are charged and the second subset of the set of bit lines for the respective programmed state are uncharged.

19. The non-volatile storage system of claim 15, wherein:
the set of non-volatile storage elements are capable of storing multiple bits of data in an erased state and a plurality of programmed states;
the one or more control circuits are configured to program and verify programming for the set of non-volatile storage elements;
for each of the programmed states the one or more control circuits are configured to verify programming while a first subset of the set of bit lines for the respective programmed state are charged and a second subset of the set of bit lines for the respective programmed state are uncharged;
the first subset of the set of bit lines are all different from each other for the respective programmed states;
the second subset of the set of bit lines are all different from each other for the respective programmed states; and
the one or more control circuits are configured to perform the two sensing operations by, for each programmed state, sensing while the first subset of the set of bit lines for the respective programmed state are charged and the second subset of the set of bit lines for the respective programmed state are uncharged.

20. A non-volatile storage system, comprising:
a plurality of non-volatile storage elements;
a plurality of bit lines connected to the plurality of non-volatile storage elements;
a plurality of word lines connected to the plurality of non-volatile storage elements; and
one or more control circuits connected to the bit lines and word lines, the one or more control circuits are configured to perform a read process for a subset of the non-volatile storage elements that are connected to a selected word line of the plurality of word lines by driving a reference voltage on the selected word line, the one or more control circuits are configured to perform two sensing operations for the reference voltage if the selected word line is located in a first region, the one or more control circuits are configured to perform one sensing operation for the reference voltage if the selected word line is located in a second region, the first region is closer to a charging source for the bit lines then the second region, the one or more control circuits are configured to program and verify programming for the set of non-volatile storage elements, the one or more control circuits verify programming by charging a first subset of the set of bit lines to a pre-charge level and maintaining a second subset of the set of bit lines below the pre-charge level.

21. The non-volatile storage system of claim 20, wherein:
the first subset of subset of bit lines are connected to non-volatile storage elements being programmed to a target data state; and
the second subset of subset of bit lines are connected to non-volatile storage elements remaining in the erased state.

22. A non-volatile storage system, comprising:
a plurality of non-volatile storage elements;
a plurality of bit lines connected to the plurality of non-volatile storage elements;
a plurality of word lines connected to the plurality of non-volatile storage elements; and
one or more control circuits connected to the bit lines and word lines, the one or more control circuits are configured to perform a read process for a subset of the non-volatile storage elements that are connected to a selected word line of the plurality of word lines by driving a reference voltage on the selected word line, the one or more control circuits are configured to perform two sensing operations for the reference voltage if the selected word line is located in a first region, the one or more control circuits are configured to perform one sensing operation for the reference voltage if the selected word line is located in a second region, the first region is closer to a charging source for the bit lines then the second region, the one or more control circuits are configured to perform two sensing operations by driving a reference voltage on the selected word line, charging the bit lines connected to the set of non-volatile storage elements, sensing the bit lines at a first time interval in response to the reference voltage, charging bit lines connected non-volatile storage elements sensed to be off in response to the reference voltage at the first time interval and sensing bit lines at a second time interval in response to the reference voltage, wherein the second tine interval is longer than the first time interval.

23. A method of operating non-volatile storage, comprising:
programming data and verifying programming for a plurality of non-volatile storage elements, the verifying programming is performed by charging a first subset of a set of bit lines to a pre-charge level and maintaining a second subset of the set of bit lines at a source voltage, the set of bit lines are connected to the plurality of non-volatile storage elements;

receiving a request to read requested data, the requested data is at least a subset of the data programmed;
identifying word lines connected to non-volatile storage elements storing the requested data;
for identified word lines that are in a first group of word lines closer to bit line contacts for bit lines connected to the non-volatile storage elements storing the requested data, performing a reading process using one or more two strobe sensing operations; and
for identified word lines that are in a second group of word lines further than the first group from bit line contacts for bit lines connected to the non-volatile storage elements storing the requested data, performing a reading process using only one strobe sensing operations.

24. The method of claim 23, wherein:
the plurality of non-volatile storage elements store multiple bits of data in an erased state and a plurality of programmed states; and
the second subset of the set of bit lines are connected to non-volatile storage elements remaining in the erased state.

25. The method of claim 23, wherein:
the plurality of non-volatile storage elements store multiple bits of data in an erased state and a plurality of programmed states;
the first subset of the set of bit lines are not all the same for the respective programmed states;
the second subset of the set of bit lines are not all the same for the respective programmed states; and
the performing the reading process using one or more two strobe sensing operations comprises, for each programmed state, sensing while the first subset of the set of bit lines for the respective programmed state are charged and the second subset of the set of bit lines for the respective programmed state are uncharged.

26. A non-volatile storage system, comprising:
a plurality of non-volatile storage elements;
a plurality of bit lines connected to the plurality of non-volatile storage elements;
a plurality of word lines connected to the plurality of non-volatile storage elements; and
one or more control circuits connected to the bit lines and word lines, the one or more control circuits configured to identify a selected word line of the plurality of word lines for a reading process, a subset of non-volatile storage elements are connected to the selected word line, the one or more control circuits configured to determine whether the word line is within a threshold distance of a set of bit line contacts for bit lines connected to the set of non-volatile storage elements, the one or more control circuits configured to perform the reading process using one or more two strobe sensing operations if the word line is within the threshold distance of the set of bit line contacts, and to performing the reading process using one or more one strobe sensing operations if the word line is within the threshold distance of the set of bit line contacts.

* * * * *

UNITED STATES PATENT AND TRADEMARK OFFICE
CERTIFICATE OF CORRECTION

PATENT NO.         : 9,443,606 B2                          Page 1 of 1
APPLICATION NO.    : 14/525678
DATED              : September 13, 2016
INVENTOR(S)        : Dutta et al.

It is certified that error appears in the above-identified patent and that said Letters Patent is hereby corrected as shown below:

In the Claims

Column 46, Line 13 (Claim 1, Line 15) please change "elements in" to -- element in --
Column 46, Line 45 (Claim 5, Line 8) please change "bit lines" to -- bit line --
Column 47, Line 23 (Claim 8, Line 18) please change "connected non" to -- connected to non --
Column 47, Line 42 (Claim 9, Line 15) please change "connected non" to -- connected to non --
Column 47, Line 50 (Claim 9, Line 23) please change "connected non" to -- connected to non --
Column 51, Line 16 (Claim 21, Line 2) please change "subset of subset of" to -- subset of --
Column 51, Line 19 (Claim 21, Line 5) please change "subset of subset of" to -- subset of --
Column 51, Line 41 (Claim 22, Line 20) please change "then the" to -- than the --
Column 51, Line 47 (Claim 22, Line 26) please change "connected non" to -- connected to non --

Signed and Sealed this
Twenty-fifth Day of September, 2018

Andrei Iancu
*Director of the United States Patent and Trademark Office*